United States Patent
Yasukawa et al.

(10) Patent No.: US 8,951,650 B2
(45) Date of Patent: *Feb. 10, 2015

(54) ORGANIC ELECTROLUMINESCENT ELEMENT INCLUDING A CONDENSED AROMATIC HETEROCYCLIC RING COMPOUND

(75) Inventors: Noriko Yasukawa, Tokyo (JP); Hiroshi Kita, Tokyo (JP); Eisaku Katoh, Tokyo (JP); Tatsuo Tanaka, Sagamihara (JP); Shinya Otsu, Tokyo (JP); Rie Katakura, Tokyo (JP); Hidekane Ozeki, Tokyo (JP); Hideo Taka, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/530,719

(22) Filed: Jun. 22, 2012

(65) Prior Publication Data

US 2012/0326601 A1 Dec. 27, 2012

Related U.S. Application Data

(62) Division of application No. 12/463,250, filed on May 8, 2009, now Pat. No. 8,790,793.

(30) Foreign Application Priority Data

May 13, 2008 (JP) .................................. 2008-125814
Nov. 19, 2008 (JP) .................................. 2008-295408
Mar. 25, 2009 (JP) .................................. 2009-073509
May 12, 2009 (JP) .................................. 2009-115333

(51) Int. Cl.
*H01L 51/50* (2006.01)
*C09K 11/06* (2006.01)
*H01L 51/00* (2006.01)
*H05B 33/14* (2006.01)

(52) U.S. Cl.
CPC ............ *C09K 11/06* (2013.01); *H01L 51/0067* (2013.01); *H01L 51/0072* (2013.01); *H01L 51/0073* (2013.01); *H01L 51/0074* (2013.01); *H05B 33/14* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *C09K 2211/185* (2013.01); *H01L 51/006* (2013.01); *H01L 51/0081* (2013.01); *H01L 51/0085* (2013.01); *H01L 51/5048* (2013.01); *Y10S 428/917* (2013.01)
USPC ........... 428/690; 428/917; 313/502; 313/504; 313/506; 257/40

(58) Field of Classification Search
None
See application file for complete search history.

(56) References Cited

U.S. PATENT DOCUMENTS

| 5,077,142 | A | 12/1991 | Sakon et al. |
| 2004/0086745 | A1 | 5/2004 | Iwakuma et al. |
| 2005/0093422 | A1 | 5/2005 | Wang et al. |
| 2006/0134460 | A1 | 6/2006 | Kondakova et al. |
| 2006/0186796 | A1* | 8/2006 | Yabe et al. ..................... 313/504 |
| 2009/0091253 | A1* | 4/2009 | Yasukawa et al. ............ 313/504 |
| 2009/0096360 | A1 | 4/2009 | Tanaka et al. |
| 2010/0207105 | A1* | 8/2010 | Katakura et al. ................ 257/40 |

FOREIGN PATENT DOCUMENTS

| EP | 1718121 A1 | 11/2006 |
| EP | 2123733 A2 | 11/2009 |
| GB | 2439013 A | 12/2007 |
| JP | 4-68076 A | 3/1992 |

(Continued)

OTHER PUBLICATIONS

Extended European Search Report for Application No./Patent No. 11196137.1-2111, dated Jun. 26, 2012.
Partial European Search Report for Application No./Patent No. 11196132.2-2111/2460866, dated Jun. 26, 2012.
European search report for Application No./Patent No. 09159164.4-2111 dated Jul. 15, 2009.
European Search Report for Application No./Patent No. 09159164.4-2111/2123733 dated May 3, 2010.
Notification of Reasons for Refusal for Japanese Patent Application No. 2009-115333; Date of Mailing: Aug. 26, 2013, with English Translation.
Notice of Reasons for Refusal for Japanese Patent Application No. 2009-115333, date of drafting: Mar. 27, 2014, with English translation.

*Primary Examiner* — Andrew K Bohaty
(74) *Attorney, Agent, or Firm* — Cantor Colburn LLP

(57) ABSTRACT

Provided is an organic electroluminescent element comprising a substrate having thereon an anode, a cathode, and a plurality of organic layers sandwiched between the anode and the cathode,
wherein the plurality of organic layers comprise:
a light emitting layer containing a phosphorescence emitting compound; and
an electron transport layer containing a compound represented by Formula (1), (Ar1)n1-Y1     Formula (1)

wherein n1 is an integer of 1 or more; $Y_1$ is a substituent when n1 is 1, and $Y_1$ is a single bond or a linking group of n1 valences when n1 is two or more; Ar1 is a group represented by Formula (A), a plurality of Ar1 may be the same or different with each other when n1 is two or more; and the compound represented by Formula (1) contains at least two condensed aromatic heterocyclic rings each comprising 3 or more rings condensed with each other:

Formula (A)

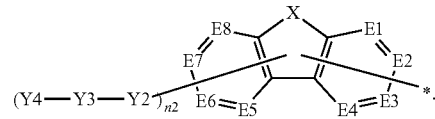

7 Claims, 5 Drawing Sheets

(56) References Cited

FOREIGN PATENT DOCUMENTS

| | | |
|---|---|---|
| JP | 2002-8860 A | 1/2002 |
| JP | 2003-45662 A | 2/2003 |
| JP | 2006-80271 A | 3/2006 |
| JP | 2007243101 A | 9/2007 |
| JP | 2007288035 A | 11/2007 |
| WO | 2006/103909 A1 | 10/2006 |
| WO | 2007077810 A1 | 7/2007 |
| WO | 2007108362 A1 | 9/2007 |
| WO | 2008/029729 A1 | 3/2008 |
| WO | 2008146838 A1 | 12/2008 |

* cited by examiner

ORGANIC ELECTROLUMINESCENT ELEMENT INCLUDING A CONDENSED AROMATIC HETEROCYCLIC RING COMPOUND

CROSS REFERENCE TO RELATED APPLICATIONS

This application is a divisional application of U.S. patent application Ser. No. 12/463,250 filed on May 8, 2009 now U.S. Pat. No. 8,790,793, which claims priority to Japanese Patent Application No. 2008-125814 filed on May 13, 2008, No. 2008-295408 filed on Nov. 19, 2008, No. 2009-11533 filed May 12, 2009, and No. 2009-073509 filed on Mar. 25, 2009 with the Japan Patent Office, the entire contents of which are hereby incorporated by reference.

TECHNICAL FIELD

The present invention relates to an organic electroluminescent element, a display device and a lighting device.

BACKGROUND

Conventionally, an emission type electronic display device includes an electroluminescence display (hereinafter, referred to as an ELD). A constituent element of an ELD includes such as an inorganic electroluminescent element and an organic electroluminescent element (hereinafter, referred to as an organic EL element).

An inorganic electroluminescent element has been utilized as a flat light source, however, it requires a high voltage of alternating current to operate an emission element. An organic electroluminescent element is an element provided with a constitution comprising a light emitting layer containing a emitting substance being sandwiched with a cathode and an anode, and an exciton is generated by an electron and a positive hole being injected into the light emitting layer to be recombined, resulting emission utilizing light release (fluorescence.phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

However, in an organic electroluminescence in view of the future practical application, desired has been development of an organic µL element which efficiently emits at a high luminance with a low electric consumption.

In Japanese Patent No. 3093796, a slight amount of a fluorescent substance has been doped in a stilbene derivative, distyrylarylene derivative or a tristyrylarylene derivative, to achieve improved emission luminance and a prolonged lifetime of an element.

Further, there are known such as an element having an organic light emitting layer comprising a 8-hydroxyquinoline aluminum complex as a host compound which is doped with a slight amount of a fluorescent substance (for example, JP-A 63-264692) and an element having an organic light emitting layer comprising a 8-hydroxyquinoline aluminum complex as a host compound which is doped with quinacridone type dye (for example, JP-A 3-255190).

In the case of utilizing emission from an excited singlet as described above, since a generation ratio of a singlet exciton to a triplet exciton is 1/3, that is, a generation probability of an emitting exciton species is 25% and a light taking out efficiency is approximately 20%, the limit of an external quantum efficiency (next) of taking out light is said to be 5%.

However, since an organic EL element which utilizes phosphorescence from an excited triplet has been reported from Princeton University (M. A. Baldo et al., Nature vol. 395, pp. 151-154 (1998)), researches on materials exhibiting phosphorescence at room temperature have come to be active.

For example, it is also disclosed in A. Baldo et al., Nature, vol. 403, No. 17, pp. 750-753 (2000), and U.S. Pat. No. 6,097,147.

Since the upper limit of internal quantum efficiency becomes 100% by utilization of an excited triplet, which is principally 4 times of the case of an excited singlet, it may be possible to achieve almost the same ability as a cooled cathode ray tube to attract attention also for an illumination application.

For example, in such as S. Lamansky et al., J. Am. Chem. Soc., vol. 123, p. 4304 (2001), many compounds mainly belonging to heavy metal complexes such as iridium complexes have been synthesized and studied.

Further, in the aforesaid, A. Baldo et al., Nature, vol. 403, No. 17, pp. 750-753 (2000), utilization of tris(2-phenylpyridine)iridium as a dopant has been studied.

An orthometalated complex provided with platinum instead of iridium as a center metal is also attracting attention. With respect to these types of complexes, many examples having a characteristic ligand are known.

Carbazole derivatives such as CBP and m-CP are well know as a host compound for these phosphorescence emitting compounds, (for example, refer to WO 03/80760 and WO 04/74399).

Especially, m-CP or its derivatives having a large band gap are known for a host compound used for blue light emission.

There is disclosed a technology which enables to produce a high luminance light by introduction of a positive hole inhibiting layer (an exciton inhibiting layer). An example of which is disclosed by Pioneer Co. Ltd. In this example, a specific aluminium complex or a fluorinated compound is used to produce an emission with high efficiency (for example, refer to Patent Document 1).

Another example was disclosed in which a pyridine derivative or a pyrimidine derivative was used in an electron transport layer (for example, refer to Patent Documents 2 and 3). Further examples which use a pyridine derivative in an electron transport layer are known (for example, refer to Patent Documents 4 and 5).

However, disclosed technologies are still insufficient for realizing a practical organic electroluminescent element, and further improvement is requested.

Patent Document 1: Unexamined Japanese patent application publication (hereafter it is called as JP-A) 2002-8860.
Patent Document 2: WO 06/103909
Patent Document 3: JP-A 2003-45662
Patent Document 4: JP-A 04-68076
Patent Document 5: U.S. Pat. No. 5,077,142

SUMMARY

An object of the present invention is to provide an organic electroluminescent element which can be driven with a low driving voltage and exhibits high emission luminance. Further object of the present invention is to provide a lighting device and a display device using the same organic electroluminescent element.

An object of the present invention described above has been achieved by the following constitutions.

1. An organic electroluminescent element comprising a substrate having thereon an anode, a cathode, and a plurality of organic layers sandwiched between the anode and the cathode,
wherein the plurality of organic layers comprise:
a light emitting layer containing a phosphorescence emitting compound; and
an electron transport layer containing a compound represented by Formula (1), (Ar1)n1–Y1   Formula (1)

wherein n1 is an integer of 1 or more; Y1 is a substituent when n1 is 1, and Y1 is a single bond or a linking group of n1 valences when n1 is two or more; Ar1 is a group represented by Formula (A), a plurality of Ar1 may be the same or different with each other when n1 is two or more; and the compound represented by Formula (1) contains at least two condensed aromatic heterocyclic rings each comprising 3 or more rings condensed with each other:

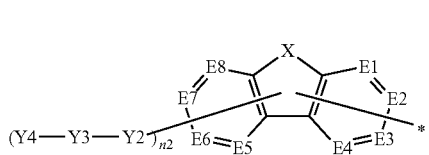

Formula (A)

wherein X is —N(R)—, —O—, —S— or —Si(R)(R')—; E1 to E8 each are —C(R1)= or —N=; R, R' and R1 each are a hydrogen atom, a substituent or a bonding site to Y1, (*) is a bonding site to Y1; Y2 is a single bond or a bivalent linking group; Y3 and Y4 each are a group derived from a 5 or 6 membered aromatic ring, at least one of Y3 and Y4 is derived from an aromatic heterocyclic ring containing a nitrogen atom in the ring; and n2 is an integer of 1 to 4.

2. The organic electroluminescent element of the aforesaid item 1,
wherein n1 of Formula (1) is an integer of 2 or more.

3. The organic electroluminescent element of the aforesaid items 1 or 2, wherein Y2 of Formula (A) is a single bond.

4. The organic electroluminescent element of any one of the aforesaid items 1 to 3,
wherein n2 in Formula (A) is an integer of 1 or 2.

5. The organic electroluminescent element of any one of the aforesaid items 1 to 4,
wherein,
(i) X of Formula (A) is —N(R)—, and R is a bonding site to Y1; or
(ii) (ii) E3 is —C(R1)=, and R1 is a bonding site to Y1.

6. The organic electroluminescent element of any one of the aforesaid items 1 to 5,
wherein, Y1 is a group derived from a condensed aromatic heterocyclic ring comprising 3 or more rings condensed with each other.

7. The organic electroluminescent element of the aforesaid item 6,
wherein, Y1 is a group derived from a dibenzofuran ring or a dibenzothiophene ring.

8. The organic electroluminescent element of any one of the aforesaid items 1 to 7,
wherein at least 6 of E1 to E8 of Formula (A) each are —C(R1)=.

9. The organic electroluminescent element of any one of the aforesaid items 1 to 8,
wherein Y3 of Formula (A) is a group derived from a 6 membered aromatic ring.

10. The organic electroluminescent element of any one of the aforesaid items 1 to 9,
wherein Y4 of Formula (A) is a group derived from a 6 membered aromatic ring.

11. The organic electroluminescent element of any one of the aforesaid items 1 to 10,
wherein Y4 of Formula (A) is a group derived from an aromatic heterocyclic ring containing a nitrogen atom in the ring.

12. The organic electroluminescent element of the aforesaid item 11,
wherein Y4 of Formula (A) is a group derived from a pyridine ring.

13. The organic electroluminescent element of any one of the aforesaid items 1 to 12,
wherein Y3 of Formula (A) is a group derived from a benzene ring.

14. The organic electroluminescent element of the aforesaid item 1,
wherein the compound represented by Formula (1) is further represented by Formula (2):

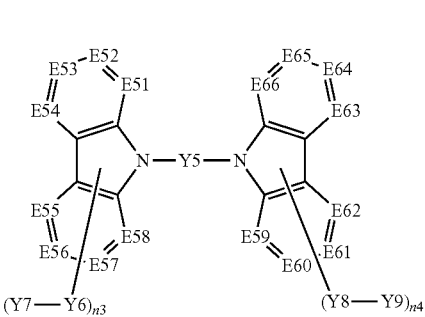

Formula (2)

wherein Y5 is a divalent linking group of an arylene group, a heteroarylene group or a combination group thereof; E51 to E66 each are —C(R3)= or —N=, R3 is a hydrogen atom or a substituent; Y6 to Y9 each are a group derived from an aromatic hydrocarbon ring or an aromatic heterocyclic ring, provided that at least one of Y6 and Y7 and at least one of Y8 and Y9 each are a group derived form an aromatic heterocyclic ring containing a nitrogen atom in the ring; and n3 and n4 each are an integer of 0 to 4, provided that a sum of n3 and n4 is an integer of 2 or more.

15. The organic electroluminescent element of the aforesaid item 14,
wherein Y5 of Formula (2) is a group derive from a condensed aromatic heterocyclic ring comprising 3 or more rings condensed with each other.

16. The organic electroluminescent element of the aforesaid item 15,
wherein Y5 of Formula (2) is a group derived from a dibenzofuran ring or a dibenzothiophene ring.

17. The organic electroluminescent element of any one of the aforesaid items 14 to 16,
wherein at least 6 of E51 to E58 and at least 6 of E59 to E66 of Formula (2) are —C(R3)=.

18. The organic electroluminescent element of any one of the aforesaid items 14 to 17,
wherein Y7 and Y9 of Formula (2) each are a group derived from an aromatic heterocyclic ring containing a nitrogen atom in the ring.

19. The organic electroluminescent element of the aforesaid item 18,
wherein Y7 and Y9 of Formula (2) each are a group derived from a pyridine ring.

20. The organic electroluminescent element of any one of the aforesaid items 14 to 19,
wherein Y6 and Y8 of Formula (2) each are a group derived from a benzene ring.

21. The organic electroluminescent element of any one of the aforesaid items 14 to 20,
wherein n3 and n4 of Formula (2) each are an integer of 1 to 2, provided that a sum of n3 and n4 is an integer of 2 or more.

22. The organic electroluminescent element of the aforesaid item 14,
wherein the compound represented by Formula (2) is further represented by Formula (3):

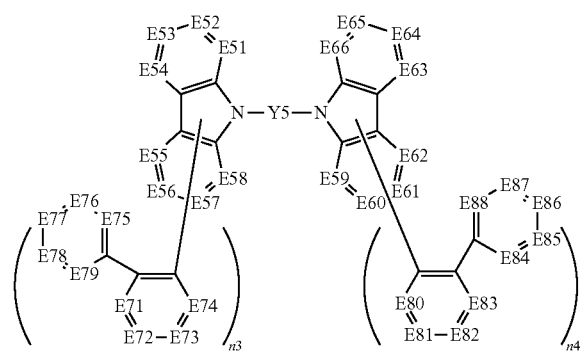

Formula (3)

wherein Y5 is a divalent linking group of an arylene group, a heteroaryrene group or a combination group thereof; E51 to E66 and E71 to E88 each are —C(R3)= or —N=, R3 is a hydrogen atom or a substituent, provided that at least one of E71 to E79 and at least one of E80 to E88 each are —N=; and n3 and n4 each are an integer of 0 to 4, provided that a sum of n3 and n4 is an integer of 2 or more.

23. The organic electroluminescent element of the aforesaid item 22,
wherein Y5 of Formula (3) is a group derive from a condensed aromatic heterocyclic ring comprising 3 or more rings condensed with each other.

24. The organic electroluminescent element of the aforesaid item 23,
wherein Y5 of Formula (3) is a group derived from a dibenzofuran ring or a dibenzothiophene ring.

25. The organic electroluminescent element of any one of the aforesaid items 22 to 24,
wherein at least 6 of E51 to E58 and at least 6 of E59 to E66 of Formula (3) each are —C(R3)=.

26. The organic electroluminescent element of any one of the aforesaid items 22 to 25,
wherein at least one of E75 to E79 and at least one of E84 to E88 of Formula (3) each are —N=.

27. The organic electroluminescent element of the aforesaid item 26,
wherein only one of E75 to E79 and only one of E84 to E88 of Formula (3) each are —N=.

28. The organic electroluminescent element of any one of the aforesaid items 22 to 27,
wherein E71 to E74 and E80 to E83 of Formula (3) each are —C(R3)=.

29. The organic electroluminescent element of any one of the aforesaid items 22 to 28,
wherein n3 and n4 of Formula (3) each are an integer of 1 to 2, provided that a sum of n3 and n4 is an integer of 2 or more.

30. The organic electroluminescent element of any one of the aforesaid items 1 to 29,
wherein the phosphorescence emitting compound contained in the light emitting layer is a compound represented by Formula (4):

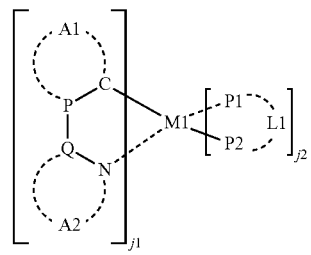

Formula (4)

wherein P and Q each are a carbon atom or a nitrogen atom; A1 is a group of atoms which forms an aromatic hydrocarbon ring or an aromatic heterocyclic ring together with P—C; A2 is a group of atoms which forms an aromatic heterocyclic ring together with Q-N; P1-L1-P2 is a bidentate ligand, P1 and P2 each independently are a carbon atom, an nitrogen atom or an oxygen atom, L1 is a group of atoms which forms a bidentate ligand together with P1 and P2; j1 is an integer of 1 to 3; j2 is an integer of 0 to 2, provided that a sum of j1 and j2 is 2 or 3; and M1 is a transition metal of Groups 8 to 10 of the Element Periodic Table.

31. The organic electroluminescent element of the aforesaid item 30,
wherein the compound represented by Formula (4) is further represented by Formula (5):

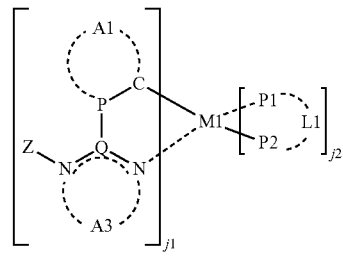

Formula (5)

wherein Z is a hydrocarbon ring or a heterocyclic ring; A1 is a group of atoms which forms an aromatic hydrocarbon ring or an aromatic heterocyclic ring together with P—C; A3 is —C(R01)=C(R02)-, —N=C(R02)-, —C(R01)=N— or —N=N—, R01 and R02 each are a hydrogen atom or a substituent; P1-L1-P2 is a bidentate ligand, P1 and P2 each independently are a carbon atom, an nitrogen atom or an oxygen atom, L1 is a group of atoms which forms a bidentate ligand together with P1 and P2; j1 is an integer of 1 to 3; j2 is an integer of 0 to 2, provided that a sum of j1 and j2 is 2 or 3; and M1 is a transition metal of Groups 8 to 10 of the Element Periodic Table.

32. The organic electroluminescent element of the aforesaid items 30 or 31, wherein M1 of Formula (4) is iridium.

33. The organic electroluminescent element of any one of the aforesaid items 1 to 32, wherein the electron transport layer is produced by a step of forming the layer using a wet process.

34. The organic electroluminescent element of any one of the aforesaid items 1 to 33, wherein the light emitting layer is produced by a step of forming the layer using a wet process.

35. The organic electroluminescent element of any one of the aforesaid items 1 to 34 emitting a white light.

36. A lighting device provided with the organic electroluminescent element of any one of the aforesaid items 1 to 35.

37. A display device provided with the organic electroluminescent element of any one of the aforesaid items 1 to 36.

The present invention has enabled to provide an organic electroluminescent element which can be driven with a low driving voltage and exhibits high emission luminance. The present invention has also enabled to provide a lighting device and a display device using the same organic electroluminescent element.

DESCRIPTION OF THE PREFERRED EMBODIMENTS

Figure 1:
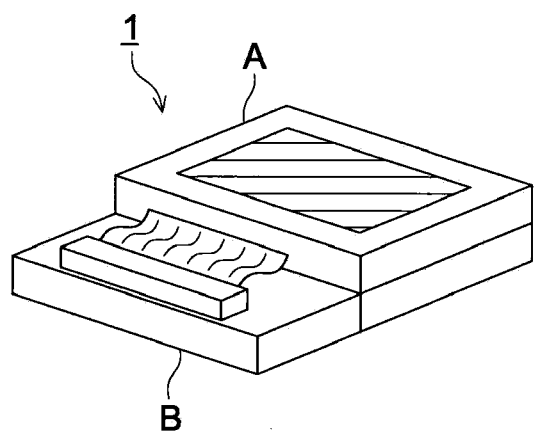
FIG. 1 is a schematic drawing to show an example of a display device constituted of an organic EL element.

In the organic electroluminescent element of the present invention, by achieving the constitution specified via any one of Items 1-37, it was possible to prepare an organic electroluminescent element which resulted in high light emission efficiency, a long light emitting lifetime, and low drive voltage (also referred to as a low voltage increase ratio).

Further, by employing the organic EL element exhibiting the aforesaid characteristics, it was possible to produce a display device of high luminance, and a lighting device.

Each of the components according to the present invention will now be sequentially detailed.

The inventors of the present invention conducted diligent investigation of the molecular structure of heterocyclic derivatives, such as a pyridine derivative or a pyrimidine derivative, which have, heretofore, been known as an electron transport material. As a result, it was discovered that by employing at least one of the compounds represented by aforesaid Formula (1), it was possible to provide an organic electroluminescent element (hereinafter also referred to as an organic EL element) which resulted in a high light emission efficiency, a long light emission lifetime, and low drive voltage (also referred to as low voltage increasing ratio), as well as a lighting device and a display device incorporating the aforesaid organic EL element.

In addition, by combining the aforesaid compounds, it was possible to produce a highly efficient full-color image display device.

The organic EL element is an organic electroluminescent element which is structured in such a manner that a plurality of organic compound layers is sandwiched between the anode and the cathode, and one of the plurality of organic compound layers is a light emitting layer incorporating phosphorescence emitting compounds, while another layer is an electron transport layer. The aforesaid electron transport layer is characterized in incorporating the compounds represented by aforesaid Formula (1).

An essential requirement to realize the effects described in the present invention is that the electron transport layer, which constitutes the organic EL element of the present invention, incorporates the compounds represented by aforesaid Formula (1).

Further, in view of transport balance of a carrier, it is not appropriate to employ the compounds represented by Formula (1) according to the present invention in a bipolar layer (for example, a light emitting layer) which transports both positive holes and electrons as a light emitting host does, due to the high electron transportability.

The constitution layers of an organic EL element of the present invention, such as a light emitting layer and an electron transport layer, will be detailed in the following section describing the constitution layers of an organic EL element.

<Compound Represented by Formula (1)>

The compound represented by Formula (1) of the present invention will be described. In Formula (1), examples of the substituents represented by Y1 include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an alkenyl group (for example, a vinyl group, an allyl group, a 1-propenyl group, a 2-butenyl group, a 1,3-butadienyl group, a 2-pentenyl group and an isopropenyl group); an alkynyl group (for example, an ethynyl group and a propargyl group); an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenyryl group); an aromatic heterocyclic group (for example, a furyl group, a thienyl group, a pyridyl group, a pyridazinyl group, a pyrimidinyl group, a pyrazinyl group, a triazinyl group, an imidazolyl group, pyrazolyl group, a thiazolyl group, a quinazolinyl group, a carbazolyl group and a carbolinyl group, a diazacarbazolyl group (which is a group in which one of the carbon atoms constituting the carboline ring of the above carbolinyl group is replaced with a nitrogen atom) and a phtharazinyl group); a heterocyclic group (for example, a pyrrolidyl group, an imidazolidyl group, a morpholyl group, and an oxazilidyl group); an alkoxyl group (for example, a methoxy group, an ethoxy group, a propyloxy group, a pentyloxy group, an hexyloxy group, an octyloxy group and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); an acyloxy group (for example, an acetyloxy group, an ethylcarbonyloxy group, a butylcarbonyloxy group, an octylcarbonyloxy group, a dodecylcarbonyloxy group and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group and a dodecylsulfonyl group); an arylsulfonyl group or a heteroarylsulfonyl group (for example, a phenylsulfonyl group, a naphthylsulfonyl group and a 2-pyridylsulfonyl group); an amino group (for example, an amino group, an ethylamino group, a dimethylamino group, a butylamino group, a cyclopentylamino group, a dodecylamino group, an anilino group, a naphthylamino group, a 2-pyridylamino group, a piperidyl group (it is called as a piperidinyl group) and a 2,2,6,6-tetramethyl piperidinyl group); a halogen atom (foe example, a fluorine atom, a chlorine atom and a bromine atom); a fluorohydrocarbon group (for example, a fluoromethyl group, a trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group and a phenyldiethylsilyl group); a phosphate group (for example, dihexylphosphoryl group); a phosphite group (for example, diphenylphosphinyl group); and a phosphono group.

These substituents may further be substituted with the aforesaid substituents. Further, a plurality of these substituents may mutually be joined to form a ring.

In Formula (1), specific examples of a linking group represented by Y1 and having n1 valences include: a divalent, a trivalent and a tetravalent linking group.

In Formula (1), examples of a divalent linking group represented by Y1 include: an alkylene group (for example, an ethylene group, a trimethylene group, a tetramethylene group, a propylene group, an ethylethylene group, a pentamethylene group, and a hexamethylene group, a 2,2,4-trimethylhexamethylene group, a heptamethylene group, an octamethylene group, nanomethylene group, a decamethylene group, a undecamethylene group, a dodecamethylene group, a cyclohexylene group (for example, 1,6-cyclohexanediyl group) and a cyclopenthylene group (for example, 1,5-cyclopentanediyl group); an alkenylene group (for example, a vinylene group, a propenylene group, a butenylene group, a pentenylene group, a 1-methylvinylene group, a 1-methylpropenylene group, a 2-methylpropenylene group, a 1-methylpentenylene group, a 3-methylpentenylene group, a 1-ethylvinylene group, a 1-ethylpropenylene group, a 1-ethylbutenylene group and a 3-ethylbutenylene group); an alkynylene group (for example, an ethynylene group, a 1-propynylene group, a 1-butynylene group, a 1-pentynylene group, a 1-hexnylene group, a 2-butynylene group, a 2-pentynylene group, a 1-methylethynylene group, a 3-methyl-1-propynylene group and a 3-methyl-1-butynylene group); an arylene group (for example, an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group and a 3,3'-biphenyldiyl group, and a 3,6-biphenyldiyl group), terphenyldiyl group, quaterphenyldiyl group, a quinquephenyldiyl group, a sexiphenyldiyl group, a septiphenyldiyl group, an octiphenyldiyl group, a nobiphenyldiyl group and a deciphenyldiyl group); a heteroarylene group (for example, a divalent group derived from the group consisting of a carbazole group, a carboline ring, a diazacarbazole ring (also referred to as a monoazacarboline group, indicating a ring structure formed in such a manner that one of the carbon atoms constituting the carboline ring is replaced with a nitrogen atom); a divalent group derived from a ring of, for example, a triazole ring, a pyrrole ring, a pyridine ring, a pyrazine ring, a quinoxaline ring, a thiophene ring, an oxadiazole ring, a dibenzofuran ring, a dibenzothiophene ring and an indole ring; and a chalcogen atom such as oxygen and sulfur; a divalent group derived from a ring having a condensed aromatic heterocycle with 3 or more ring (which is preferably contains at least one of hetero atoms of N, O, and S), for example, an acridine ring, a benzoquinoline ring, a carbazole ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring structure formed in such a manner that one of the carbon atoms constituting the carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring and a thiophanthrene ring (naphthothiophene ring).

Examples of a trivalent linking group represented by Y1 of Formula (1) include: an ethanetriyl group, a propanetriyl group, a butanetriyl group, a pentanetriyl group, a hexanetriyl group, a heptanetriyl group, an octanetriyl group, a nonanetriyl group, a decantriyl group, an undecanetriyl group, a dodecanetriyl group, a cyclohexanetriyl group, a cyclopentanetriyl group, a benzenetriyl group and a naphthalenetriyl group.

A tetravalent linking group represented by Y1 of Formula (1) is a group which has an additional linking group to the above-described a trivalent linking group. Examples of a tetravalent linking group include: a propandiylidene group, 1,3-propandiyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group and a naphthalenetetrayl group.

The above-described divalent, trivalent and tetravalent linking groups may have further a substituent as recited for Y1 of Formula (1).

A preferable compound represented by Formula (1) contains a group indicated Y1 which is derived from a condensed aromatic heterocyclic group in which 3 or more rings are condensed with each other. Specific examples of a condensed aromatic heterocyclic group in which 3 or more rings are condensed with each other include: a dibenzofuran ring and a dibenzothiophene ring. Further, n1 is preferably 2 or more.

The compound represented by Formula (1) preferably contains at least two condensed aromatic heterocyclic groups each having 3 or more rings condensed with each other.

When Y1 represents an n1 valent linking group, Y1 is required to be non-conjugated is order to keep the excited triplet energy of the compound represented by Formula (1) to be high. Further, from the viewpoint of improving Tg (glass transition temperature), Y1 is preferably composed of an aromatic ring (an aromatic hydrocarbon and an aromatic heterocycle).

Here, "non-conjugated" indicates a state of bonding in which a linking group is not expressed with an alternate repetition of a single bond and a double bond, or a conjugate bond between the aromatic rings which forms a linking group is sterically disconnected.

<Group Represented by Formula (A)>

Formula (A) represents Ar1 in Formula (1).

In "—N(R)—" and "—Si(R)(R')" represented by X of Formula (A), and "—C(R1)=" represented by E1 to E8, R, R' and R1 each indicate the same substituent represented by Y1 of Formula (1).

The divalent linking group represented by Y2 of Formula (A) indicates the same divalent linking group represented by Y1 of Formula (1).

In Formula (A), examples of a 5 or 6 membered aromatic ring which is used to form a group for Y3 or Y4 include: a benzene ring, an oxazole ring, a thiophene ring, a furan ring, a pyrrole ring, a pyridine ring, a pyridazine ring, a pyrimidine ring, a pyrazine ring, the diazine ring, a triazine ring, an imidazole ring, an isoxazole ring, a pyrazole ring and a triazole ring.

More specifically, one of Y3 and Y4 is preferably a group derived from a nitrogen containing aromatic heterocycle.

Examples of a nitrogen containing aromatic heterocycle include: an oxazole ring, a pyrrole ring, a pyridine ring, a pyridazine ring, a pyrimidine ring, a pyrazine ring, the diazine ring, a triazine ring, an imidazole ring, an isoxazole ring, a pyrazole ring and a triazole ring.

(Preferred Groups Represented by Y3)

In Formula (A), the groups represented by Y3 are preferably derived from the above-described 6 membered aromatic rings, more preferably derived from a benzene ring.

(Preferred Groups Represented by Y4)

In Formula (A), the groups represented by Y4 are preferably derived from the above-described 6 membered aromatic rings, more preferably derived from hetero aromatic rings containing a nitrogen atom as a ring forming member. Specifically preferable groups for Y4 are derived from a pyridine ring.

(Preferred Groups Represented by Formula (A))

Preferred groups represented by Formula (A) groups are further represented by one of the following (A-1), (A-2), (A-3) and (A-4).

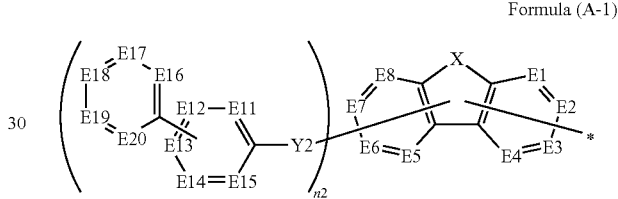

Formula (A-1)

In Formula (A-1), X is —N(R)—, —O—, —S— or —Si(R)(R')—; E1 to E8 each are —C(R1)= or —N=; R, R' and R1 each are a hydrogen atom or a substituent. Y2 is a single bond or a bivalent linking group. E11 to E20 each are —C(R2)= or —N=, ant at least one of E11 to E20 is —N=. R2 is a hydrogen atom, a substituent or a linking site. Provided that at least one of E11 and E12 is —C(R2)=, and R2 is a linking site. n2 is an integer of 1 to 4. (*) is a bonding site to Y1 of Formula (1).

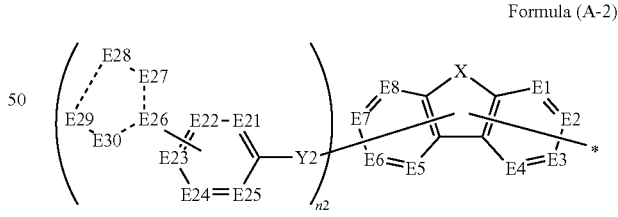

Formula (A-2)

In Formula (A-2), X is —N(R)—, —O—, —S— or —Si(R)(R')—; E1 to E8 each are —C(R1)= or —N=; R, R' and R1 each are a hydrogen atom or a substituent. Y2 is a single bond or a bivalent linking group. E21 to E25 each are —C(R2)= or —N=. E26 to E30 each are —C(R2)=, —N=, —O—, —S— or —Si(R3)(R4)-, and at least one of E21 to E30 is —N=. R2 is a hydrogen atom, a substituent or a linking site. R3 and R4 each are a hydrogen atom or a substituent. Provided that at least one of E21 and E22 is —C(R2)=, and R2 is a linking site. n2 is an integer of 1 to 4. (*) is a bonding site to Y1 of Formula (1).

Formula (A-3)

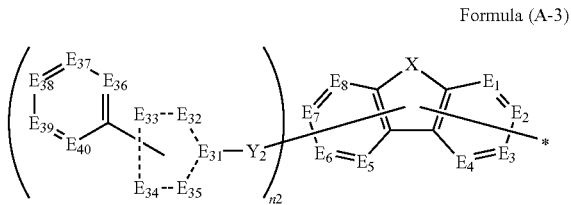

In Formula (A-3), X is —N(R)—, —O—, —S— or —Si(R)(R')—; E1 to E8 each are —C(R1)= or —N=; R, R' and R1 each are a hydrogen atom or a substituent. Y2 is a single bond or a bivalent linking group. E31 to E35 each are —C(R2)=, —N=, —O—, —S— or —Si(R3)(R4)-, and E36 to E40 each are —C(R2)= or —N=. Provided that at least one of E31 to E40 is —N=. R2 is a hydrogen atom, a substituent or a linking site. R3 and R4 each are a hydrogen atom or a substituent. Provided that at least one of E32 and E33 is —C(R2)=, and R2 is a linking site. n2 is an integer of 1 to 4. (*) is a bonding site to Y1 of Formula (1).

Formula (A-4)

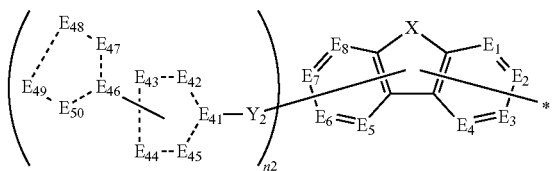

In Formula (A-4), X is —N(R)—, —O—, —S— or —Si(R)(R')—; E1 to E8 each are —C(R1)= or —N=; R, R' and R1 each are a hydrogen atom or a substituent. Y2 is a single bond or a bivalent linking group. E41 to E50 each are —C(R2)=, —N=, —O—, —S— or —Si(R3)(R4)-, and at least one of E41 to E50 is —N=. R2 is a hydrogen atom, a substituent or a linking site. R3 and R4 each are a hydrogen atom or a substituent. Provided that at least one of E42 and E43 is —C(R2)=, and R2 is a linking site. n2 is an integer of 1 to 4. (*) is a bonding site to Y1 of Formula (1).

The groups represented by one of Formulas (A-1) to (A-4) will be described subsequently.

R, R' and R1 in —N(R)— and —Si(R)(R')— represented by X and in —C(R1)= represented by E1 to E8 of Formulas (A-1) to (A-4) each are synonymous with the substituents as described by Y1 of Formula (1).

In any one of Formulas (A-1) to (A-4), a divalent linking group represented by Y2 is synonymous with the linking group represented by Y1 of Formula (1).

R2 in —C(R2)=, represented by E11 to E20 of Formula (A-1), E21 to E30 of Formula (A-2), E31 to E40 of Formula (A-3), and E41 to E50 of Formula (A-4), is synonymous with the substituent represented by Y1 of Formula (1).

Next, a more preferable compound represented by the aforesaid Formula (1) of the present invention will be described.

<Compound Represented by Formula (2)>

In the present invention, the compounds represented by Formula (2) are preferable among the compounds represented by Formula (1). The compounds represented by Formula (2) will be described below.

In Formula (2), an arylene group and a heteroarylene group represented by Y5 each are synonymous with an arylene group and a heteroarylene group described as a divalent linking group represented by Y1 in Formula (1).

A preferable divalent linking group among an arylene group, a heteroarylene group and a combined group therewith is a heteroarylene group. More preferable group is a group derived from a condensed aromatic heterocycle composed of 3 or more rings condensed with each other. Specifically preferred group is a group derived from a dinbenzofuran ring or a dibenzothiophene ring.

R3 in —C(R3)= represented by E51 to E56 of Formula (2) is synonymous with the substituent represented by Y1 of Formula (1).

In Formula (2), among groups represented by E51 to E66, it is preferable that 6 or more groups among E51 to E58; and 6 or more groups among E59 to E66 each are expressed as —C(R3)=.

In Formula (2), examples of an aromatic hydrocarbon ring which is used to form a group for Y6 through Y9 include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring and an anthraanthrene ring.

The afore-mentioned aromatic hydrocarbon ring may have a substituent recited for Y1 of Formula (1).

Examples of an aromatic heterocycle which is used to form a group for Y6 through Y9 include: a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring naphthylidine ring, a carbazole ring, a carboline ring and a diazacarbazole ring (indicating a ring structure formed in such a manner that one of the carbon atoms constituting the carboline ring is replaced with a nitrogen atom).

The afore-mentioned aromatic heterocycle may have a substituent recited for Y1 of Formula (1).

More specifically, in Formula (2), one of Y6 and Y7, one of Y8 and Y9 each are preferably a group derived from a nitrogen containing aromatic heterocycle. Examples of a nitrogen containing aromatic heterocycle include: an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring naphthylidine ring, a carbazole ring, a carboline ring and a diazacarbazole ring (indicating a ring structure formed in such a manner that one of the carbon atoms constituting the carboline ring is replaced with a nitrogen atom). In Formula (2), the groups represented by Y7 and Y9 each are preferably derived from a pyridine ring.

In Formula (2), the groups represented by Y6 and Y8 each are preferably derived from a benzene ring.

Further, more preferable compounds represented by Formula (2) will be described.

<Compound Represented by Formula (3)>

In the present invention, the compounds represented by Formula (3) are preferable among the compounds represented by Formula (2). The compounds represented by Formula (3) will be described below.

In Formula (3), an arylene group and a heteroarylene group represented by Y5 each are synonymous with an arylene group and a heteroarylene group deacribed as a divalent linking group represented by Y1 in Formula (1).

A preferable group among an arylene group, a heteroarylene group and a combined group therewith is a heteroaylen group. More preferable group is a group derived from a condensed aromatic heterocycle composed of 3 or more rings condensed with each other. Specifically preferred group is a group derived from a dinbenzofuran ring or a dibenzothiophene ring.

R3 in —C(R3)= represented by E51 to E56, and E71 to E78 of Formula (3) is synonymous with the substituent represented by Y1 of Formula (1).

In Formula (3), it is preferable that 6 or more groups among E51 to E58; and 6 or more groups among E59 to E66 each are expressed as —C(R3)=.

In Formula (3), it is preferable that at least one group among E75 to E79; and at least one group among E84 to E88 each are expressed as —N=.

In Formula (3), it is preferable that only one of E75 to E79; and only one of E84 to E88 each are expressed as —N=.

In Formula (3), it is preferable that E71 to E74; and E80 to E83 each are expressed as —C(R3)=.

Further, in a compound represented by

Formula (2) or Formula (3), it is preferable that E53 is expressed as —C(R3)=, and R3 is a liking site. Moreover, it is preferable that E61 is expressed as —C(R3)= at the same time, and in addition, and R3 is a liking site.

Further, it is preferable that E75 and E84 each are expressed as —N=; and E71 to E74, and E80 to E83 each are expressed as —C(R3)=.

Examples of a compound represented by any one of Formulas (1), (2) and (3) of the present invention will be shown, however, the present invention is not limited to them.

6

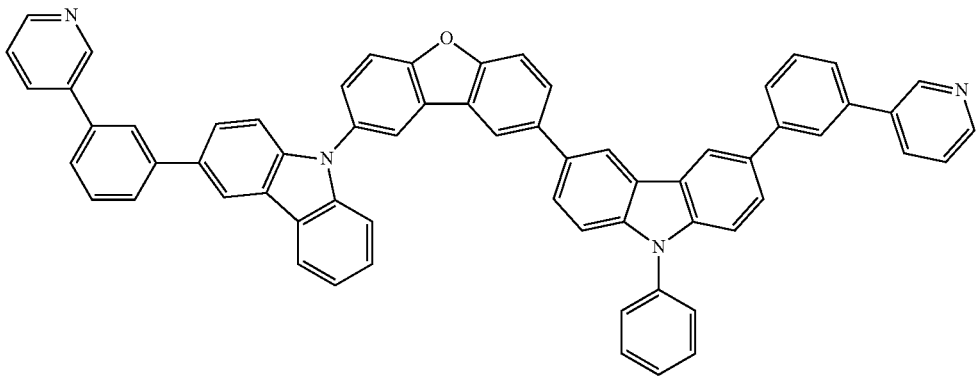

7

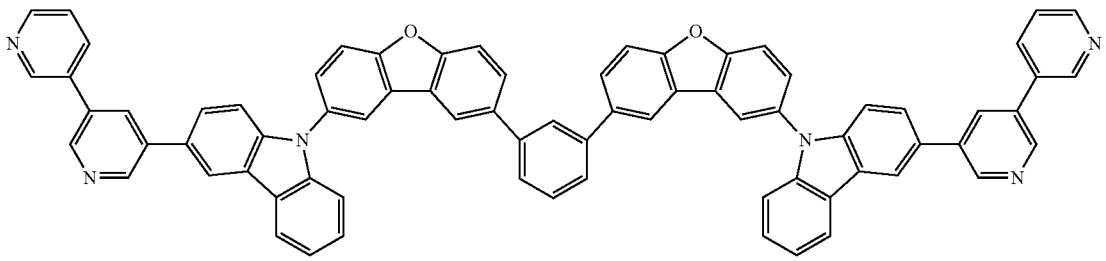

8

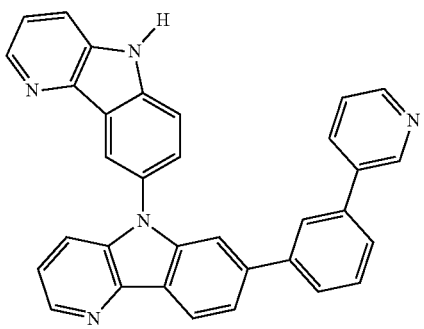

-continued
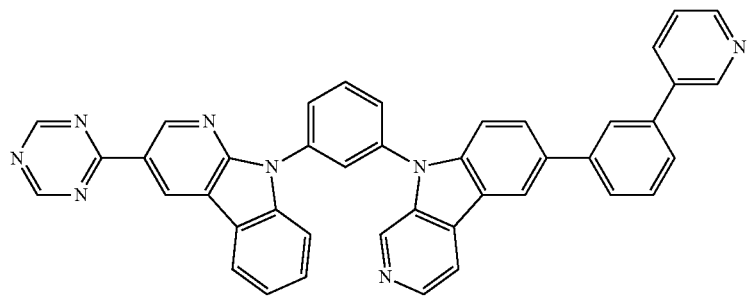
9
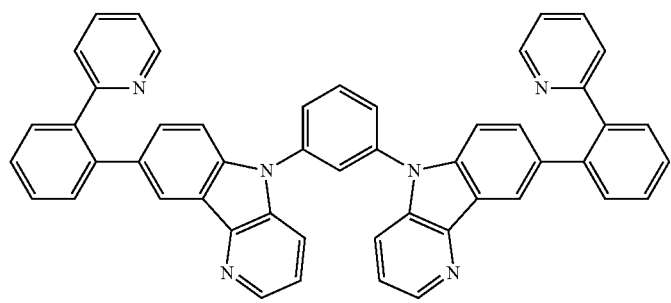
10
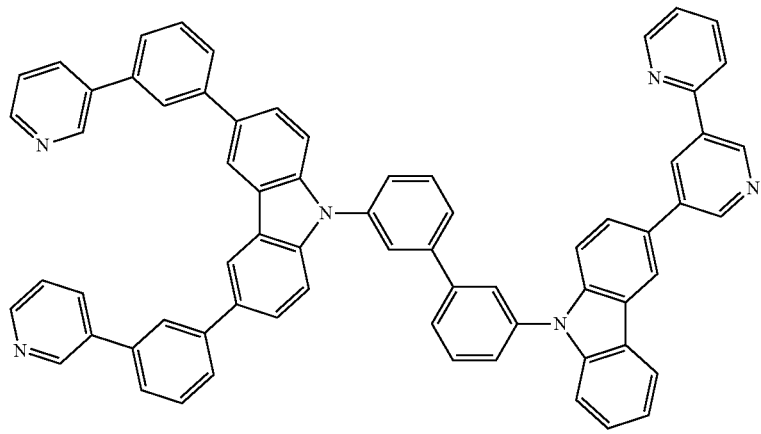
11
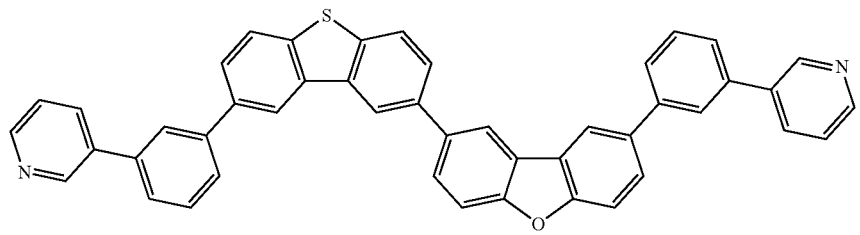
12
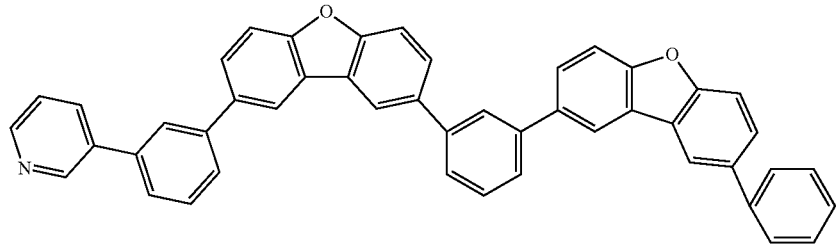
13

-continued
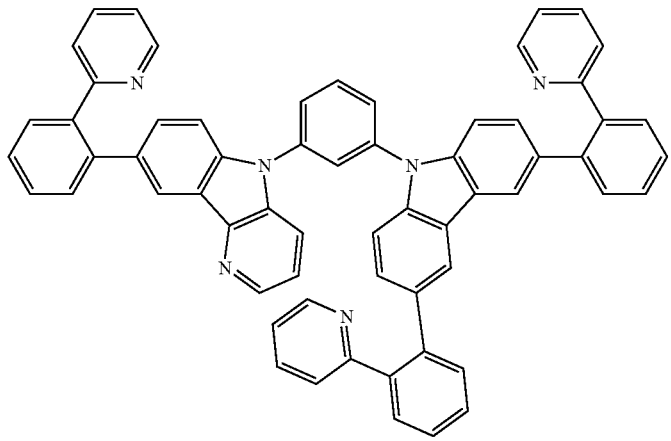
14
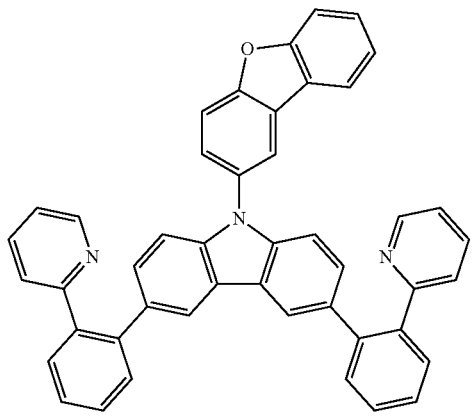
15
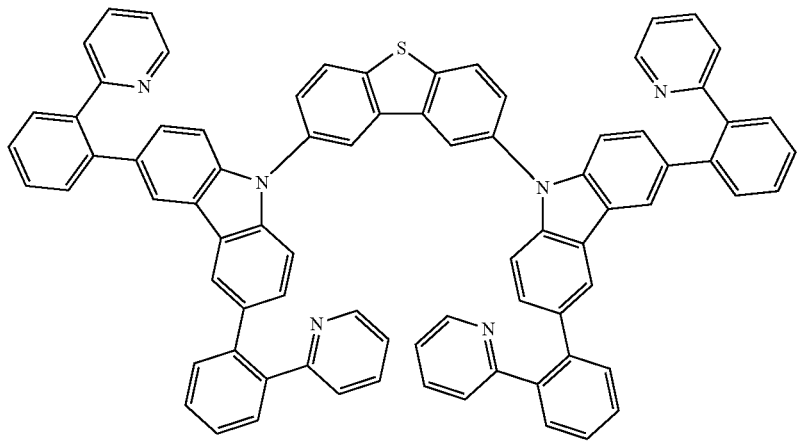
16
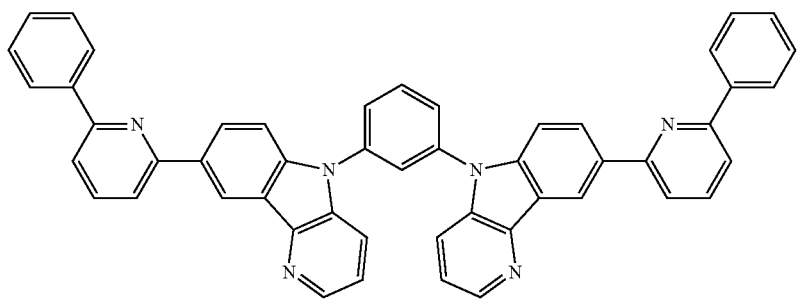
17

-continued
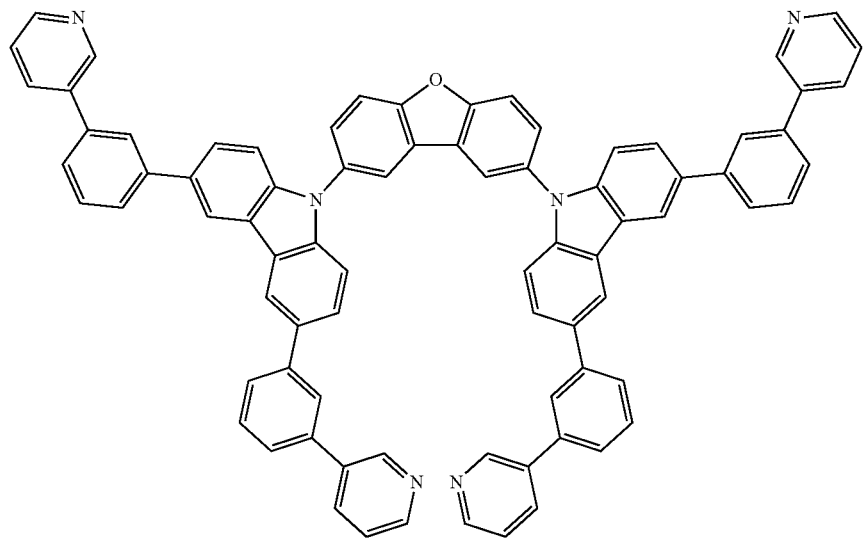
18
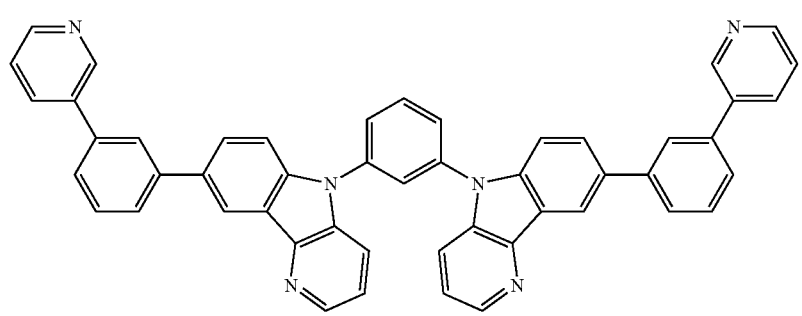
19
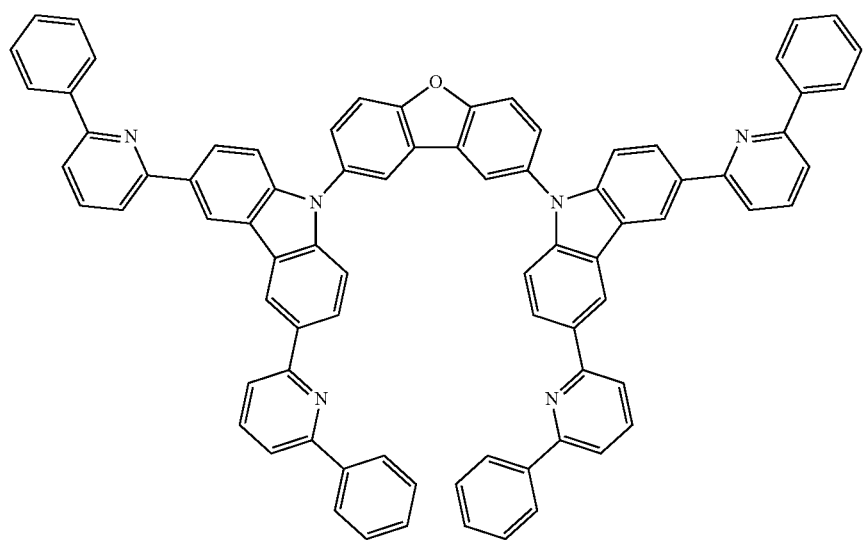
20

-continued
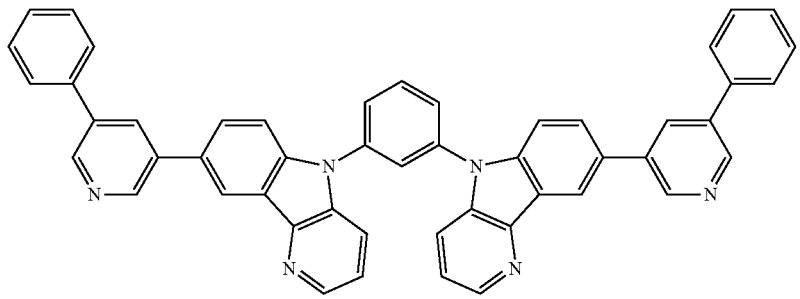
21
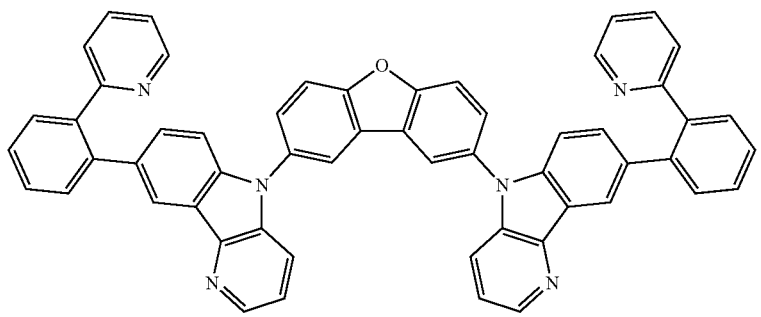
22
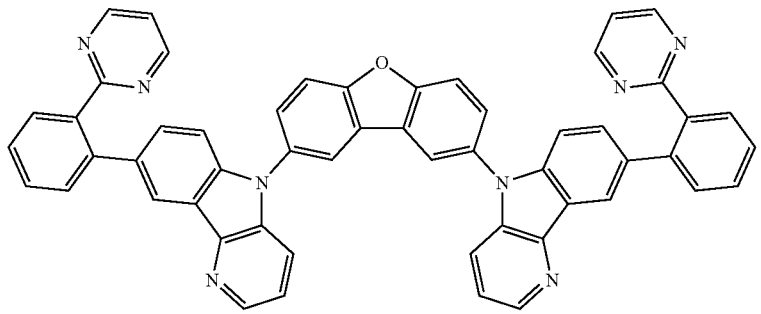
23
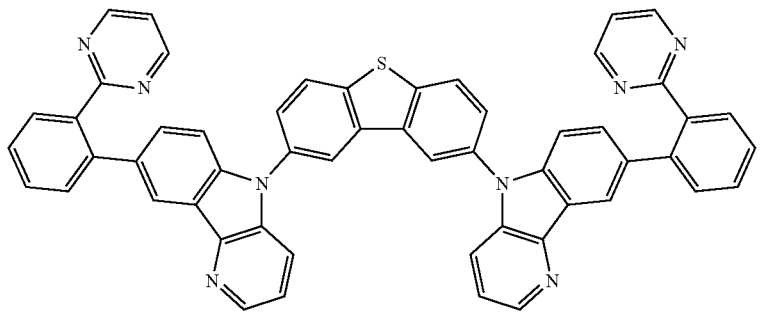
24
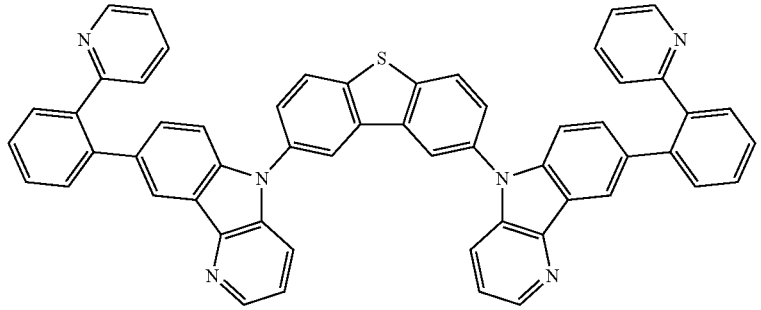
25

-continued
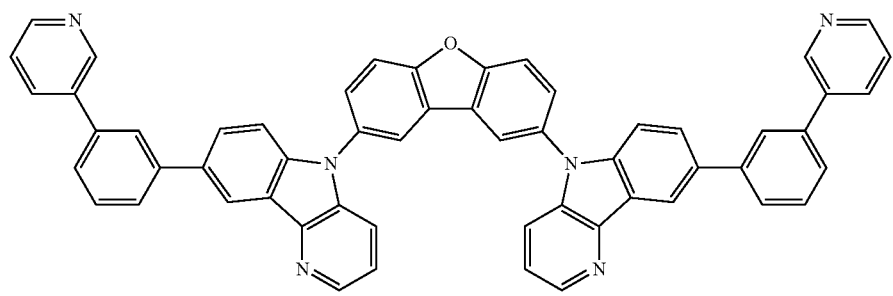
26
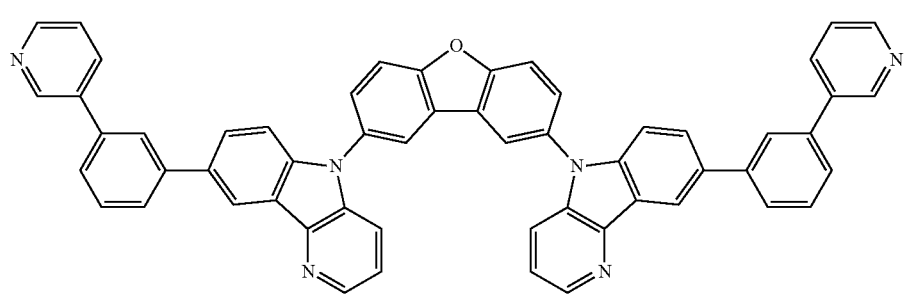
27
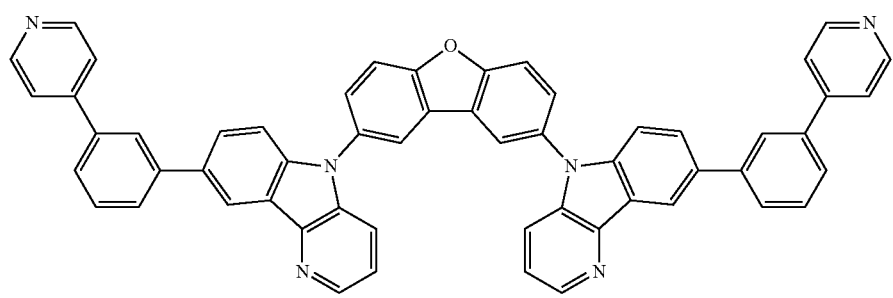
28
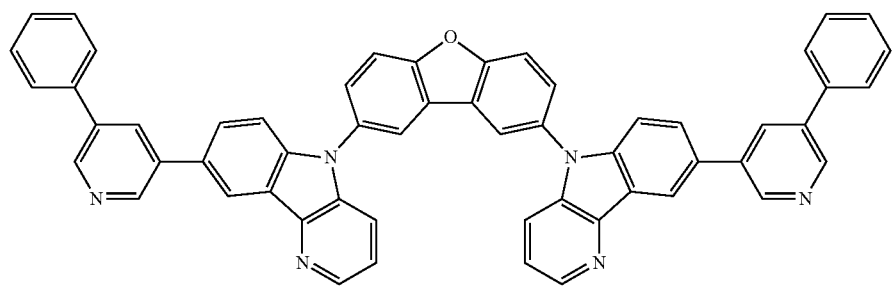
29
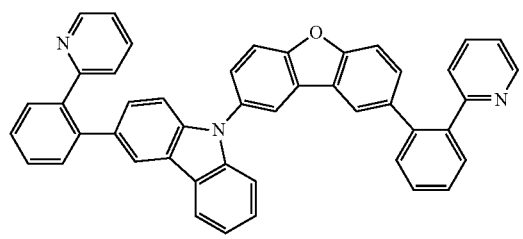
30
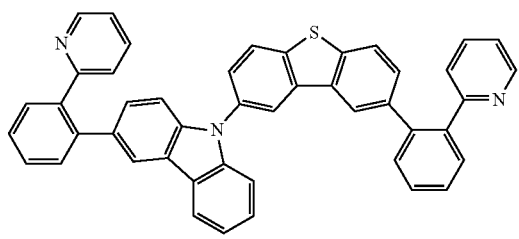
31

-continued
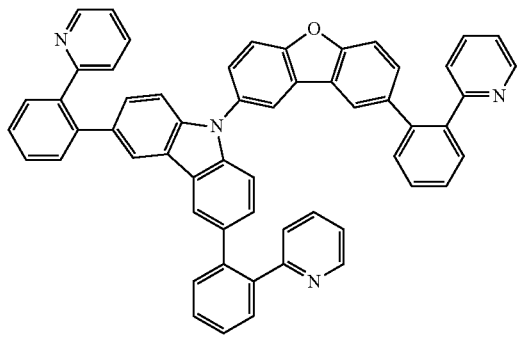
32
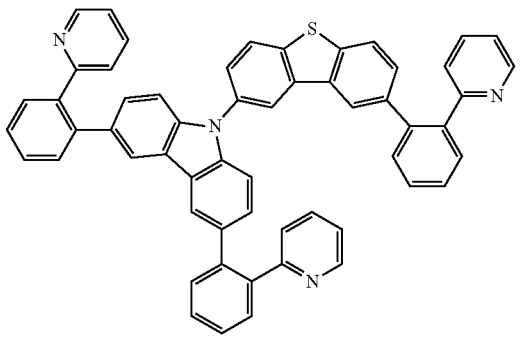
33
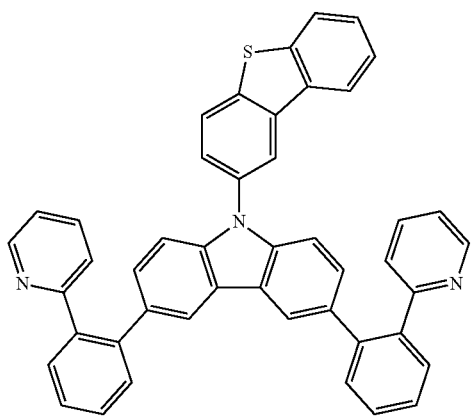
34
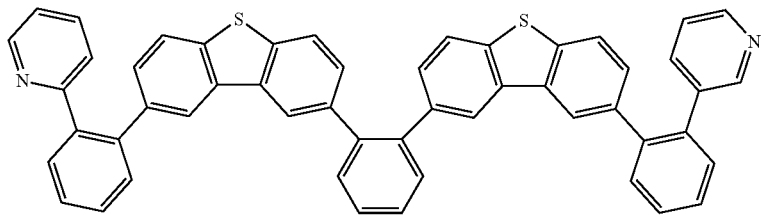
35
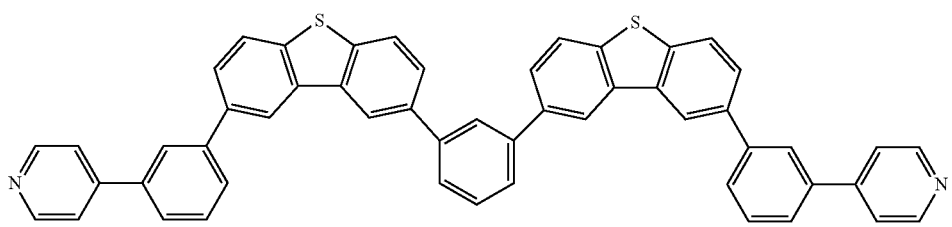
36
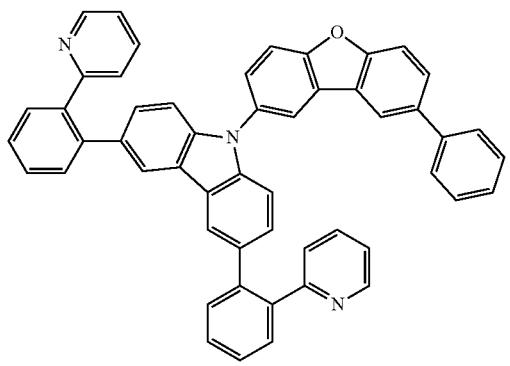
37
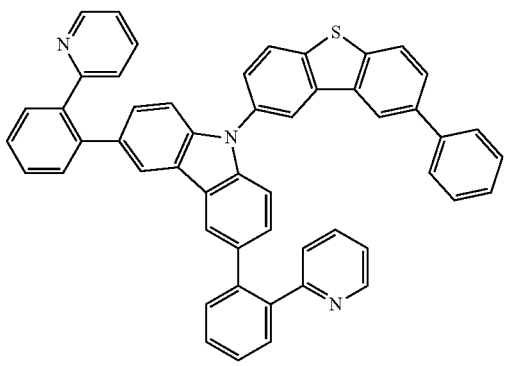
38

-continued
39
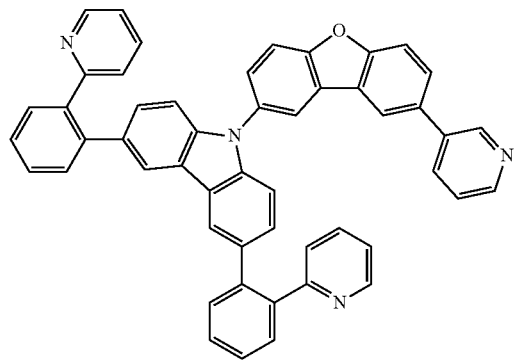
40
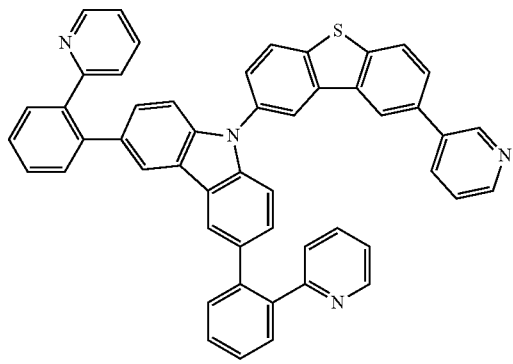
41
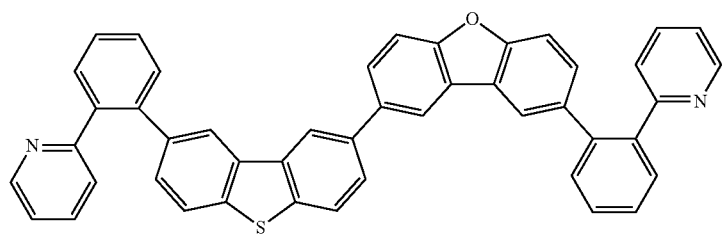
42
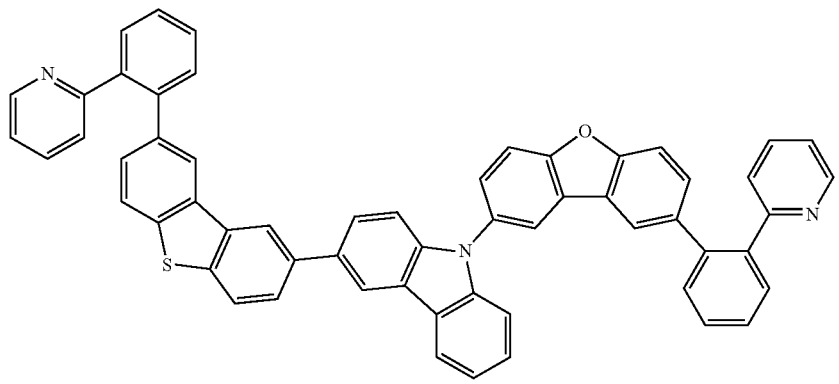
43
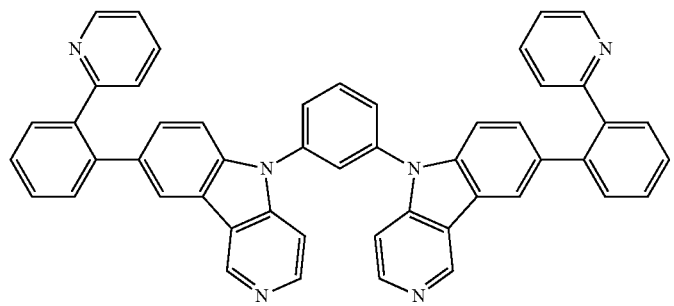
44
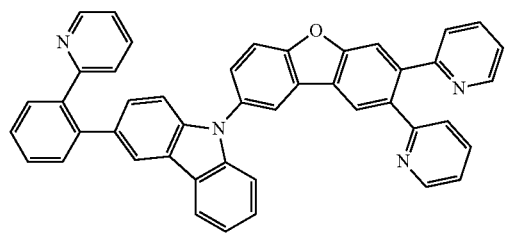
45
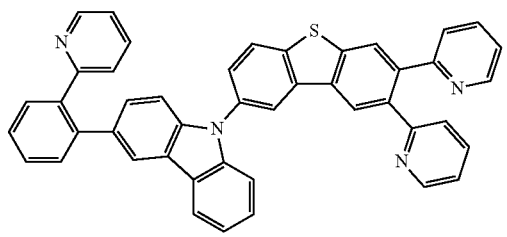

-continued
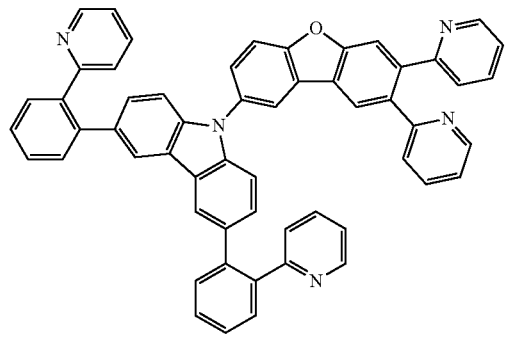
46
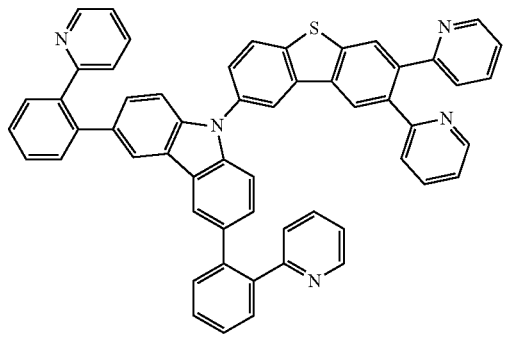
47
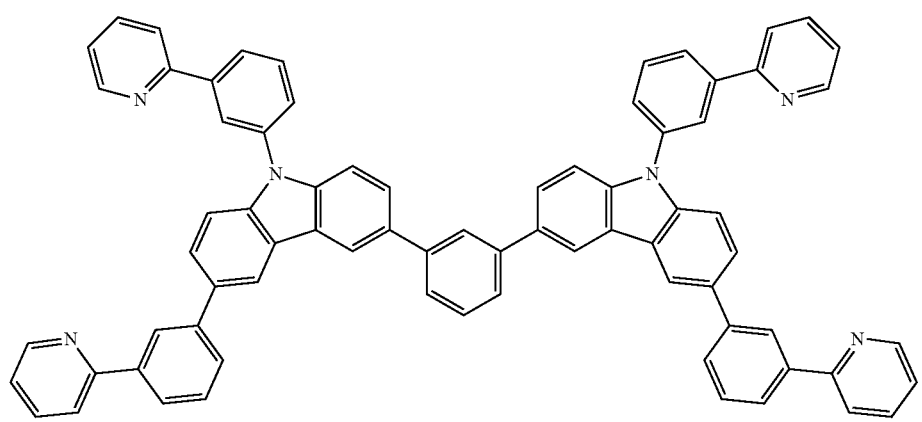
48
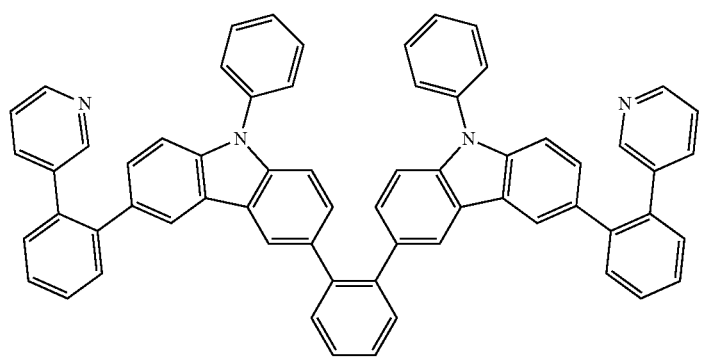
49
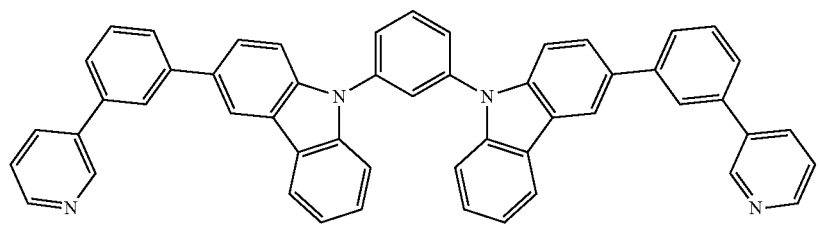
50

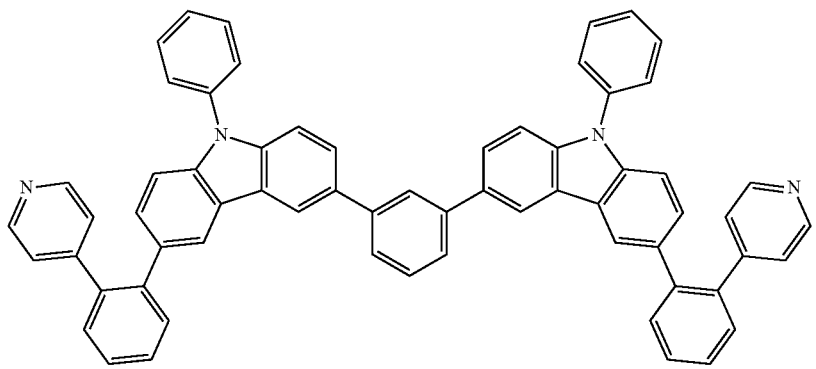
51
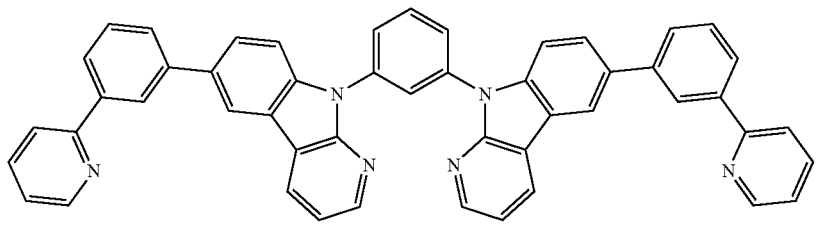
52
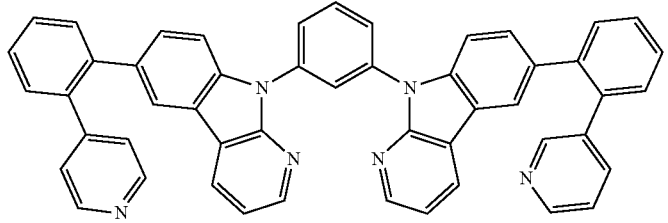
53
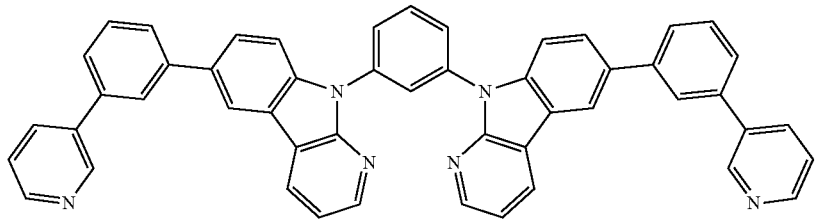
54
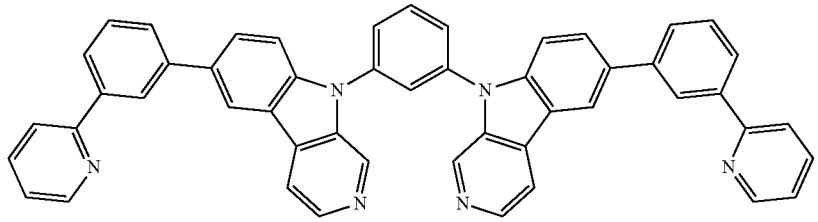
55
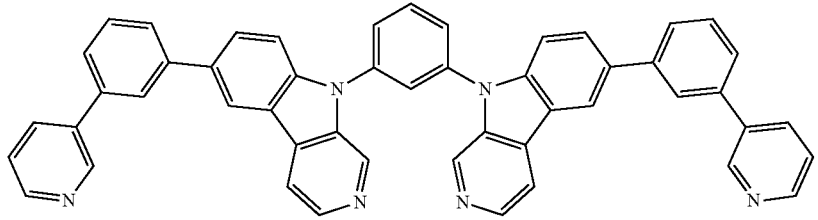
56

57
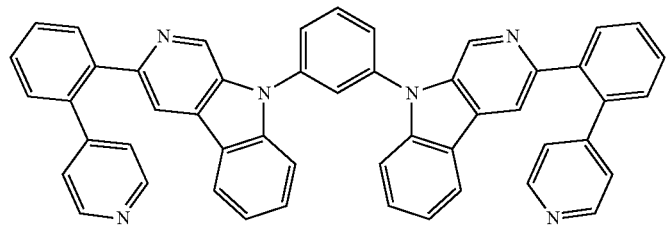
58
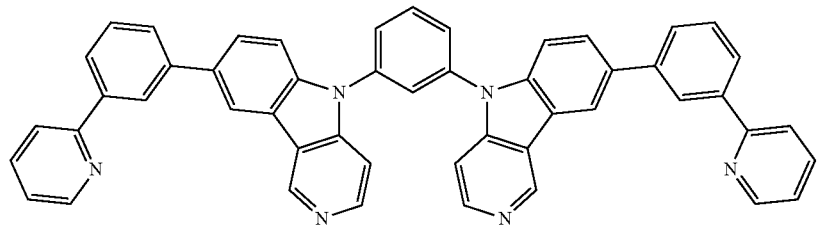
59
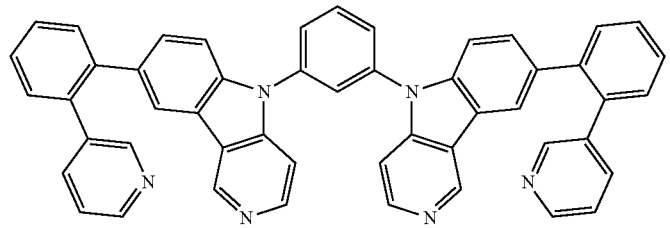
60
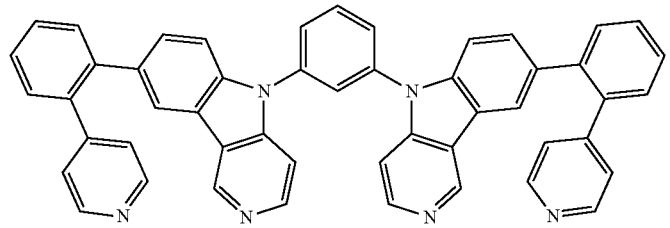
61
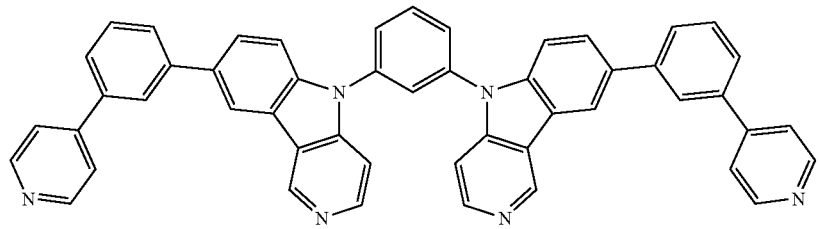
62
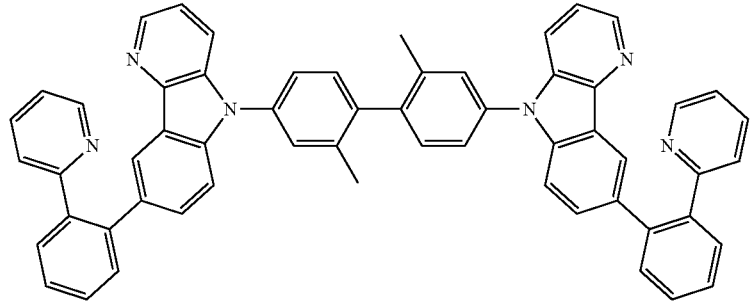

63
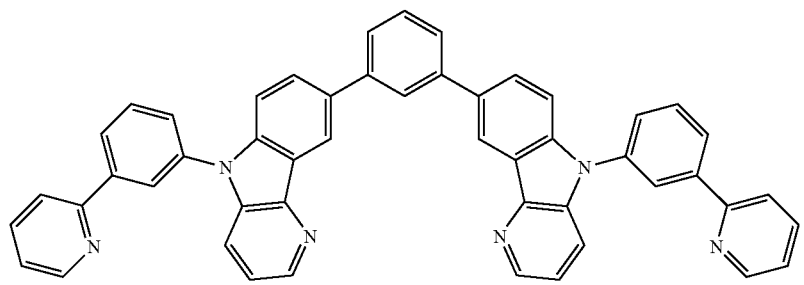
64
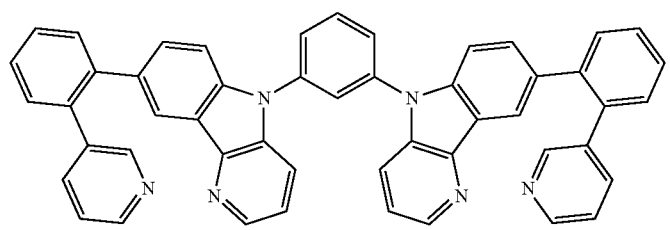
65
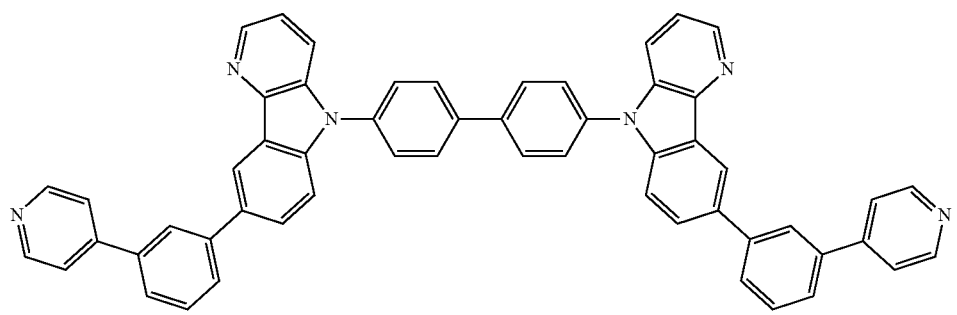
66
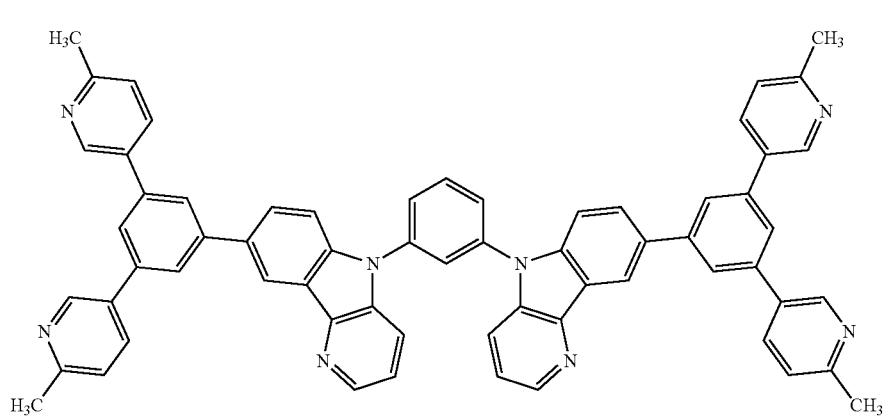

-continued
67
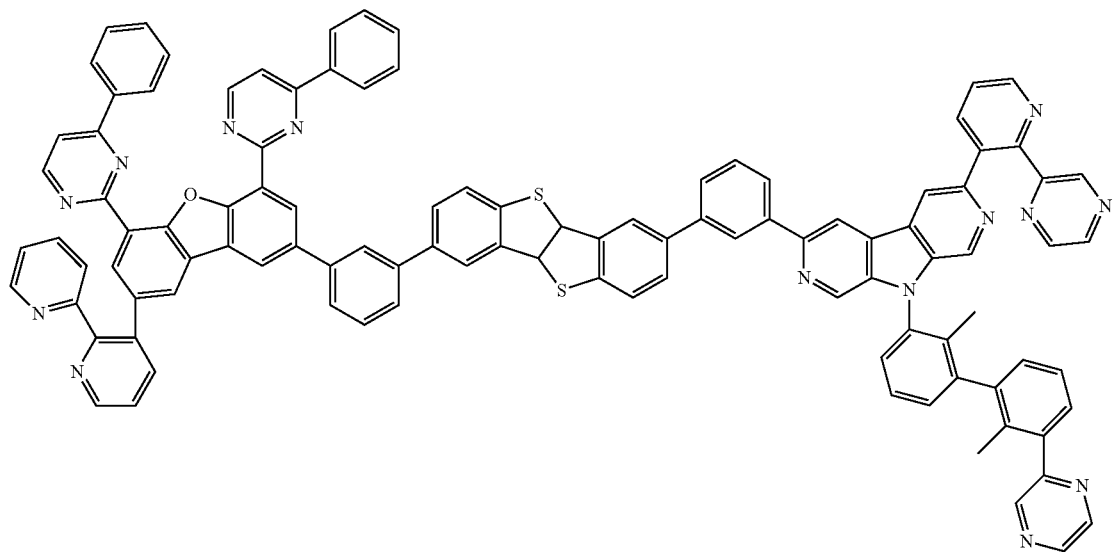
68
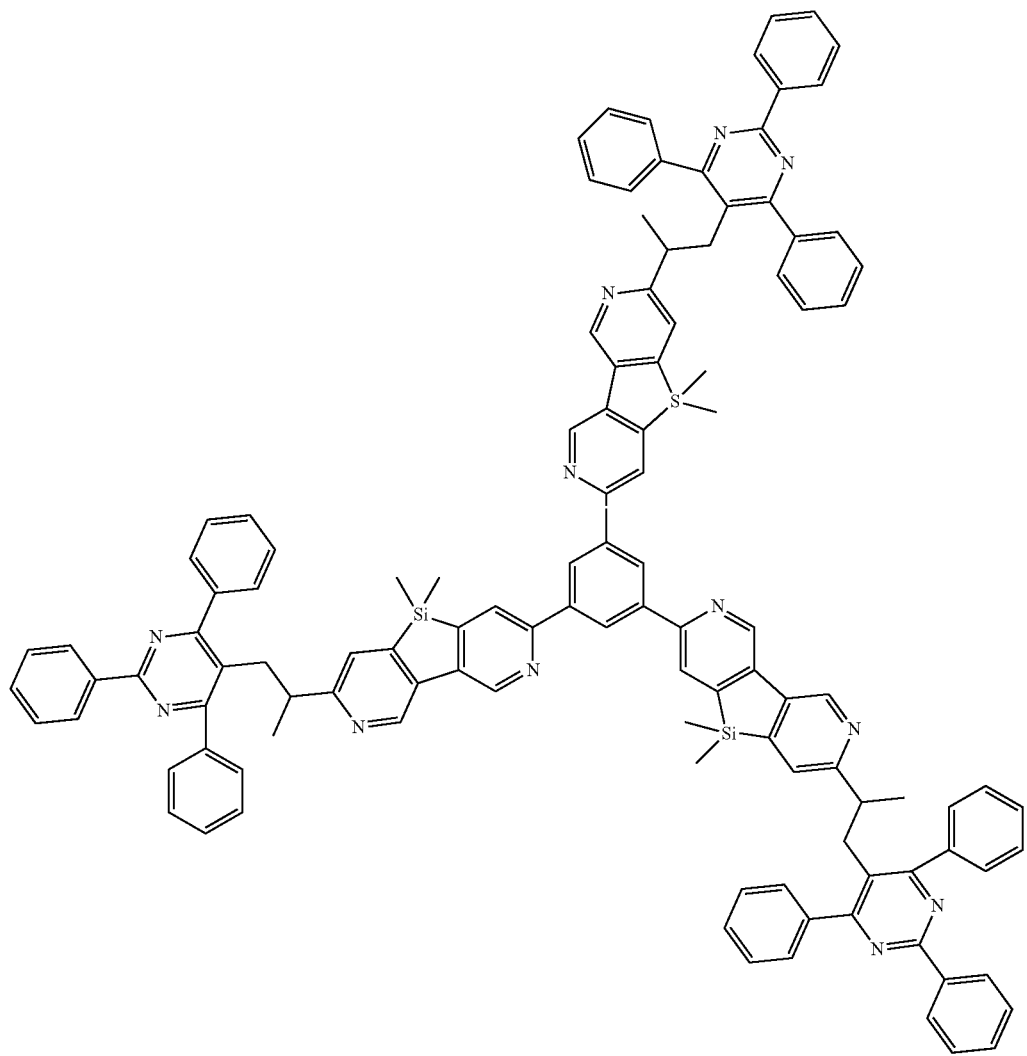

-continued
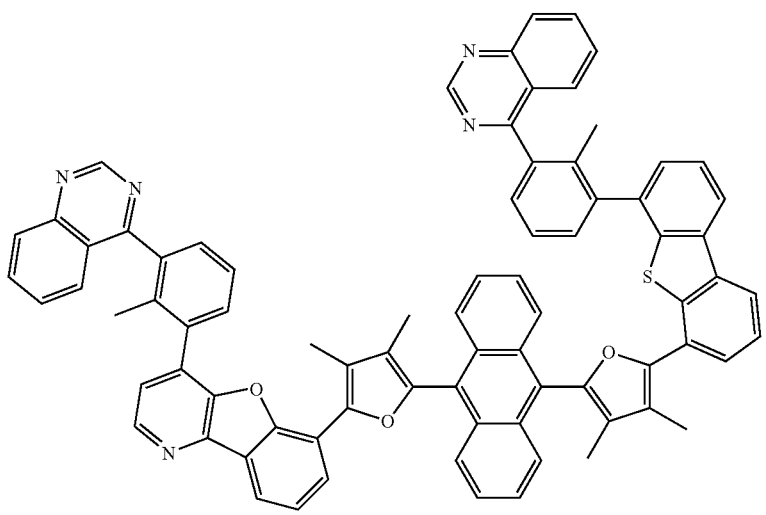
69
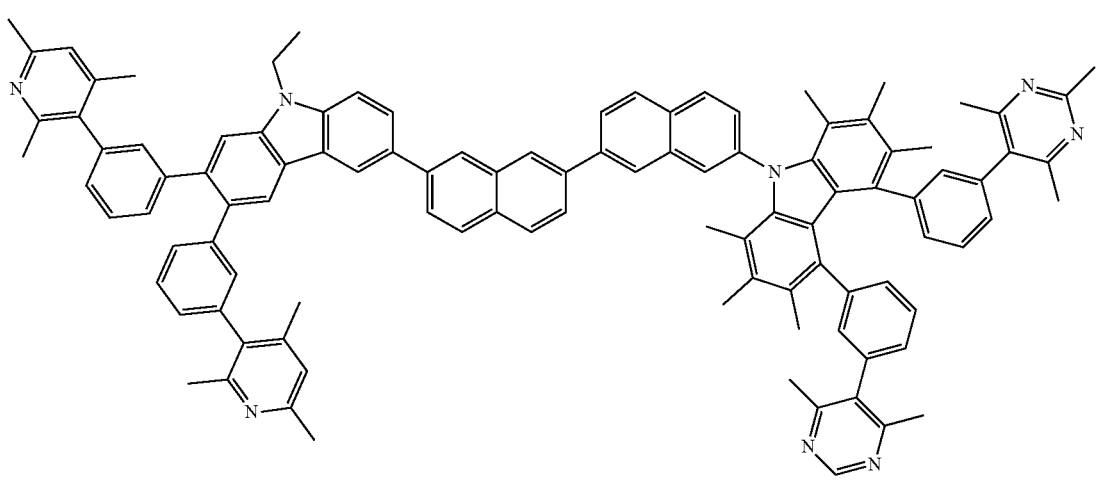
70
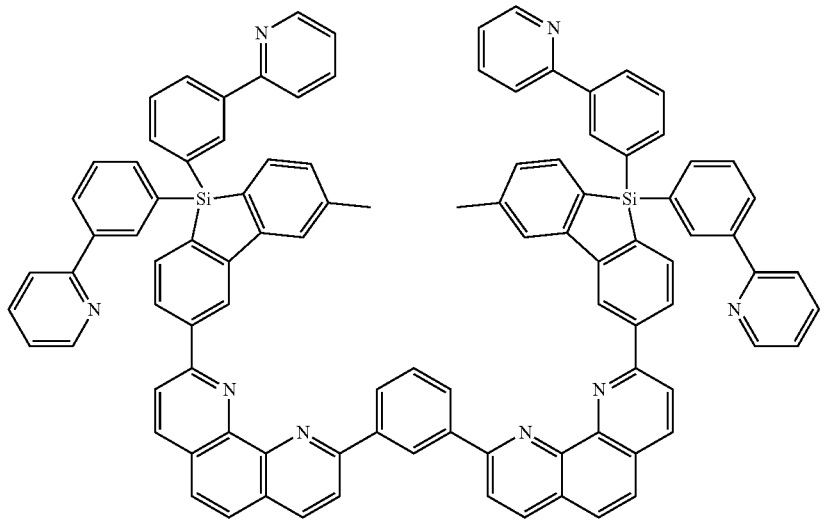
71

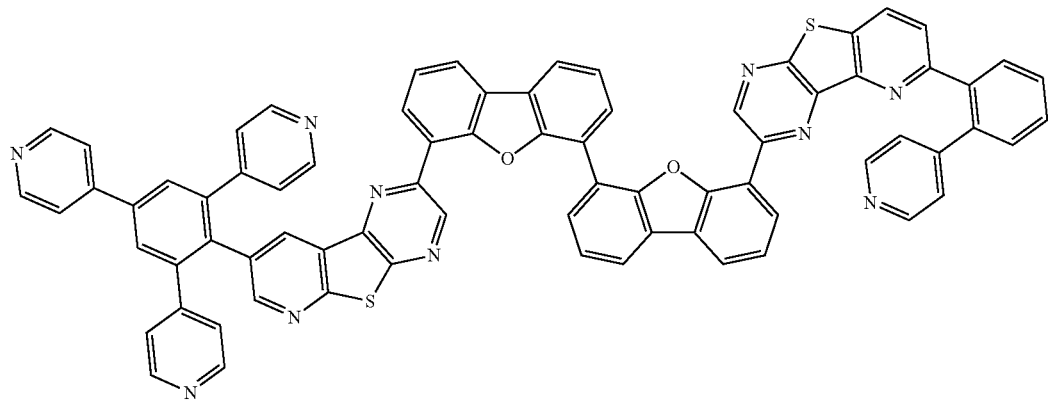
72
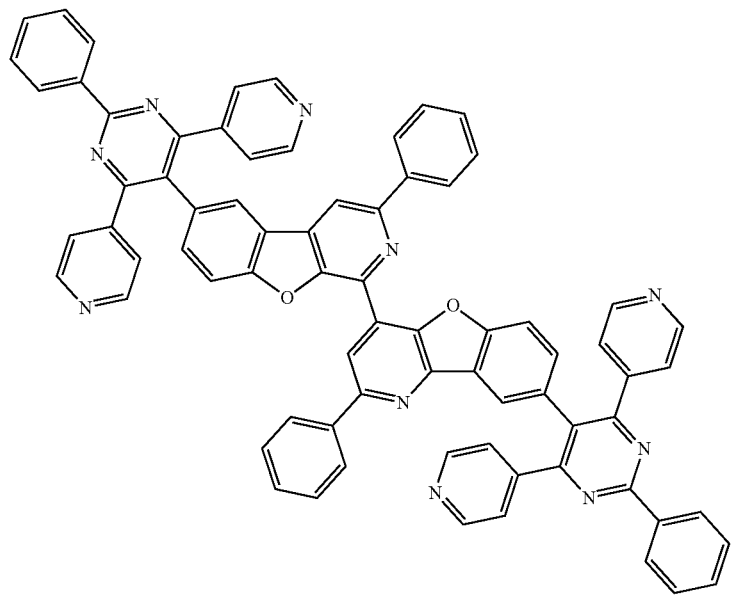
73
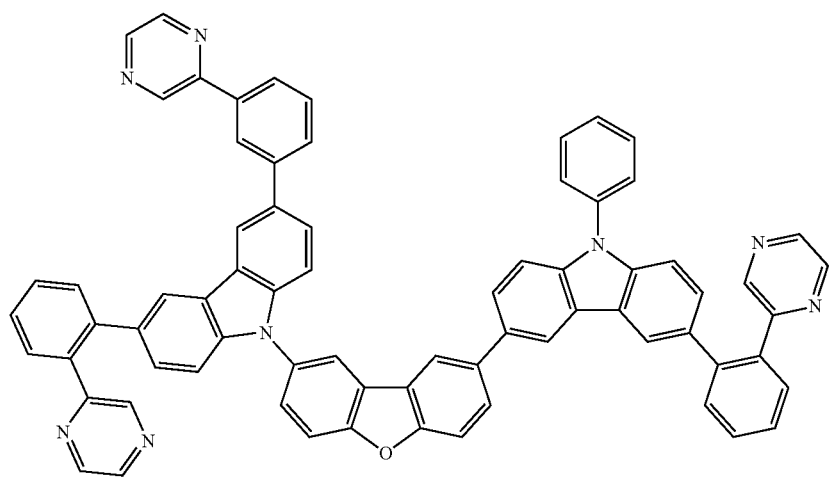
74

75
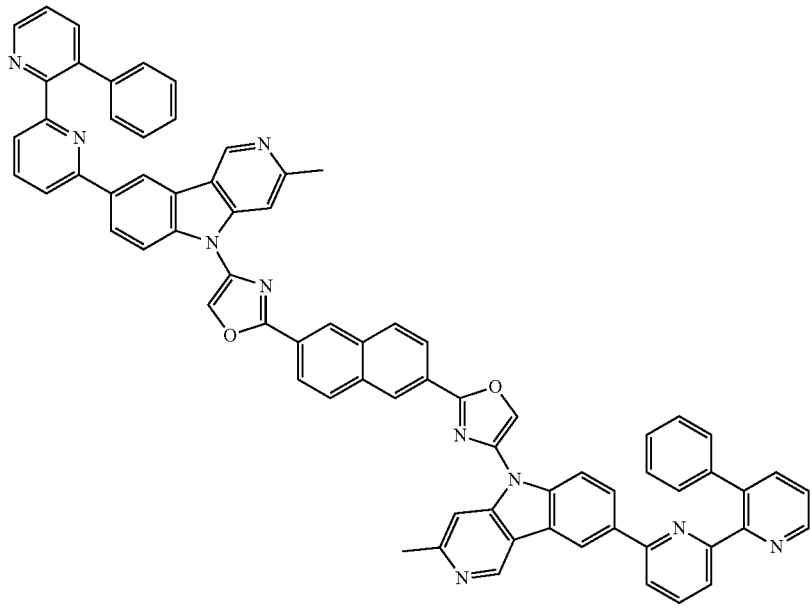
76
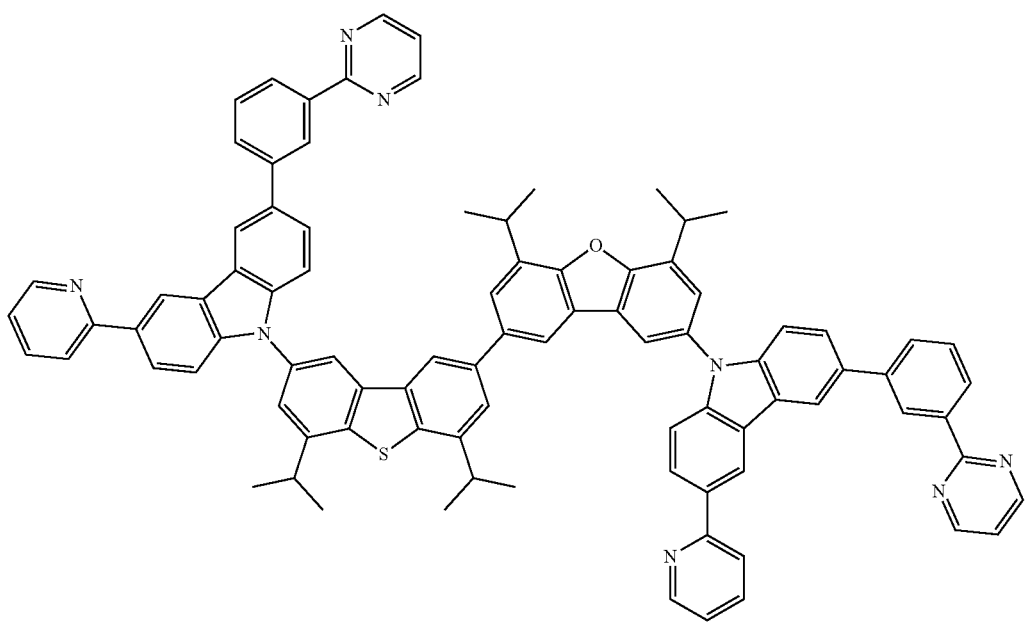
77
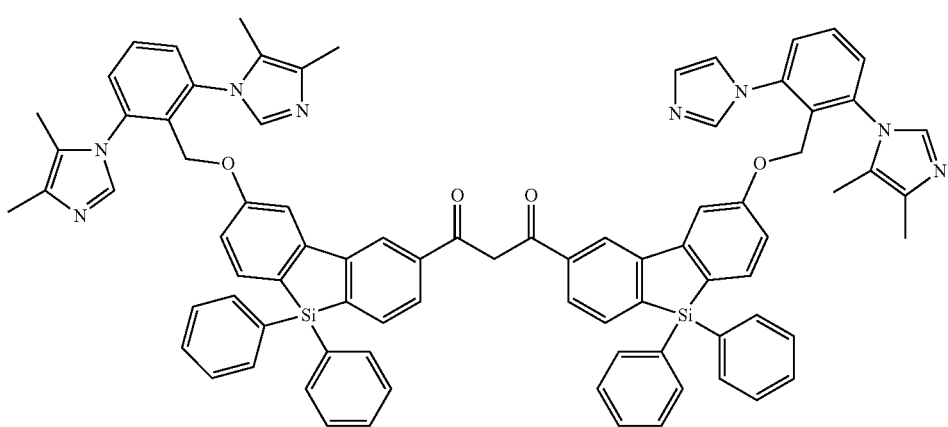

-continued
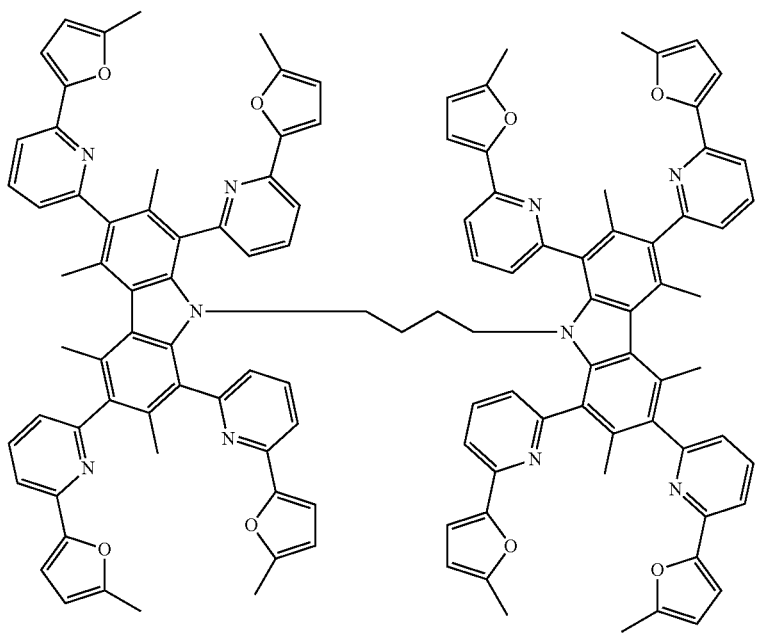
78
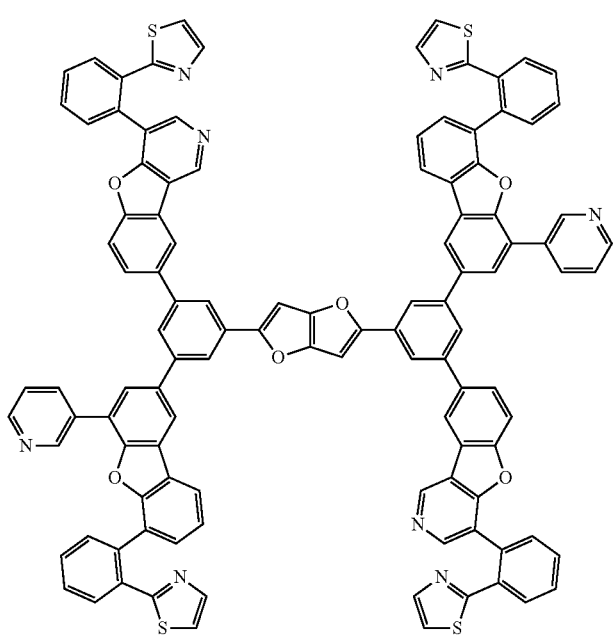
79

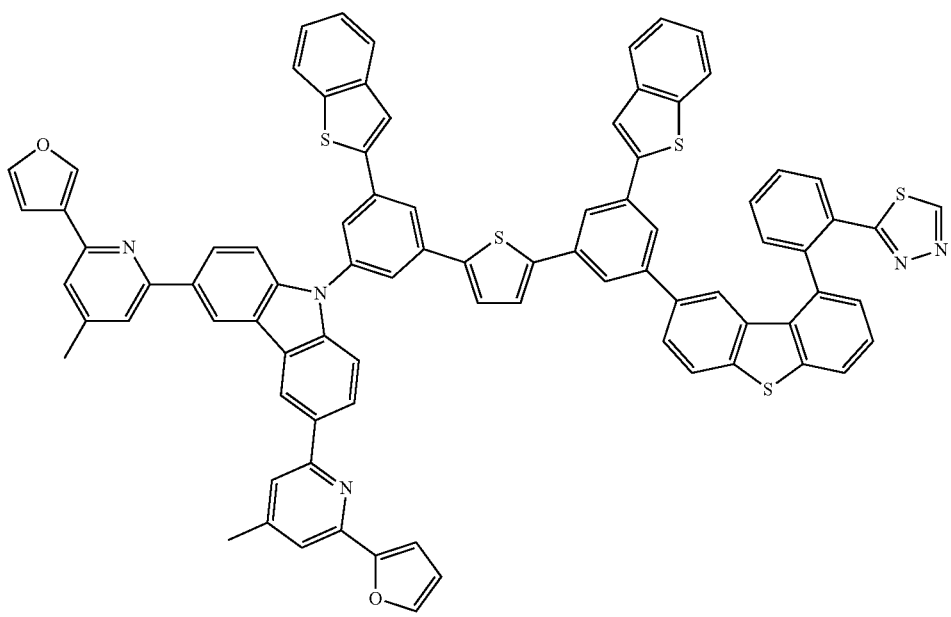
80
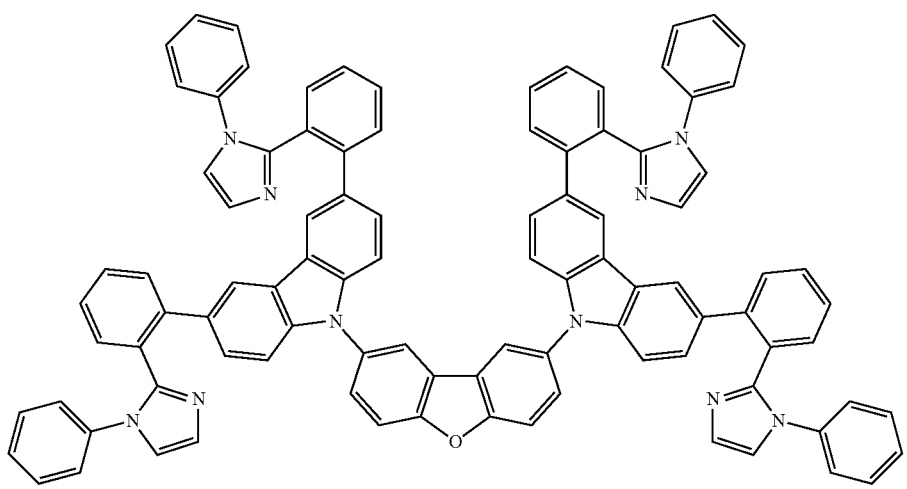
81
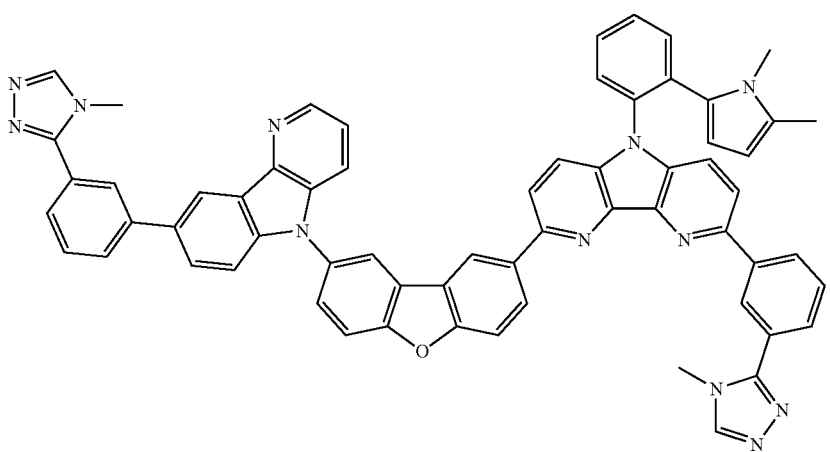
82

83
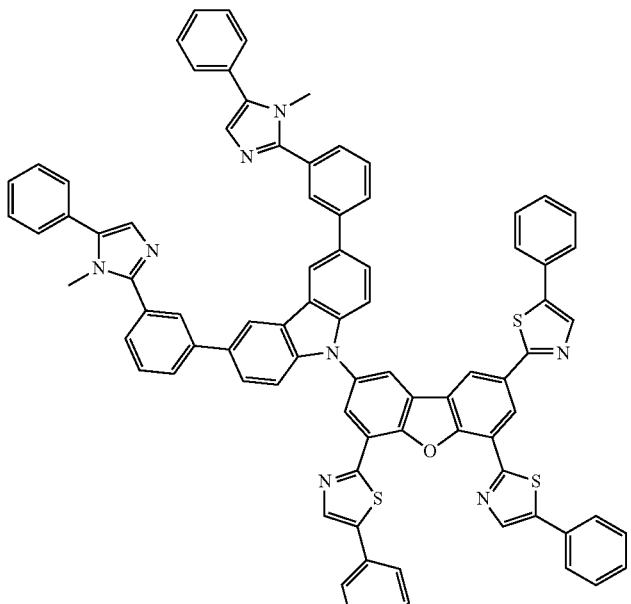
84
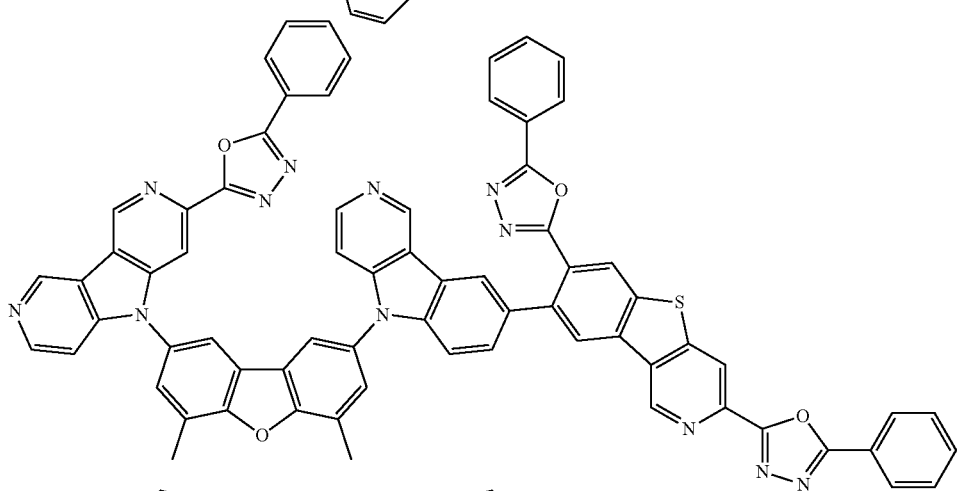
85
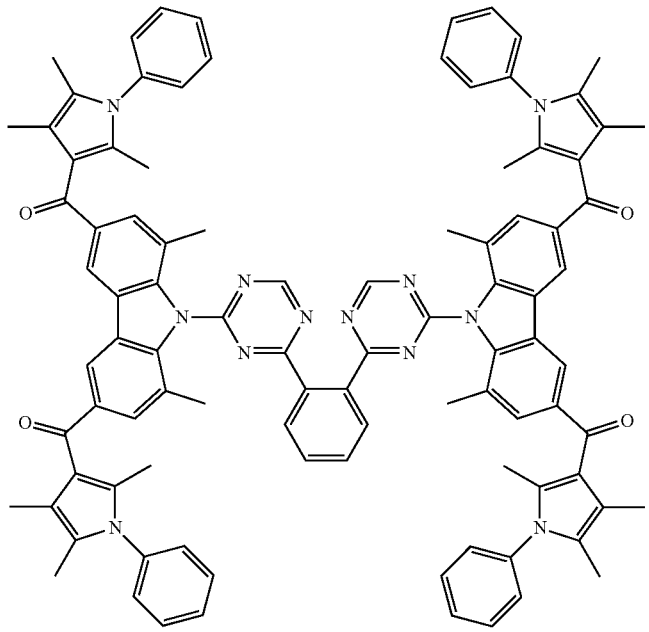

86
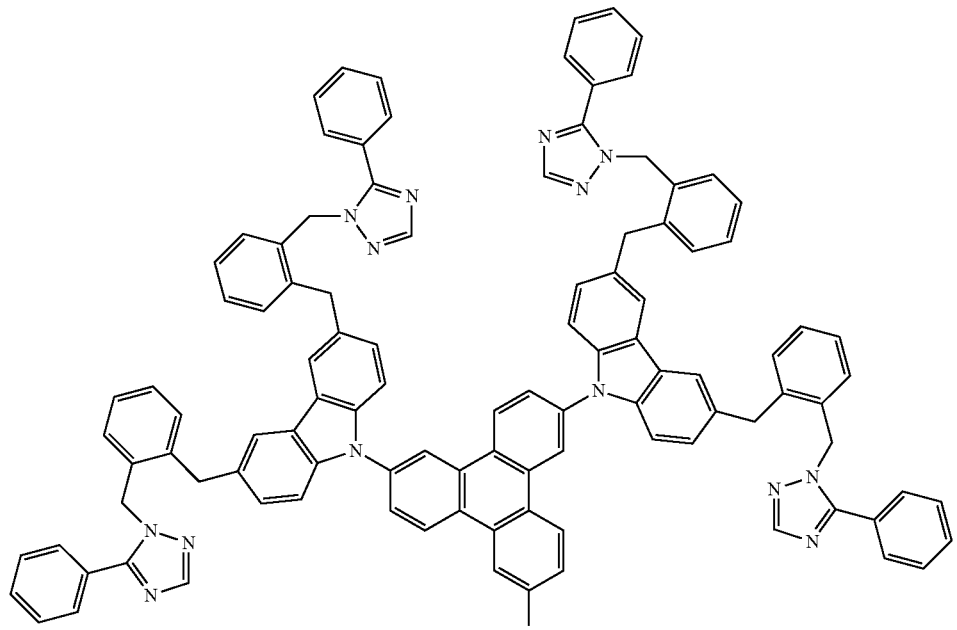
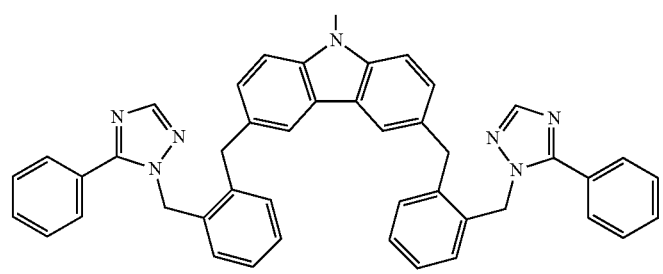
87
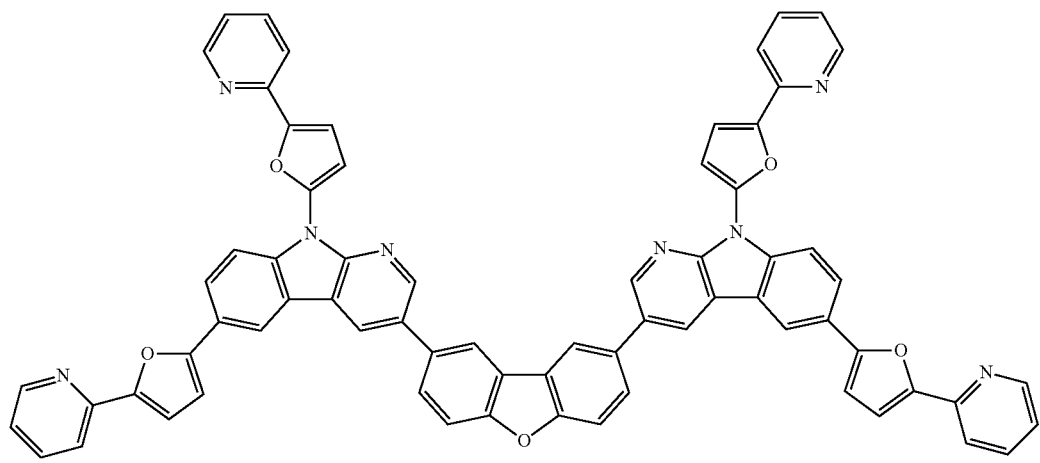

88
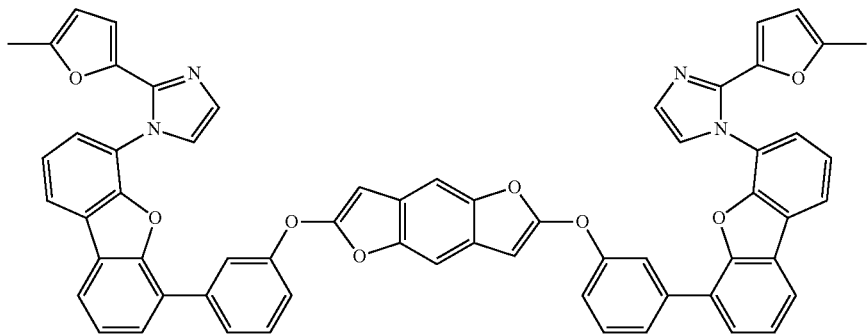
89
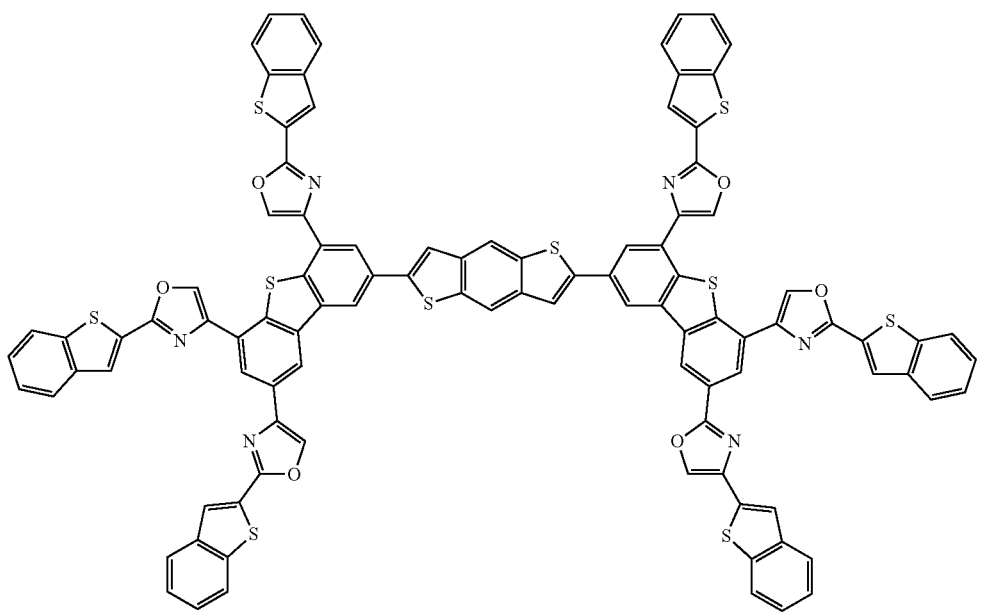
90 91
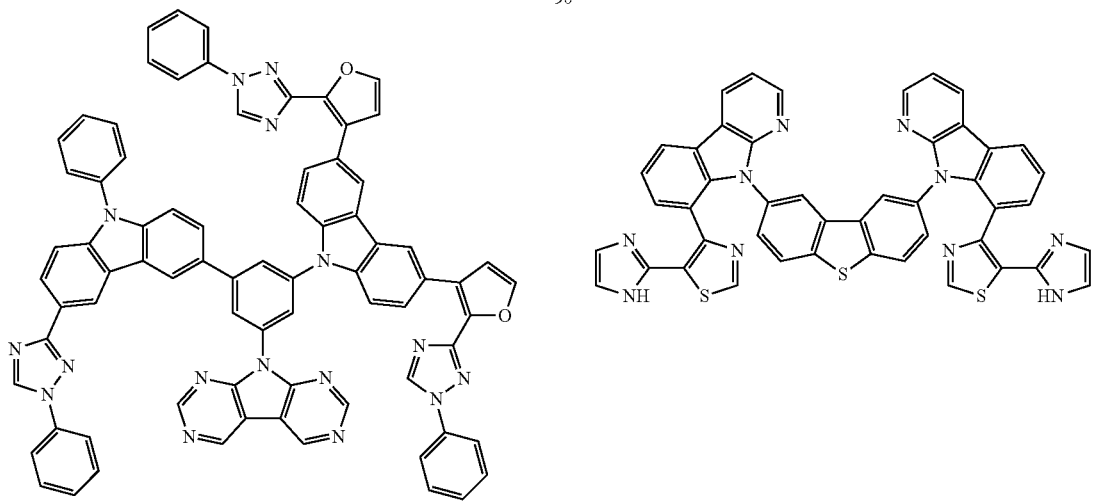

-continued
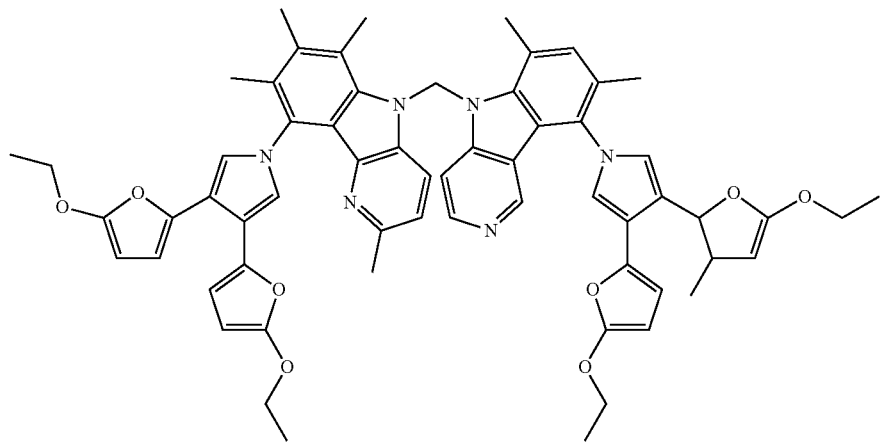
92
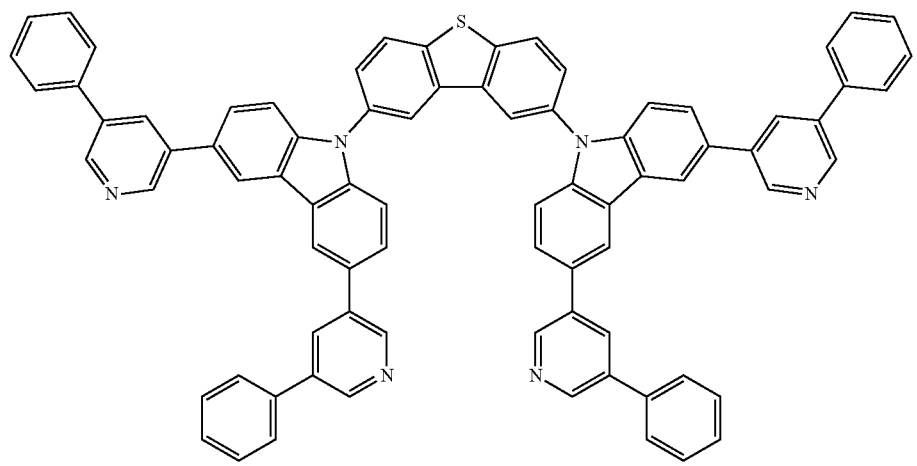
93
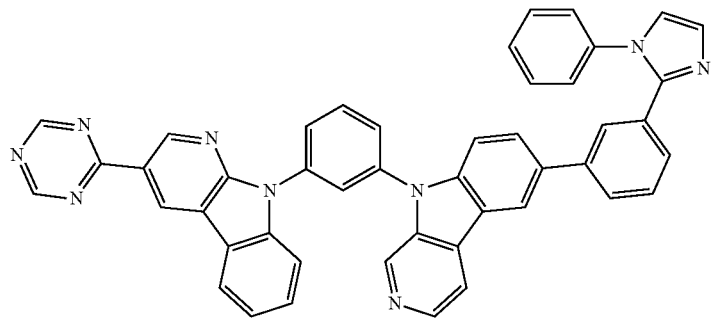
94
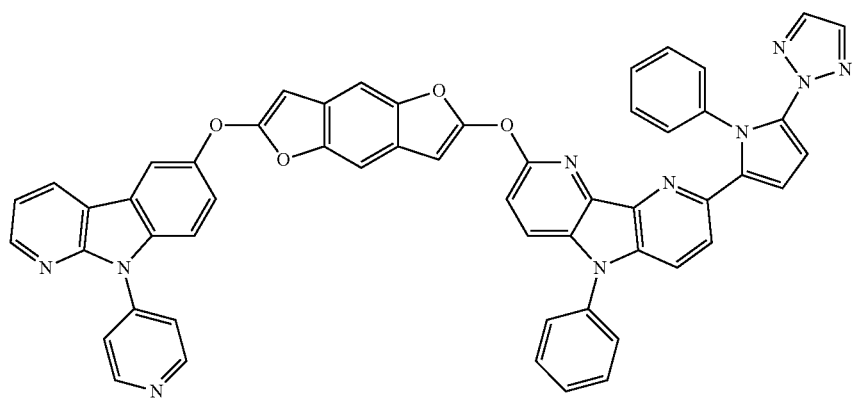
95

-continued
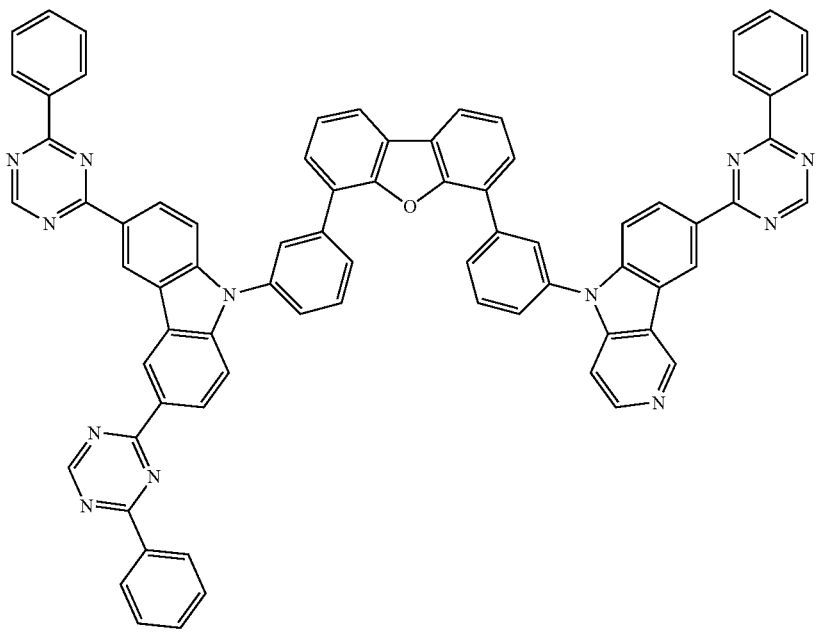
96
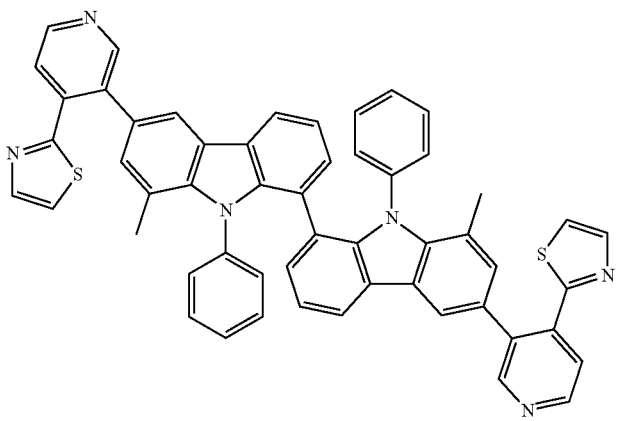
97
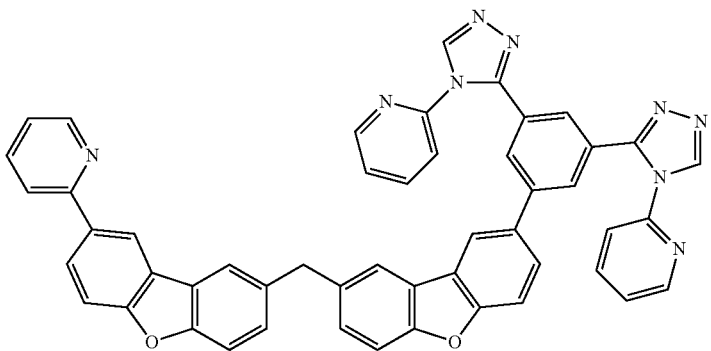
98
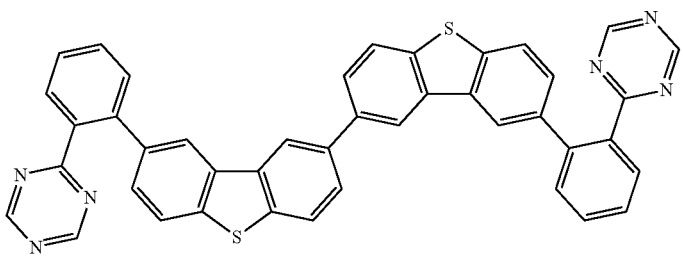
99

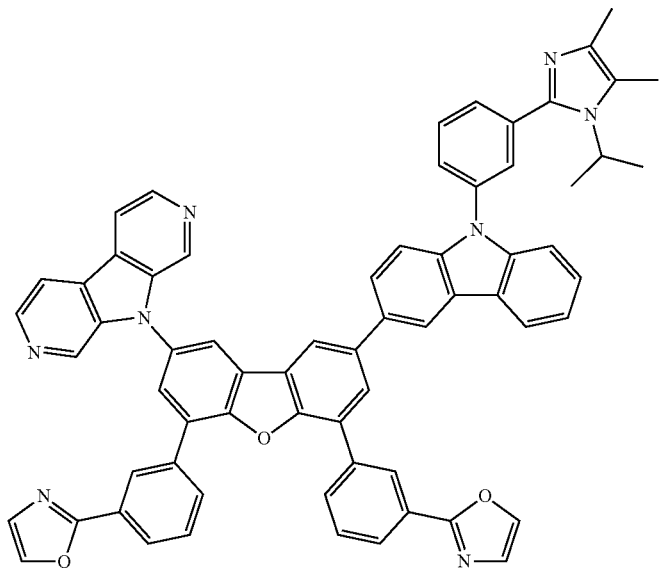
100
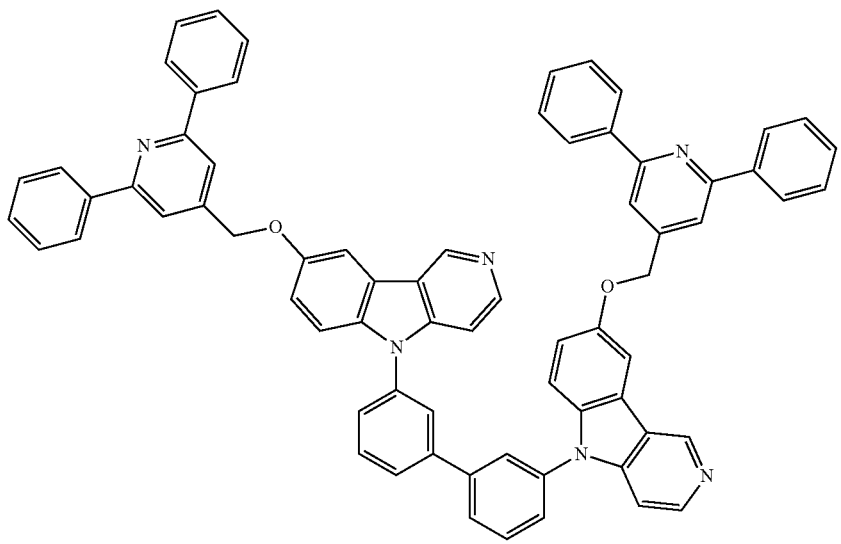
101
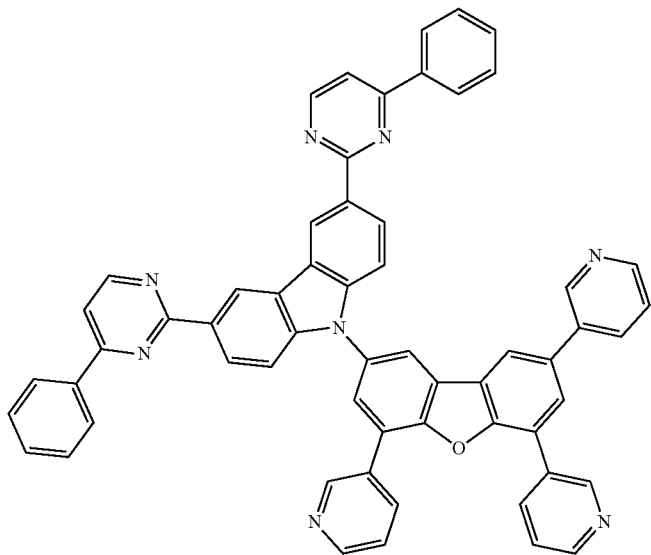
102

-continued
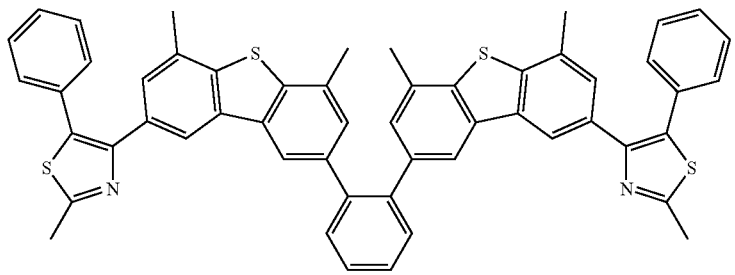
103
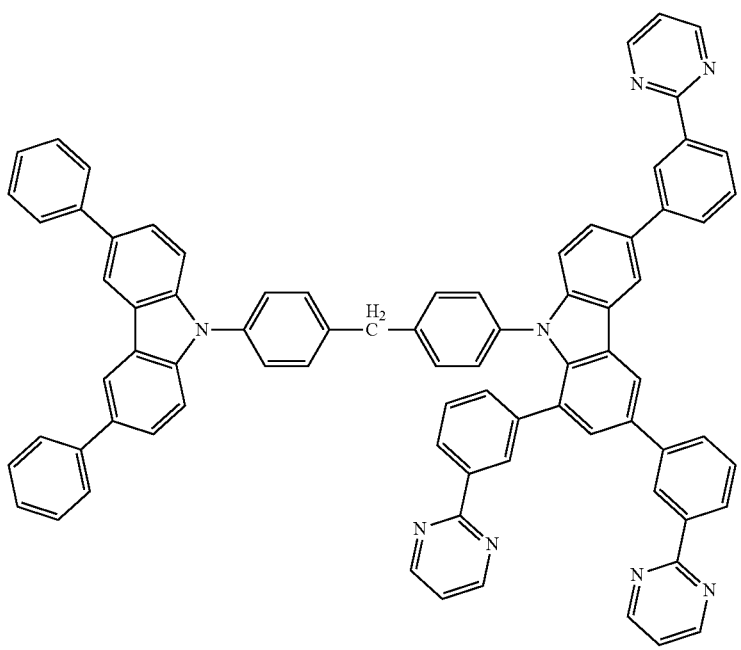
104
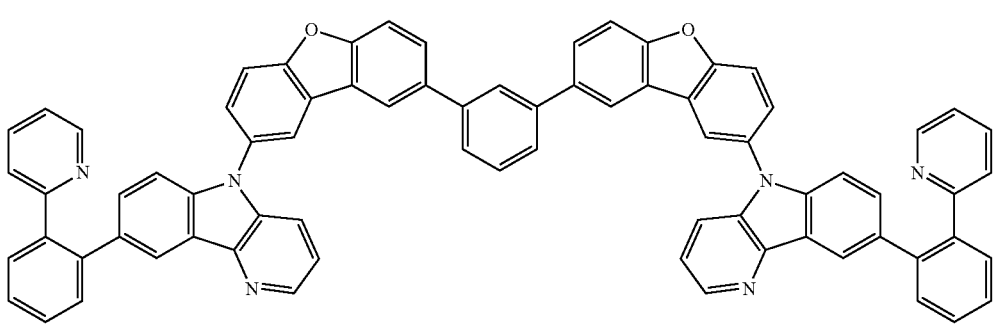
105
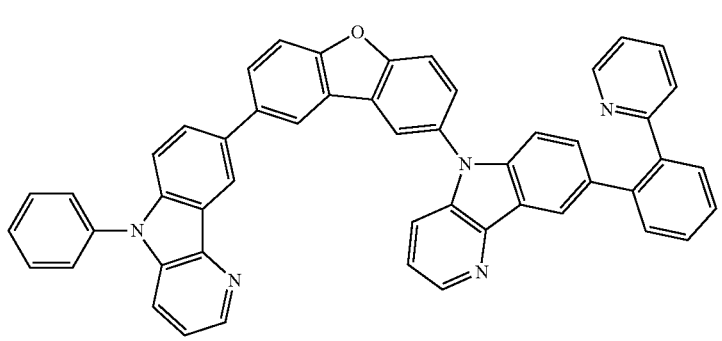
106

-continued
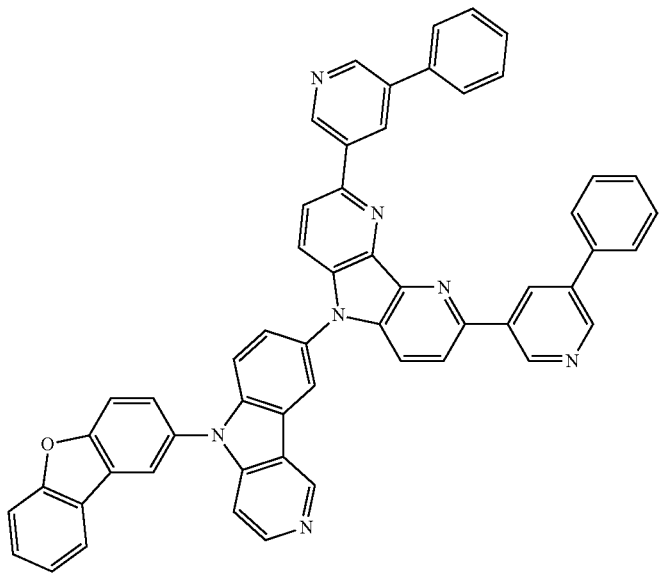
107
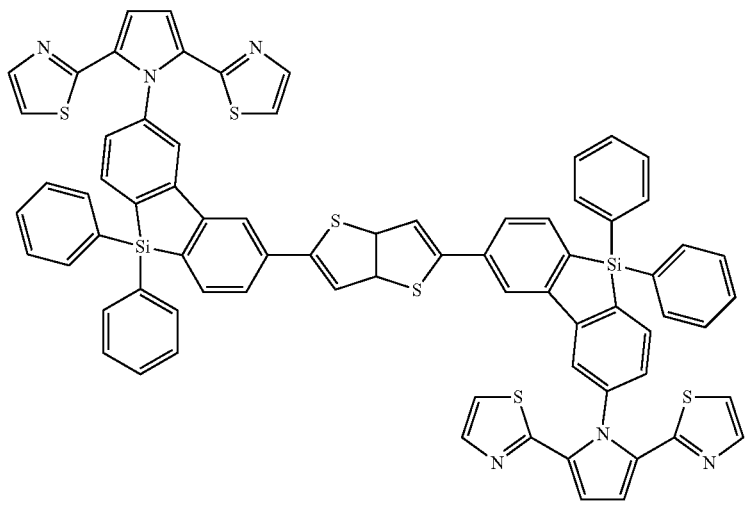
108
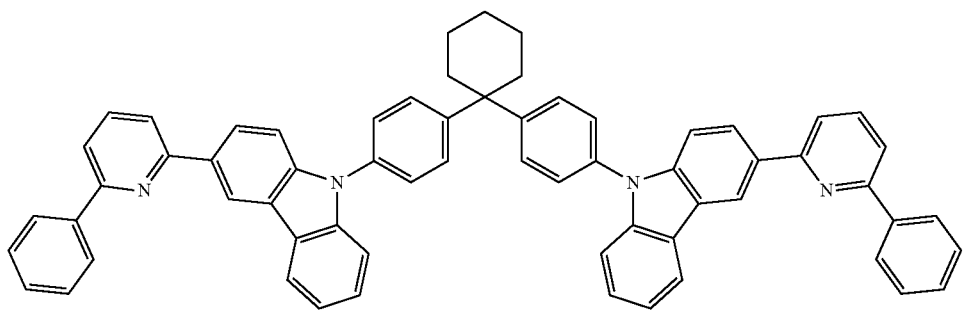
109

-continued
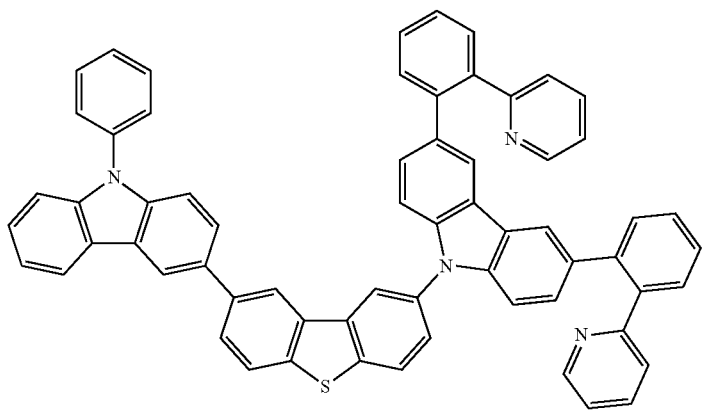
110
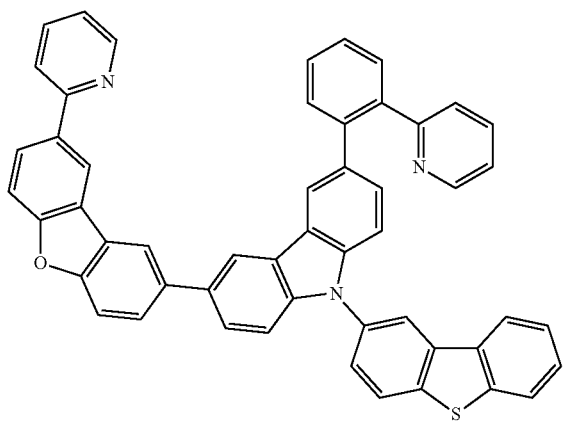
111
40
A most representative preparation method of the compound is described below. However, the preparation method of the present invention is not limited thereto.
Synthetic Example of Compound 5
Synthesis of compound 5
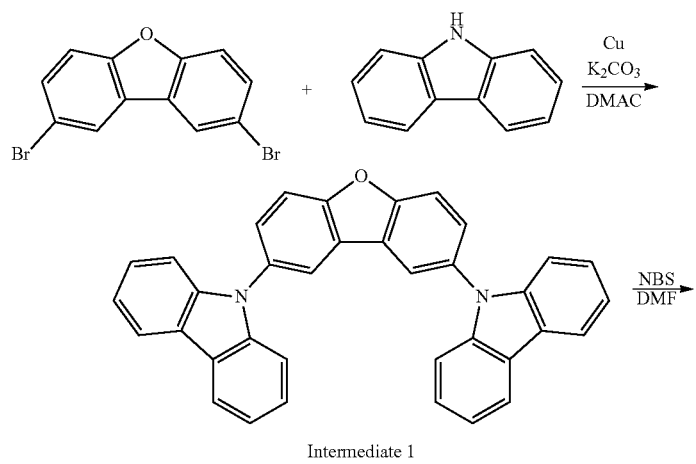
Intermediate 1

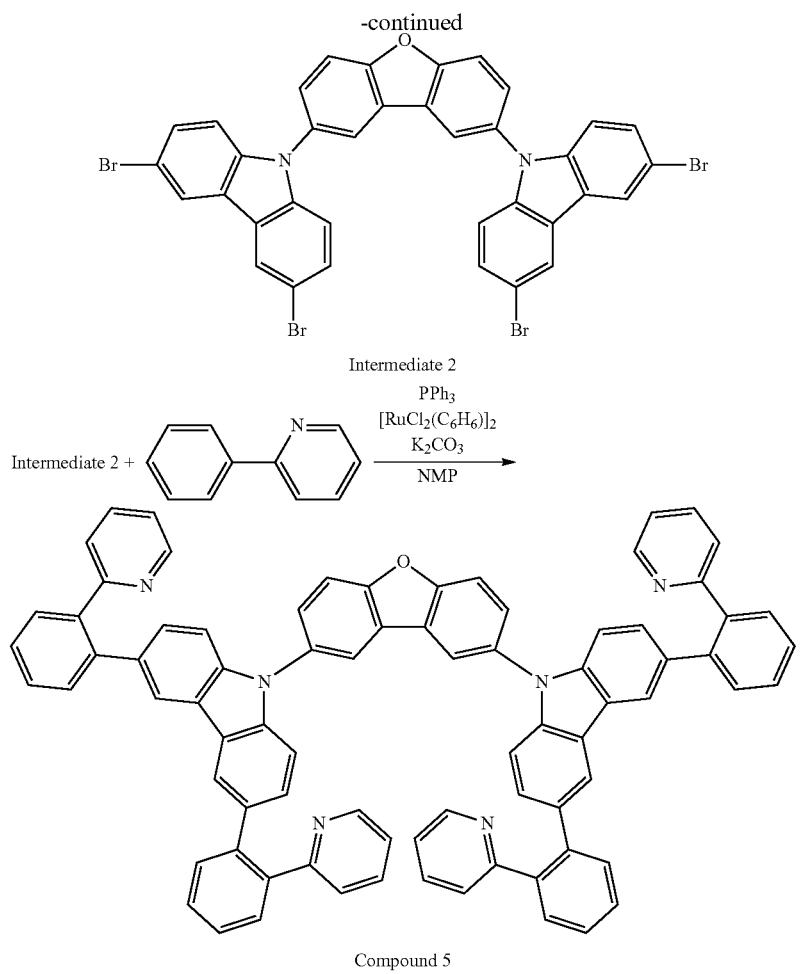

Process 1: (Preparation of Intermediate compound 1)

To 300 ml of DMAc (dimethyl acetamide) were added 1.0 mol of 3,6-dibromodibenzofuran, 2.0 mol of carbazole, 3.0 mol of copper powder and 1.5 mol of potassium carbonate under nitrogen atmosphere and then were stirred for 24 hrs at 130° C. After the reaction mixture was cooled to room temperature, 1 litter of toluene was added to the mixture and washed the mixture 3 times with distilled water. The organic layer was separated and the solvent was distilled away under reduced pressure. The obtained residue was purified with silica gel flush chromatography using an eluent of a mixture of n-heptane and toluene (a mixing ratio of from 4:1 to 3:1) resulting in obtaining Intermediate compound 1. The yield was 85%.

Process 2: (Preparation of Intermediate Compound 2)

To 100 ml of DMF was dissolved 0.5 mol of Intermediate compound 1 at room temperature under atmospheric pressure, then 2.0 mol of NBS was added to the mixture. The mixture was stirred for one night at room temperature. The obtained precipitation was filtered and washed with methanol to obtain Intermediate compound 2. The yield was 92.

Process 3: (Preparation of Compound 5)

To 3 litters of NMP (N-methyl-2-pyrrolidone) were added 0.25 mol of Intermediate compound 2, 1.0 mol of 2-phenylpyridine, 0.05 mol of ruthenium complex [($\eta_6$-$C_6H_6$)$RuCl_2$]$_2$, 0.2 mol of triphenylphosphine and 12 mol of potassium carbonate under nitrogen atmosphere, and stirred for one night at 140° C.

After the reaction mixture was cooled to room temperature, 5 liters of dichloromethane was added, then the mixture was filtered. The solvent in the filtrate was distilled away under reduced pressure (800 Pa, 80° C.). The residue mixed with N-methyl-2-pyrrolidone was purified with silica gel flush chromatography using an eluent of a mixture of $CH_2Cl_2$ and $Et_3N$ (a mixing ratio of from 20:1 to 10:1).

All of the fractions were collected and the solvent was distilled away under reduced pressure to obtain a residue. The obtained residue was again dissolved into dichloromethane and was washed 3 times with water. The organic layer was dried with magnesium sulfate and the solvent was distilled away under reduced pressure to produce Compound 5 in a yield of 68%. Next, representative layer constituents of organic EL elements of the present invention will now be detailed successively.

<Constituting Layers of Organic EL Element>

Specific examples of a preferable layer constitution of an organic EL element of the present invention are shown below, however, the present invention is not limited thereto.

(i) anode/positive hole transport layer/light emitting layer/ positive hole inhibition layer/electron transport layer/ cathode (ii) anode/electron inhibition layer/light emitting layer/ positive hole inhibition layer/electron transport layer/ cathode (iii) anode/positive hole transport layer/electron inhibition layer/light emitting layer/positive hole inhibition layer/ electron transport layer/cathode (iv) anode/positive hole transport layer/light emitting layer/positive hole inhibition layer/electron transport layer/cathode buffer layer/cathode (v) anode/positive hole transport layer/electron inhibition layer/light emitting layer/positive hole inhibition layer/electron transport layer/cathode buffer layer/cathode (vi) anode/anode buffer layer/positive hole transport layer/electron inhibition layer/light emitting layer/positive hole inhibition layer/electron transport layer/cathode (vii) anode/anode buffer layer/positive hole transport layer/electron inhibition layer/light emitting layer/positive hole inhibition layer/electron transport layer/cathode buffer layer/cathode <Electron Transport Layer>

An electron transport layer is comprised of a material having a function to transfer an electron, and an electron injection layer and a positive hole inhibition layer are included in an electron transport layer in a broad meaning. A single layer or plural layers of an electron transport layer may be provided.

The compound represented by any one of Formula (1), Formula (2) and Formula (3) is used in at least one of the electron transport layers of the present invention.

Heretofore, when an electron transport layer is composed of single layer and a plurality of layers, electron transport materials (also functioning as a positive hole inhibition material) employed in the electron transport layer adjacent to the cathode side with respect to the light emitting layer, electrons ejected from the cathode may be transported to the light emitting layer. As such materials, any of the conventional compounds may be selected and employed. Examples of these compounds include such as a nitro-substituted fluorene derivative, a diphenylquinone derivative, a thiopyradineoxide derivative, carbodiimide, a fluorenylidenemethane derivative, anthraquinonedimethane, an anthraquinone derivative, an anthrone derivative and an oxadiazole derivative.

Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transport material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transport material.

Further, metal-free or metal phthalocyanine, or those the terminal of which is substituted by an alkyl group and a sulfonic acid group, can be preferably utilized as an electron transport material. Further, distyrylpyrazine derivative, which has been exemplified as a material of an light emitting layer, can be also utilized as an electron transport material, and, similarly to the case of a positive hole injection layer and a positive hole transfer layer, an inorganic semiconductor such as an n-type-Si and an n-type-SiC can be also utilized as an electron transport material.

The electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, it is generally 5 nm-5 $\mu$m, and preferably 5 nm-200 nm. This electron transport layer may have a single layer structure comprised of one or not less than two types of the above described materials.

Further, it is possible to employ an electron transport layer doped with impurities, which exhibits high n property. Examples thereof include those, described in JP-A Nos. 4-297076, 10-270172, 2000-196140, 2001-102175, as well as J. Appl. Phys., 95, 5773 (2004).

The present invention is preferable since by employing an electron transport layer of such a high n property electron transport layer, it is possible to preparer an element of further lowered electric power consumption.

<Light Emitting Layer>

The light emitting layer of the present invention is a layer, which emits light via recombination of electrons and positive holes injected from an electrode or a layer such as an electron transport layer or a positive hole transport layer. The emission portion may be present either within the light emitting layer or at the interface between the light emitting layer and an adjacent layer thereof.

The total thickness of the light emitting layer is not particularly limited. However, in view of the layer homogeneity, the minimization of application of unnecessary high voltage during light emission, and the stability enhancement of the emitted light color against the drive electric current, the layer thickness is regulated preferably in the range of 2 nm-5 $\mu$m, more preferably in the range of 2 nm-200 nm, but most preferably in the range of 10-20 nm.

With regard to preparation of the light emitting layer, light emitting dopants and host compounds, described below, may be subjected to film formation via a conventional thin filming method such as a vacuum deposition method, a spin coating method, a casting method, an LB method, or an ink-jet method.

It is preferable that the light emitting layer of the organic EL element of the present invention incorporates host compounds and at least one kind of light emitting dopants (also referred to as phosphorescence dopants or phosphorescence emitting dopants) and fluorescence dopants.

(Host Compounds (Also Referred to as Light Emitting Hosts))

Host compounds employed in the present invention will now be described.

"Host compounds", as described in the present invention, are defined as compounds exhibiting a phosphorescent quantum yield of the phosphorescence emission of less than 0.1 at room temperature (25° C.), more preferably less than 0.01. Further, of compounds incorporated in the light emitting layer, it is preferable that the weight ratio in the aforesaid layer is at least 20%.

An emission host compound of the present invention may be used with plural known host compounds. It is possible to control the transfer of charges by making use of a plurality of host compounds, which results in high efficiency of an organic EL element. In addition, it is possible to mix a different emission lights by making use of a plurality of emitting dopants that will be described later. Any required emission color can be obtained thereby. It may be possible to use a conventionally known light emitting dopant that will be described later.

Further, it may be possible to use a conventionally known light emitting dopant that will be described later. An emission host of the present invention may be either a low molecular weight compound or a polymer compound having a repeating unit, in addition to a low molecular weight compound provided with a polymerizing group such as a vinyl group and an epoxy group (an evaporation polymerizing emission host).

A known emission host which may be jointly used is preferably a compound having a positive hole transporting ability and an electron transporting ability, as well as preventing elongation of an emission wavelength and having a high Tg (a glass transition temperature).

Specific examples of an emission host which may be jointly used in the present invention are shown below, however, the present invention is not limited to them.

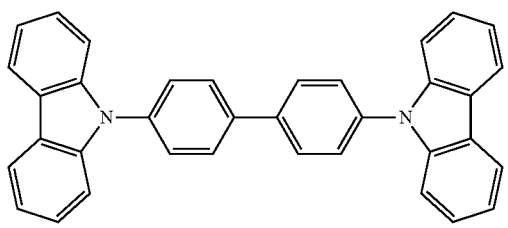
H1

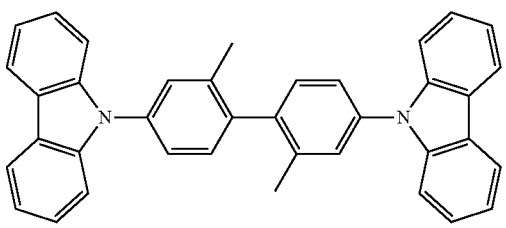
H2

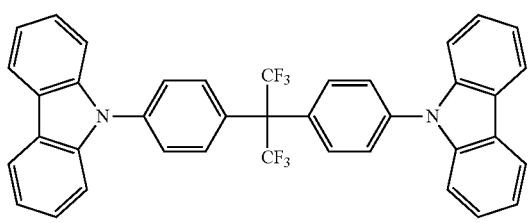
H3

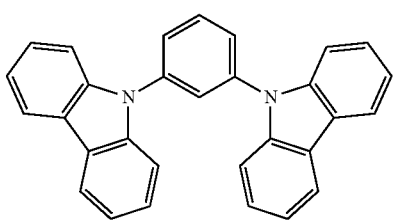
H4

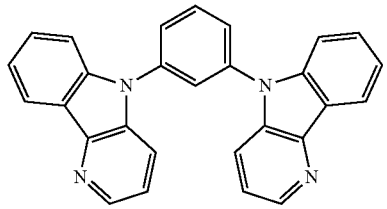
H5

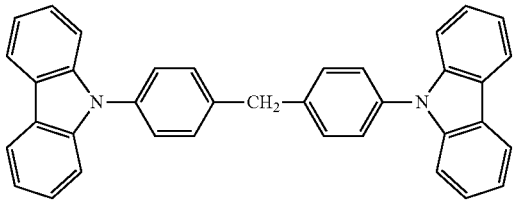
H6

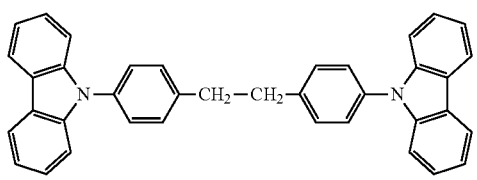
H7

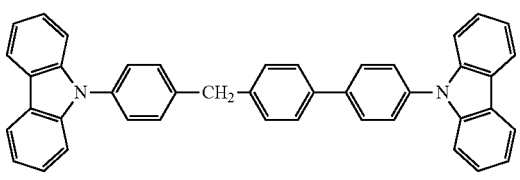
H8

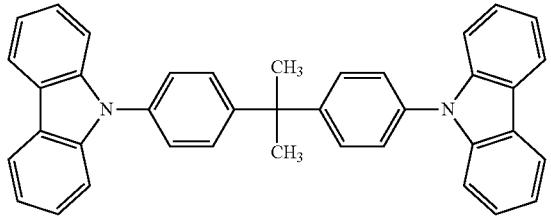
H9

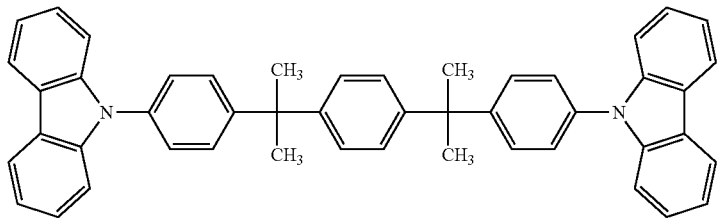
H10

-continued
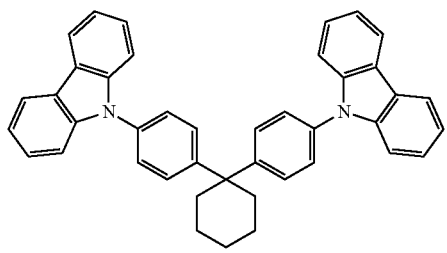
H11
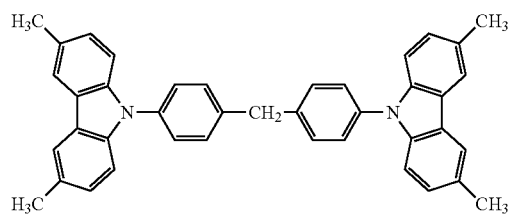
H12
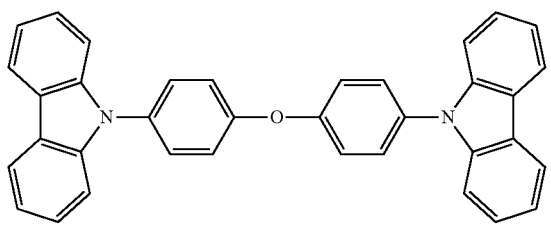
H13
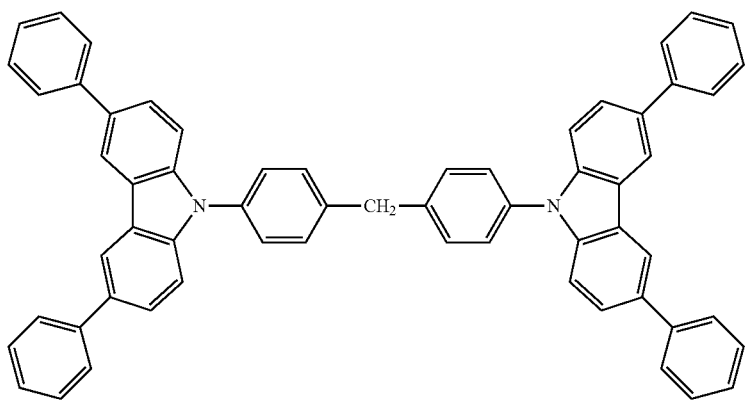
H14
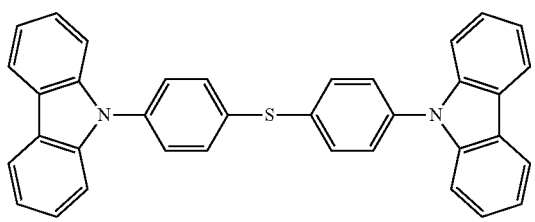
H15
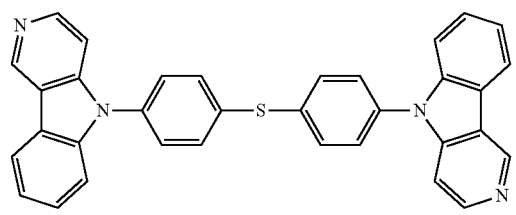
H16
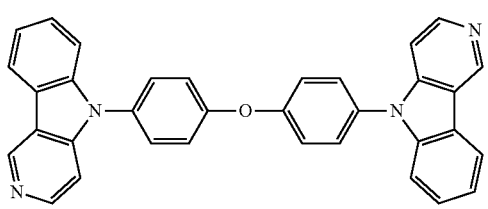
H17
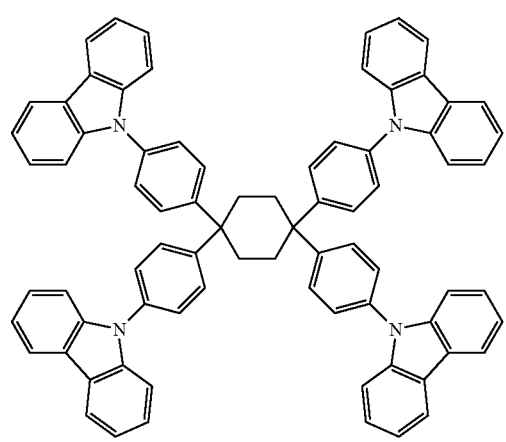
H18

-continued
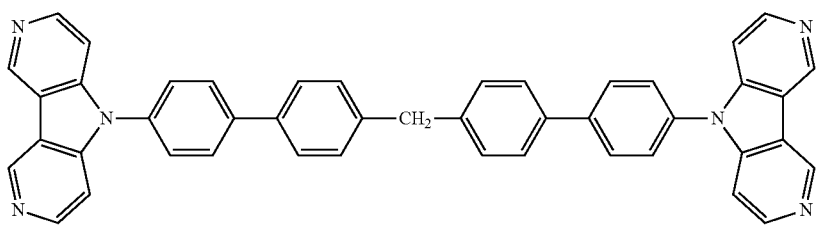
H19
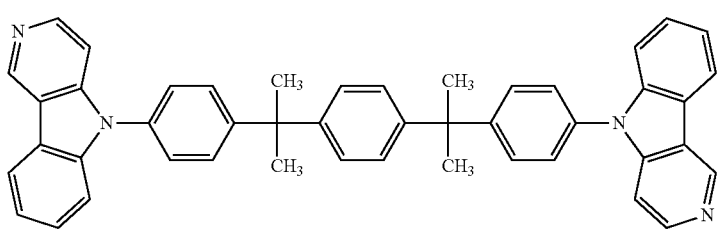
H20
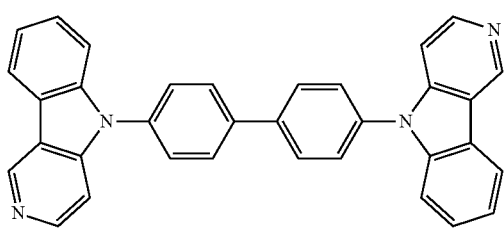
H21
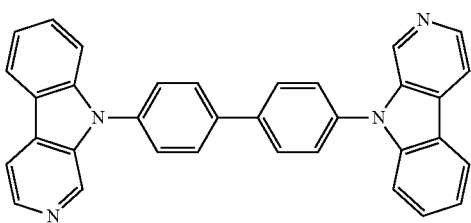
H22
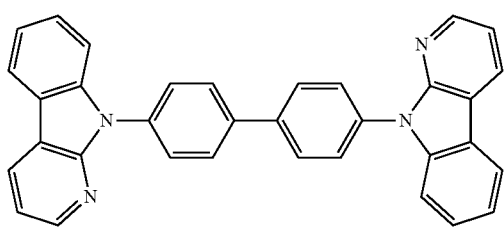
H23
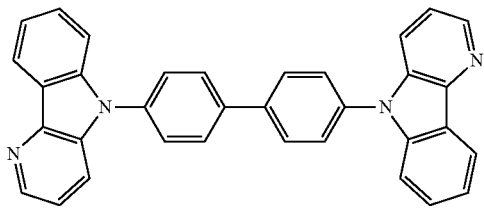
H24
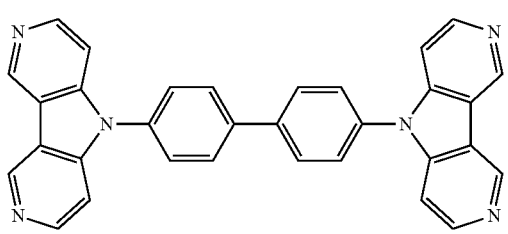
H25
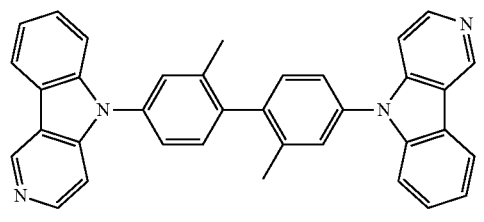
H26
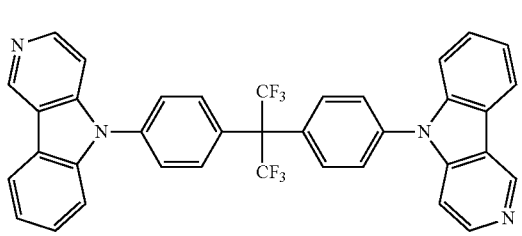
H27
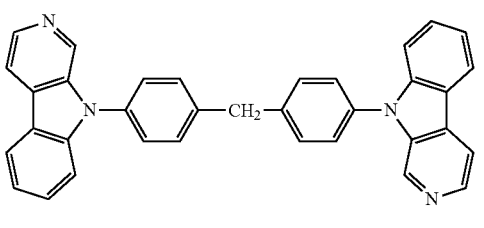
H28

-continued
H29
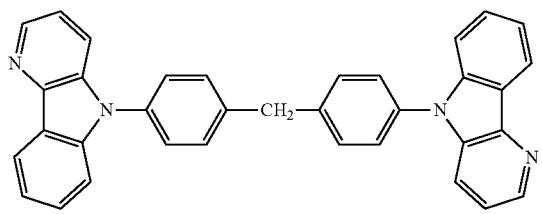
H30
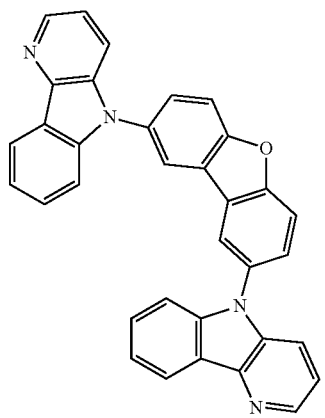
H31
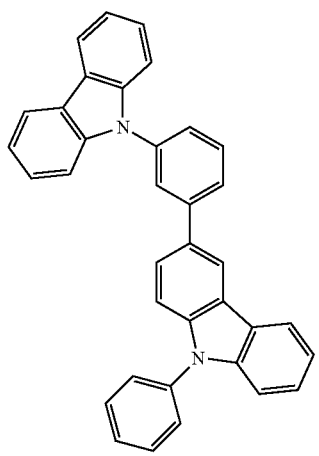
H32
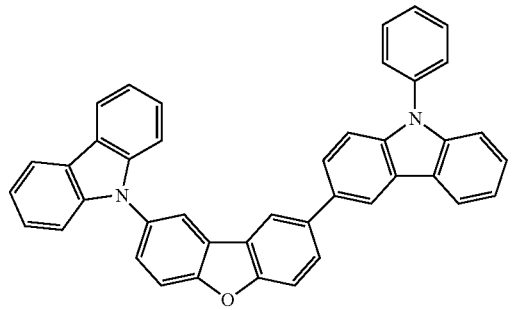
H33
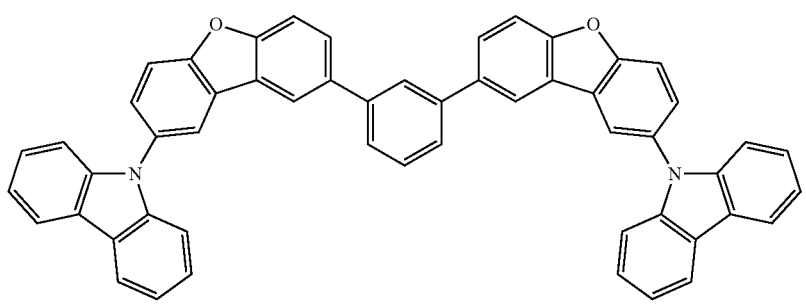
H34
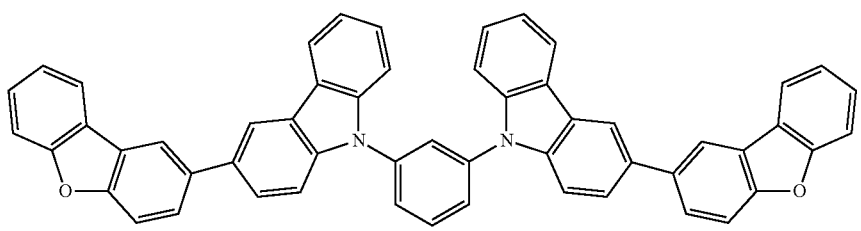

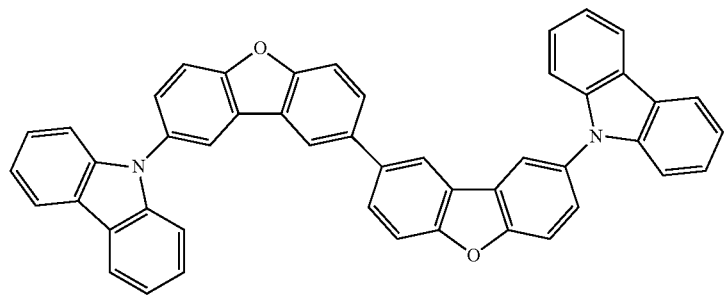
H35
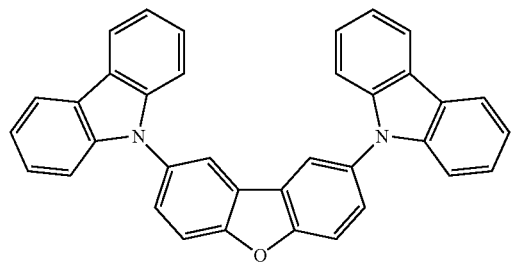
H36
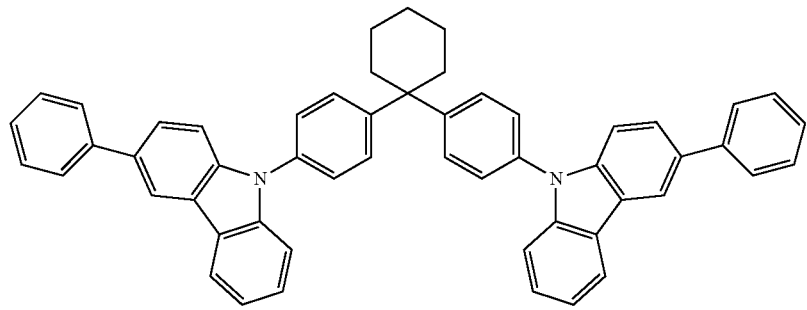
H37
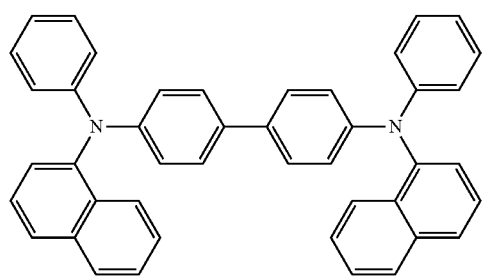
H38
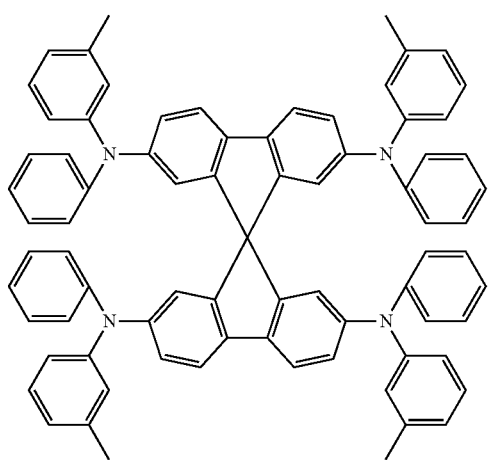
H39

-continued
H40
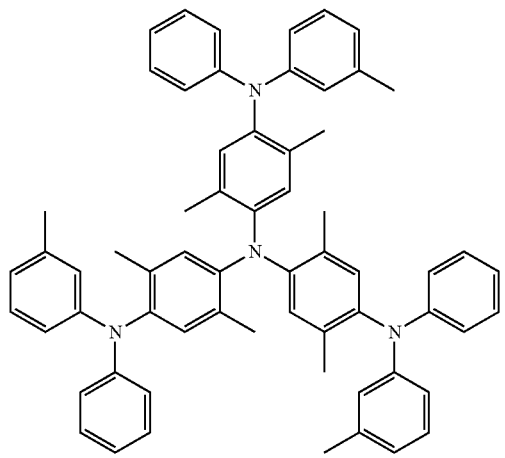
H41
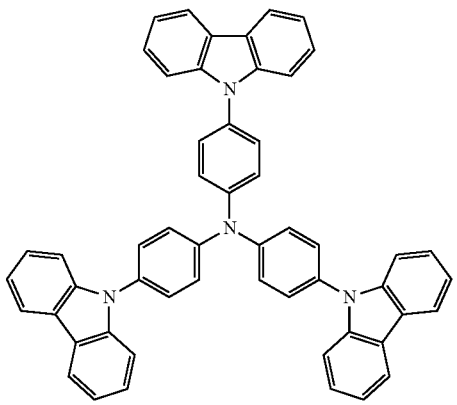
H42
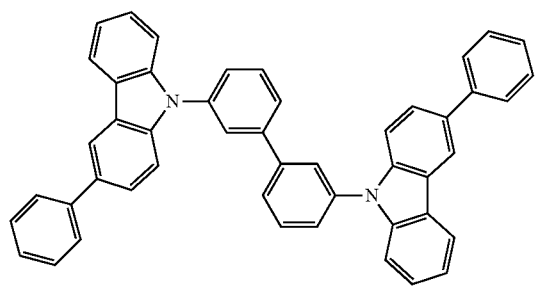
H43
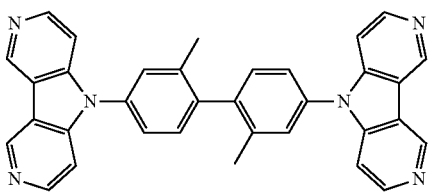
H44
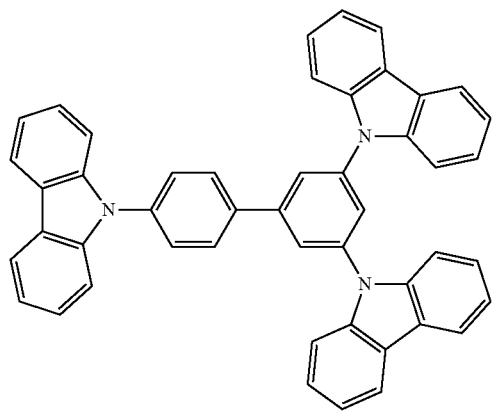
H45
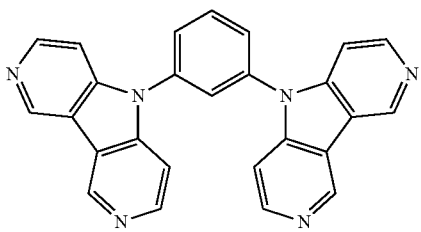
H46
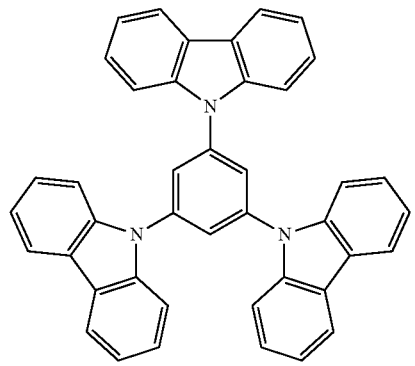
H47
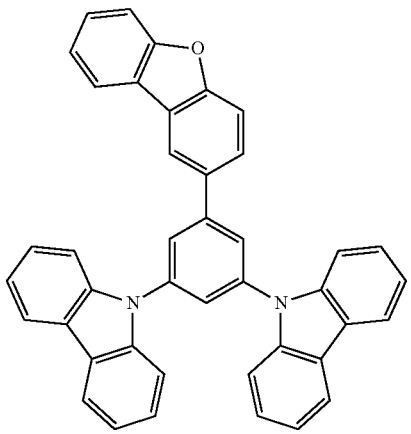

-continued
H48
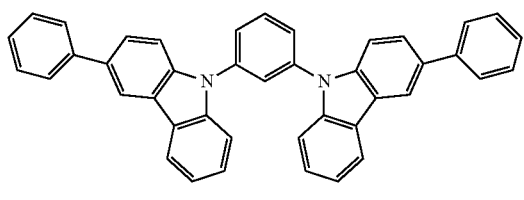
H49
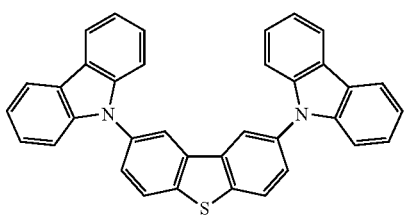
H50
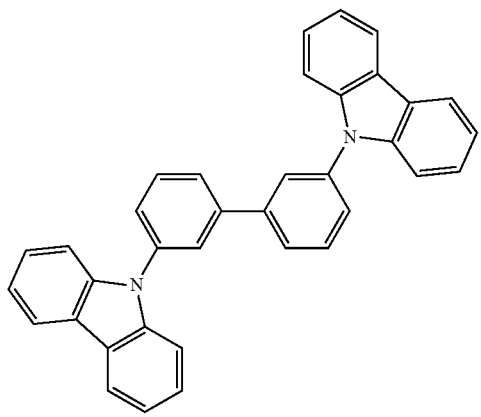
H51
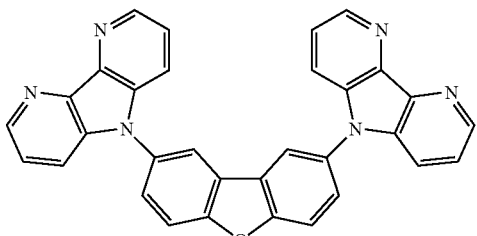
H52
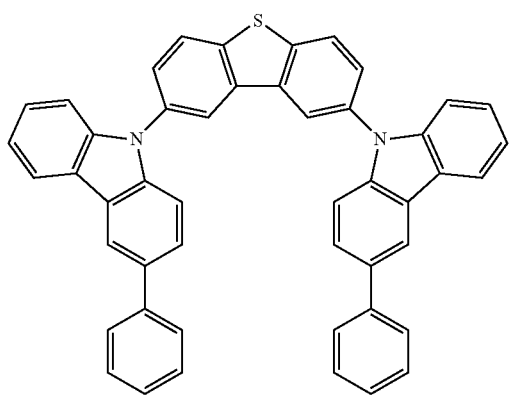
H53
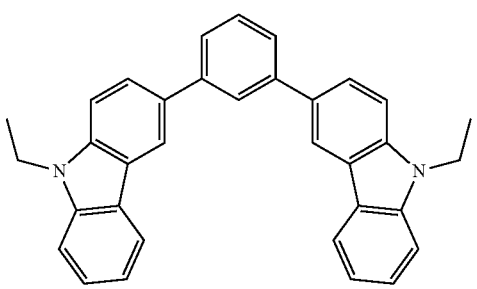
H54
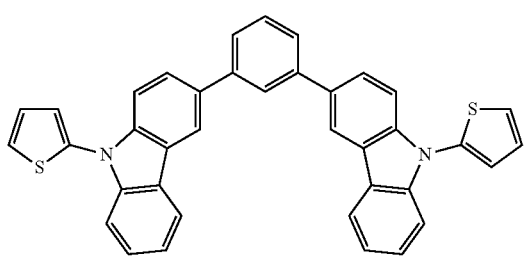
H55
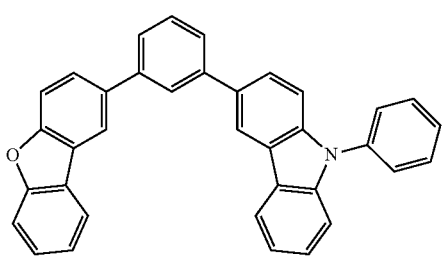

-continued
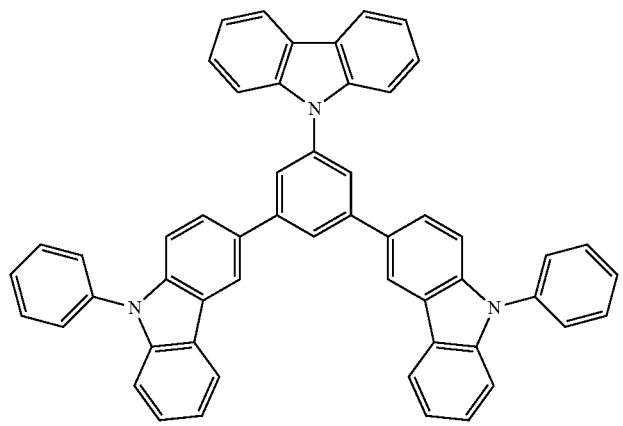
H56
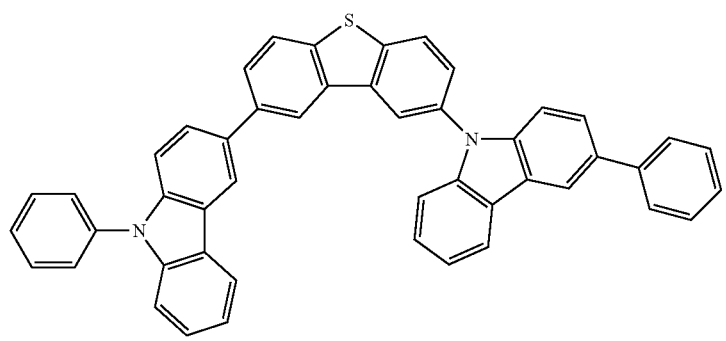
H57
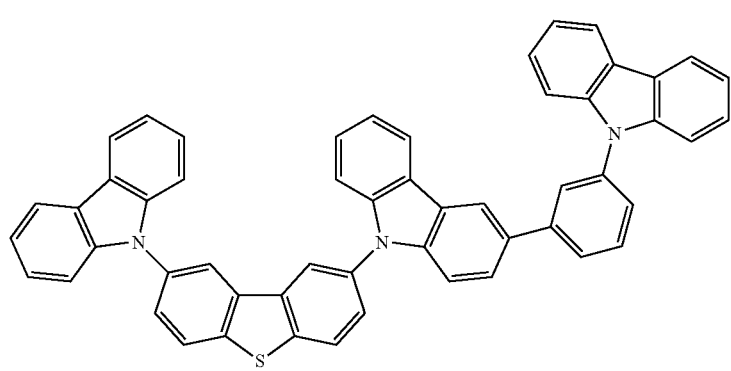
H58
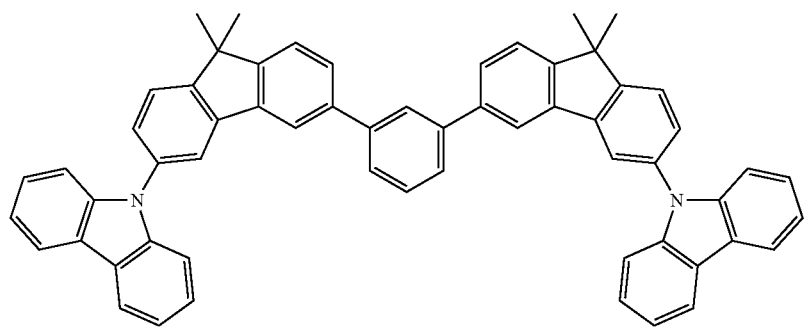
H59

-continued
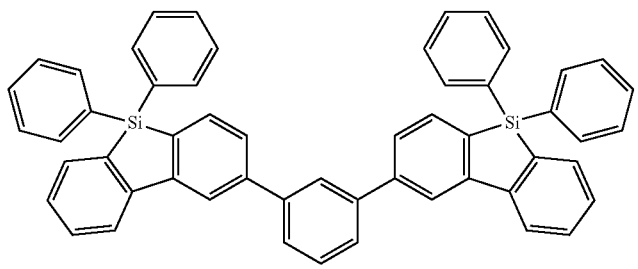
H60
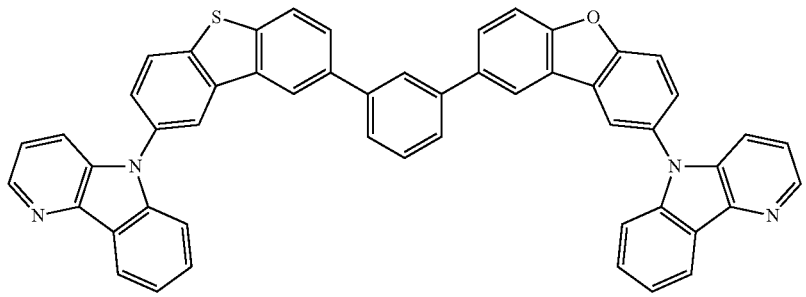
H61
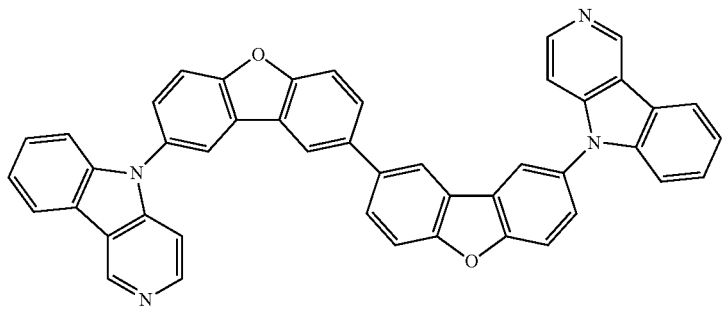
H62
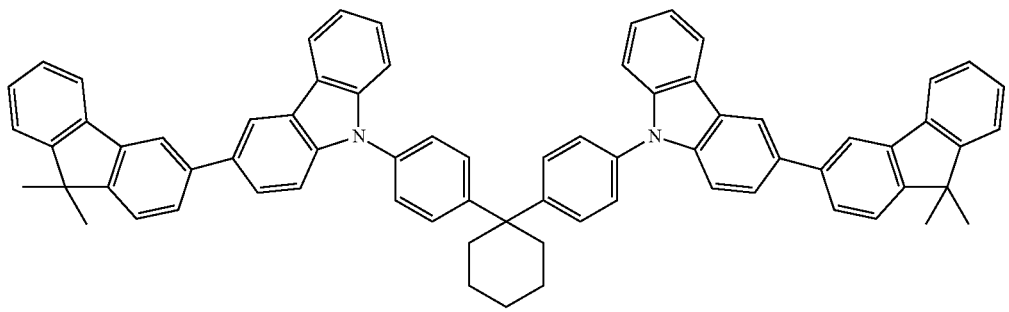
H63
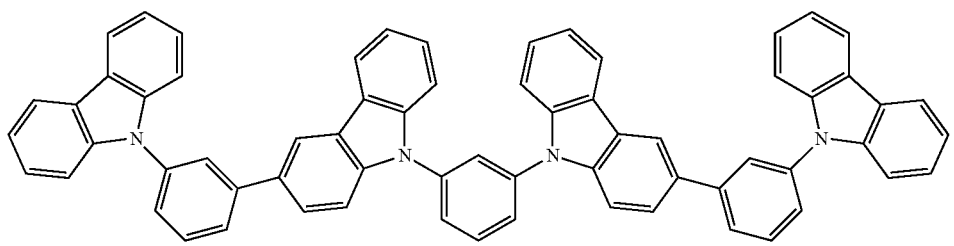
H64

-continued
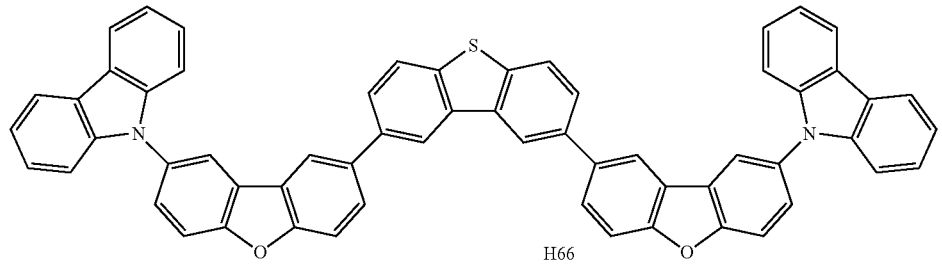
H65
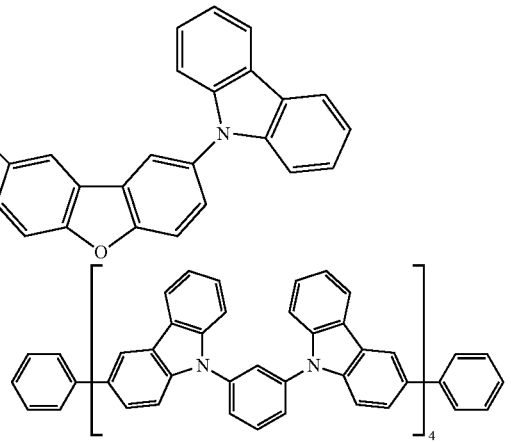
H66
H67
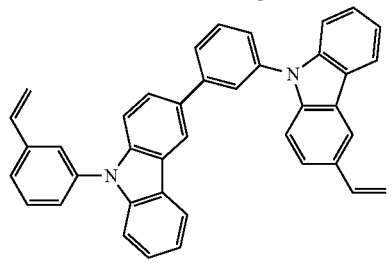
H68
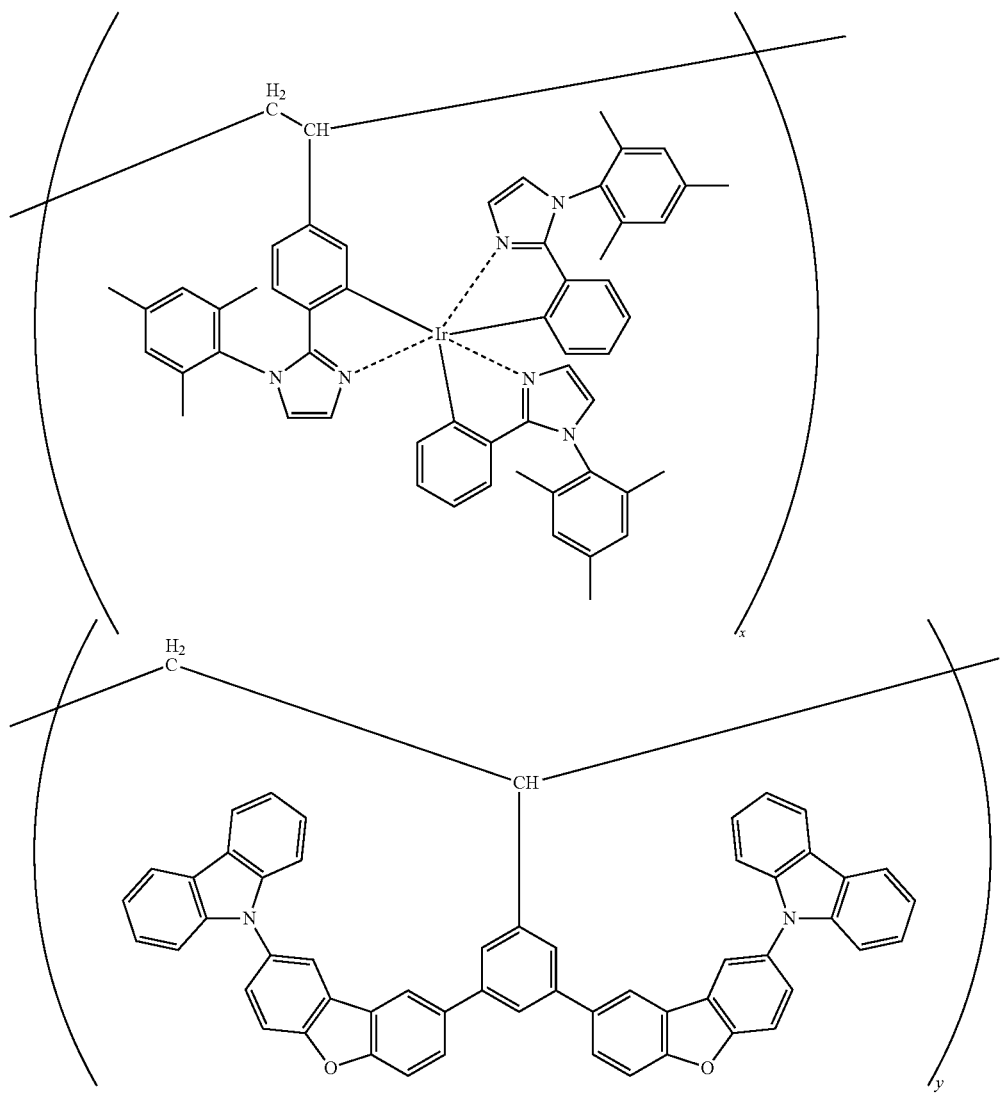
x:y = 1:10
randon co-polymer H69
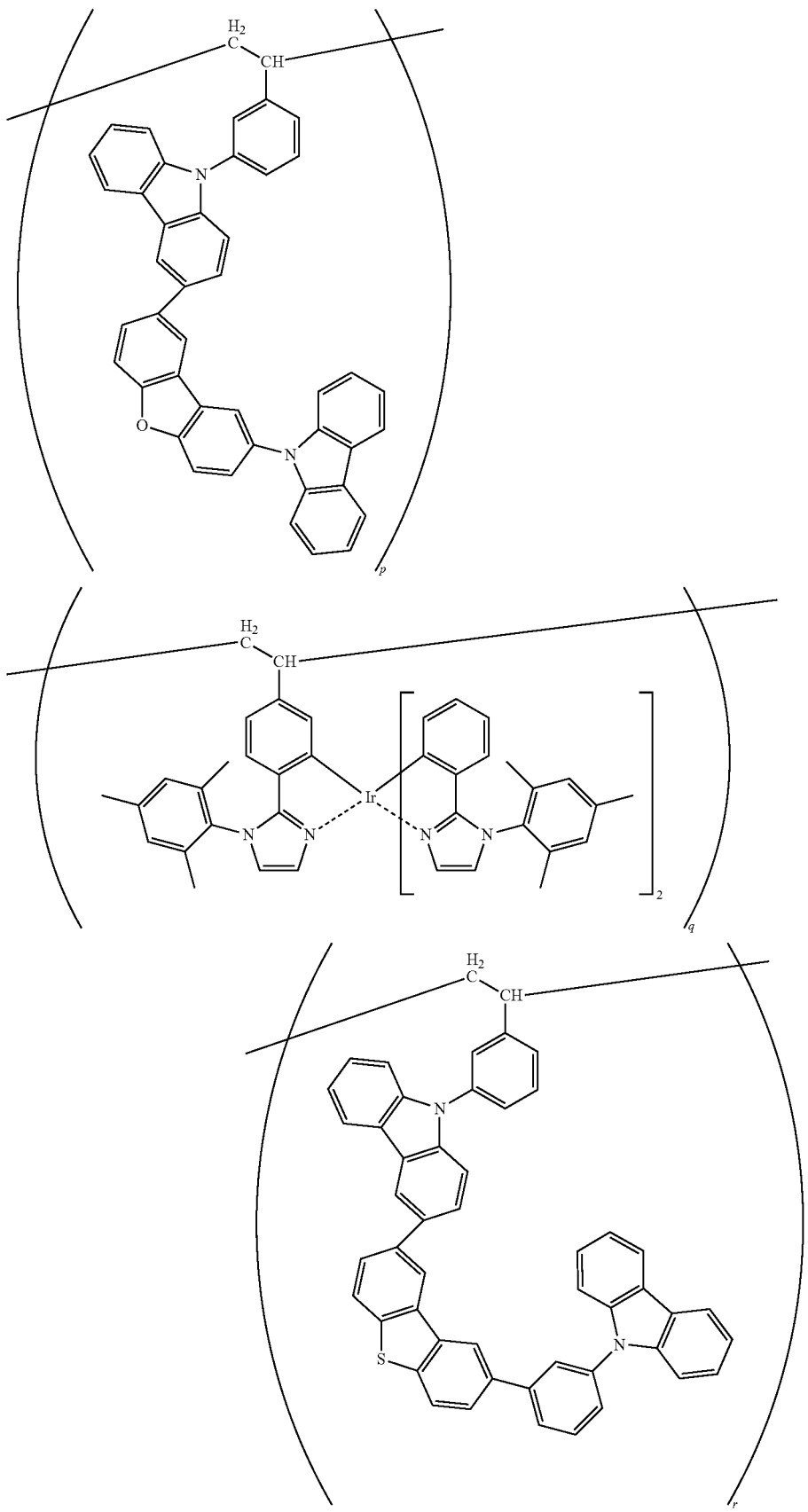

-continued
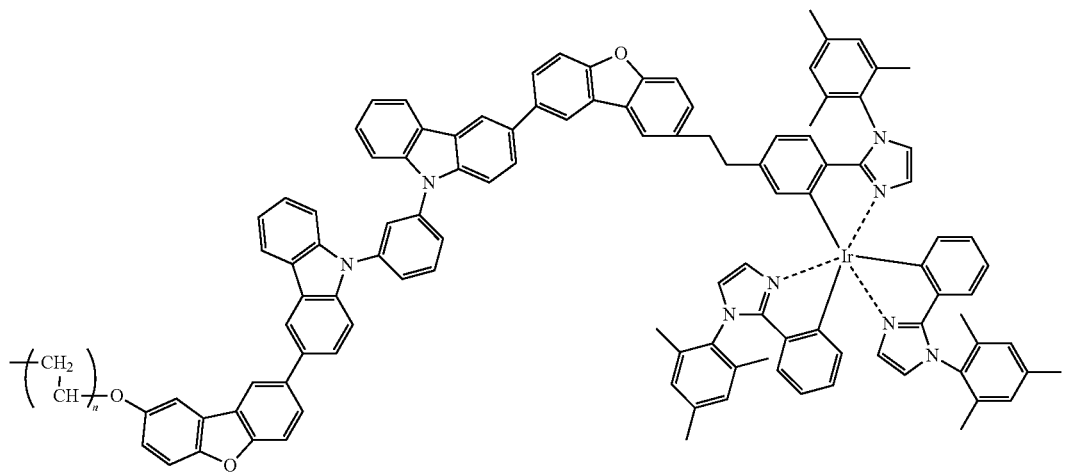
H70
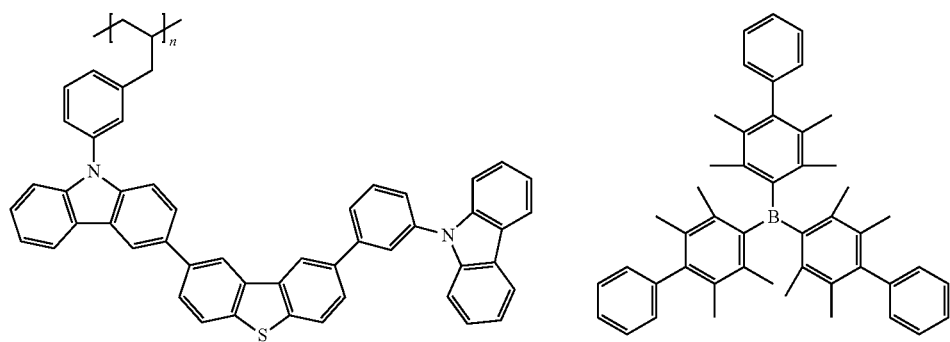
H71  H72
H73  H74
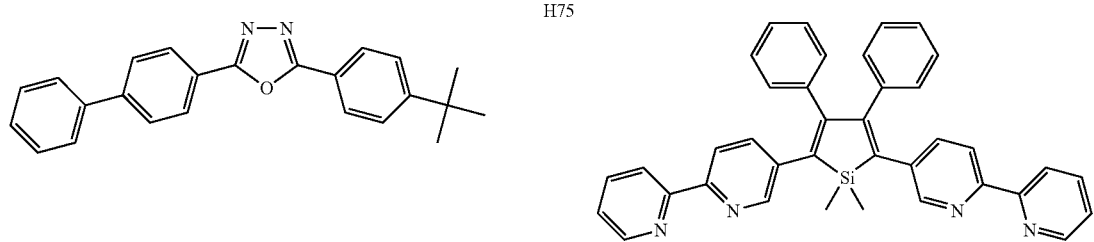
H75  H76

-continued

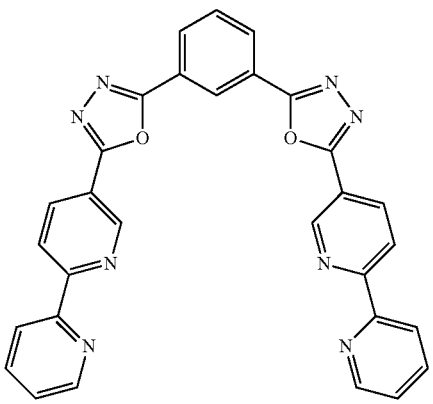
H77

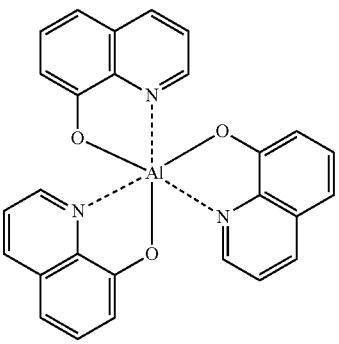
H78

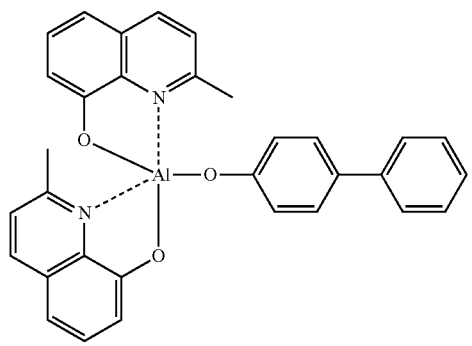
H79

As specific examples of an emission host compounds described in the following Documents are preferable. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Emitting Dopant)

The emitting dopant of the present invention will now be described.

As light emitting dopants according to the present invention, employed may be fluorescent dopants (also referred to as fluorescent compounds), phosphorescence emitting dopants (also referred to as phosphorescent dopants, phosphorescent compounds, phosphorescence emitting compounds, or phosphorescent dopants). However, in view of production of organic EL elements exhibiting higher light emission efficiency, as light emitting dopants (also referred simply to as light emitting materials) employed in the light emitting layer of the organic EL element and light emitting units in the present invention, it is preferable to simultaneously incorporate the aforesaid host compounds and the phosphorescence emitting dopants.

(Phosphorescence-Emitting Dopants (Also Referred to Phosphorescence-Emitting Compounds))

A phosphorescence-emitting dopant of the present invention will be described.

The phosphorescence-emitting dopant of the present invention is a compound, wherein emission from an excited triplet state thereof is observed, specifically, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescence-emitting dopant of the present invention to exhibit the above phosphorescence quantum yield using any of the appropriate solvents.

Two kinds of principles regarding emission of a phosphorescence-emitting dopant are cited. One is an energy transfer-type, wherein carriers recombine on a host compound on which the carriers are transferred to produce an excited state of the host compound, and then via transfer of this energy to a phosphorescence-emitting dopant, emission from the phosphorescence-emitting dopant is realized. The other is a carrier trap-type, wherein a phosphorescence-emitting dopant serves as a carrier trap and then carriers recombine on the phosphorescence-emitting dopant to generate emission from the phosphorescence-emitting dopant. In each case, the excited state energy of the phosphorescence-emitting dopant is required to be lower than that of the host compound.

<Compound Represented by Formula (4)>

A phosphorescence emitting compound used in an organic EL element of the present invention is preferably a compound represented by the afore-mentioned Formula (4).

The compound represented by the afore-mentioned Formula (4) will be described. Incidentally, a phosphorescence emitting compound (it is called also as a phosphorescence emitting metal complex) represented by Formula (4) is preferably contained in a light emitting layer of the organic EL element of the present invention as a light emitting dopant. However, it may be incorporated in another constituting layer than a light emitting layer. The constituting layers other than the light emitting layer will be detailed later.

In Formula (4), examples of an aromatic hydrocarbons which is formed by A1 with P—C include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring and an anthraanthrene ring.

The afore-mentioned rings may have a substituent represented by Y1 in Formula (1).

In Formula (4), examples of an aromatic heterocycle which is formed by A1 with P—C include: a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzothiazole ring, a benzoxazole ring, a quinoxaline ring, a quinazoline ring, a phthalazine ring, a carbazole ring, a carboline ring and an azacarbazole ring.

An azacarbazole ring indicates a ring structure formed in such a manner that at least one of the carbon atoms constituting the carbazole ring is replaced with a nitrogen atom).

The afore-mentioned rings may have a substituent represented by Y1 in Formula (1).

In Formula (4), examples of an aromatic heterocycle which is formed by A2 with P—C include: an oxazole ring, an oxadiazole ring, an oxatriazole ring, an isoxazole ring, a tetrazole ring, a thiadiazole ring, a thiatriazole ring, an isothiazole ring, a pyrrole ring, a pyridine ring, a pyridazine ring, a pyrimidine ring, a pyrazine ring, a triazine ring, an imidazole ring, a pyrazole ring and a triazole ring.

The afore-mentioned rings may have a substituent represented by Y1 in Formula (1).

In Formula (4), examples of a bidentate ligand represented by P1-L1-P2 include: phenylpyridine, phenylpyrazole, phenylimidazole, phenyltriazole, phenyltetrazole, pyrazabole, acetylacetone and picolinic acid.

In Formula (4), j1 represents an integer of 1 to 3, and j2 represents an integer of 0 to 2, provided that a sum of j1 and j2 is 2 or 3. Especially, j2 is preferable to be 0.

In Formula (4), M1 represents a transition metal element of Groups 8 to 10 (it is called simply transition metal). Among them, iridium is preferable for M1.

<Compounds Represented by Formula (5)>

The compound represented by Formula (4) of the present invention is more preferably represented by Formula (5).

In Formula (5), examples of a hydrocarbon ring group represented by Z include a non-aromatic hydrocarbon ring group and an aromatic hydrocarbon ring group. Examples of a non-aromatic hydrocarbon ring group include: a cyclopropyl group, a cyclopentyl group and a cyclohexyl group. These groups may be unsubstituted or may be substituted with a substituent which will be described subsequently.

Examples of an aromatic hydrocarbon ring group (it is also called as an aryl group) include: a phenyl group, p-chlorophenyl group, a mesityl group, a tolyl group, a xylyl group, a naphthyl group, a anthryl group, an azulenyl group, a acenaphthenyl group, a fluorenyl group, a phenanthryl group, an indenyl group, a pyrenyl group and a biphenyl group.

The afore-mentioned groups may have a substituent represented by Y1 in Formula (1).

In Formula (5), examples of a heterocycle represented by Z include a non-aromatic heterocycle and an aromatic heterocycle. Examples of a non-aromatic heterocycle represented by Z include: an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, a imidazolidine ring, a oxazolidine ring, a tetrahydrothiophene ring, the sulforane ring, a thiazolidine ring, □-caprolactone ring, □-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo [2,2,2]-octane ring.

The afore-mentioned groups may have a substituent represented by Y1 in Formula (1).

Examples of an aromatic heterocycle represented by Z include: a pyridyl group, a pyrimidinyl group, a furyl group, a pyrrolyl group, an imidazolyl group, a benzimidazolyl group, a pyrrazolyl group, a pyradinyl group, a triazolyl group (for example, 1,2,4-triazole-1-yl group, 1,2,3-triazole-1-yl group, etc.), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure formed in such a manner that one of the carbon atoms constituting the carboline ring is replaced with a nitrogen atom), a quinoxalinyl group, a pyridazinyl group, a triazinyl group, a quinazolinyl group, and a phthalazinyl group.

The afore-mentioned groups may have a substituent represented by Y1 in Formula (1).

The groups represented by Z are preferably an aromatic hydrocarbon group or an aromatic heterocycle.

In Formula (5), examples of an aromatic hydrocarbon which is formed by A1 with P—C include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring and an anthraanthrene ring.

The afore-mentioned rings may have a substituent represented by Y1 in Formula (1).

In Formula (5), examples of an aromatic heterocycle which is formed by A1 with P—C include: a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzothiazole ring, a benzoxazole ring, a quinoxaline ring, a quinazoline ring, a phthalazine ring, a carbazole ring, a carboline ring and an azacarbazole ring.

An azacarbazole ring indicates a ring structure formed in such a manner that at least one of the carbon atoms constituting the carbazole ring is replaced with a nitrogen atom).

The afore-mentioned rings may have a substituent represented by Y1 in Formula (1).

R01 and R02 in —C(R01)=C(R02)-, —N=C(R02)- and —C(R01)=N— which are represented by A3 of Formula (5) indicate the same substituent represented by Y1 of Formula (1).

In Formula (5), examples of a bidentate ligand represented by P1-L1-P2 include: phenylpyridine, phenylpyrazole, phenylimidazole, phenyltriazole, phenyltetrazole, pyrazabole, acetylacetone and picolinic acid.

In Formula (5), j1 represents an integer of 1 to 3, and j2 represents an integer of 0 to 2, provided that a sum of j1 and j2 is 2 or 3. Especially, j2 is preferable to be 0.

In Formula (5), M1 represents a transition metal element of Groups 8 to 10 of the element periodic table (it is called simply transition metal), which is the same as represented by M1 of Formula (4).

<Compound Represented by Formula (6)>

One of preferred embodiments of a compound represented by Formula (5) is a compound represented by the afore-mentioned Formula (6).

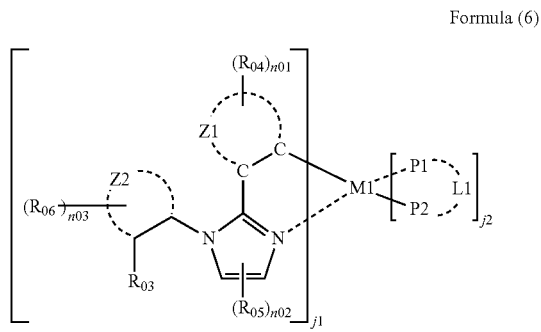

Formula (6)

In Formula (6), R03 represents a substituent; R04 represents a hydrogen atom or a substituent; provided that a plurality of R04s may be joined to form a ring. n01 is an integer of 1 to 4. R05 represents a hydrogen atom or a substituent; provided that a plurality of R05s may be joined to form a ring. n02 is an integer of 1 to 2. R06 represents a hydrogen atom or a substituent; provided that a plurality of R06s may be joined to form a ring. n03 is an integer of 1 to 4. Z1 is a group of atoms necessary to form a 6 membered aromatic hydrocarbon ring or a 5 to 6 membered aromatic heterocycle with C—C bond. Z2 is a group of atoms necessary to form a hydrocarbon ring or a heterocycle. P1-L1-P2 represents a bidentate ligand; and P1 and P2 each independently represent a carbon atom, a nitrogen atom or an oxygen atom. L1 is a group of atoms which forms a bidentate ligand together with P1 and P2. j1 is an integer of 1 to 3; and j2 is an integer of 0 to 2, provided that a sum of j1 and j2 is 2 or 3. M1 is a transition metal of Groups 8 to 10 of the element periodic table. A pair of R03 and R06, a pair of R04 and R06, and a pair of R05 and R06 each may be joined to form a ring. In Formula (6), the substituent represented by R03, R04, R05 and R06 each indicate the same substituent represented by Y1 of Formula (1).

In Formula (6), an example of a 6 membered aromatic hydrocarbon ring which is formed by Z1 with C—C is preferably a benzene ring.

This ring may have a substituent represented by Y1 in Formula (1).

In Formula (6), examples of a 5 or 6 membered aromatic heterocycle which is formed by Z1 with C—C bond include: an oxazole ring, an oxadiazole ring, a oxatriazole ring, an isoxazole ring, a tetrazole ring, a thiadiazole ring, a thiatriazole ring, an isothiazole ring, a thiophene ring, a furan ring, a pyrrole ring, a pyridine ring, a pyridazine ring, a pyrimidine ring, a pyrazine ring, a triazine ring, an imidazole ring, a pyrazole ring and a triazole ring.

The afore-mentioned rings may have a substituent represented by Y1 in Formula (1).

In Formula (6), examples of a hydrocarbon ring group represented by Z2 include a non-aromatic hydrocarbon ring group and an aromatic hydrocarbon ring group. Examples of a non-aromatic hydrocarbon ring group include: a cyclopropyl group, a cyclopentyl group and a cyclohexyl group. These groups may be unsubstituted or may be substituted with a substituent which will be described subsequently.

Examples of an aromatic hydrocarbon ring group (it is also called as an aryl group) include: a phenyl group, p-chlorophenyl group, a mesityl group, a tolyl group, a xylyl group, a naphthyl group, a anthryl group, an azulenyl group, a acenaphthenyl group, a fluorenyl group, a phenanthryl group, an indenyl group, a pyrenyl group and a biphenyl group. The afore-mentioned groups may be unsubstituted or have a substituent represented by Y1 in Formula (1).

In Formula (6), examples of a heterocycle represented by Z2 include a non-aromatic heterocycle and an aromatic heterocycle. Examples of a non-aromatic heterocycle represented by Z2 include: an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, a imidazolidine ring, a oxazolidine ring, a tetrahydrothiophene ring, the sulforane ring, a thiazolidine ring, □-caprolactone ring, □-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo[2,2,2]-octane ring. The afore-mentioned groups may be unsubstituted or have a substituent represented by Y1 in Formula (1).

Examples of an aromatic heterocycle represented by Z include: a pyridyl group, a pyrimidinyl group, a furyl group, a pyrrolyl group, an imidazolyl group, a benzimidazolyl group, a pyrrazolyl group, a pyradinyl group, a triazolyl group (for example, 1,2,4-triazole-1-yl group, 1,2,3-triazole-1-yl group, etc.), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure formed in such a manner that one of the carbon atoms constituting the carboline ring is replaced with a nitrogen atom), a quinoxalinyl group, a pyridazinyl group, a triazinyl group, a quinazolinyl group, and a phthalazinyl group.

The afore-mentioned groups may be unsubstituted or have a substituent represented by Y1 in Formula (1).

In Formula (6), an example of a group which is formed by Z1 with Z2 is preferably a benzene ring.

In Formula (6), a bidentate ligand represented by P1-L1-P2 indicates the same bidentate ligand as indicated by P1-L1-P2 of Formula (4).

In Formula (6), M1 represents a transition metal element of Groups 8 to 10 of the element periodic table, which is the same as represented by M1 of Formula (4).

A phosphorescence emitting compound can be suitably selected from the known phosphorescence emitting compounds used in the light emitting layer of an organic EL element.

A phosphorescence emitting compound of the present invention is preferably a transition metal complex compound containing a transition metal of Groups 8 to 10 of the element periodic table. More preferable transition metal complexes are an iridium compound, an osmium compound and a platinum compound (a platinum complex compound) and a rare-earth complex. Among them, a most preferably compound is an iridium compound.

Examples of a phosphorescence emitting compound of the present invention are shown below, however, the present invention is not limited to them.

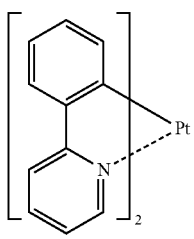

Pt-1

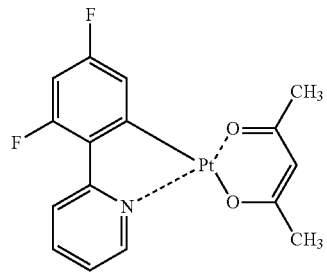

Pt-2

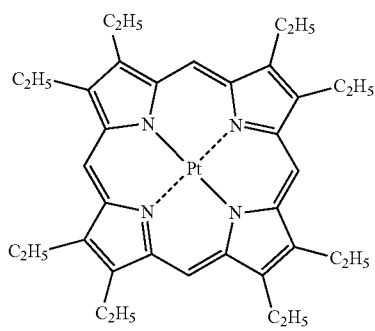

Pt-3

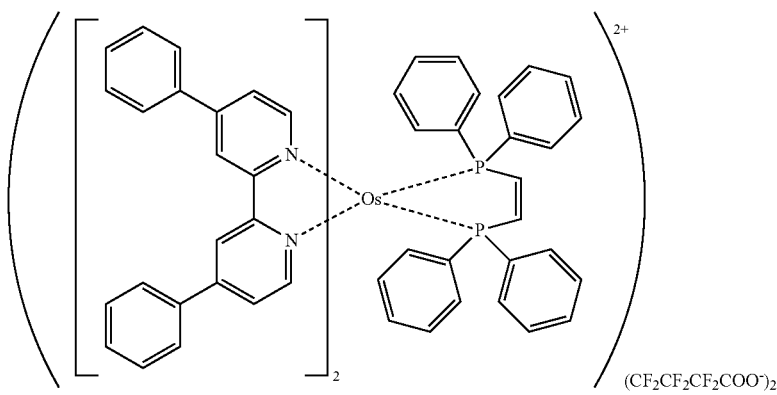

A-1

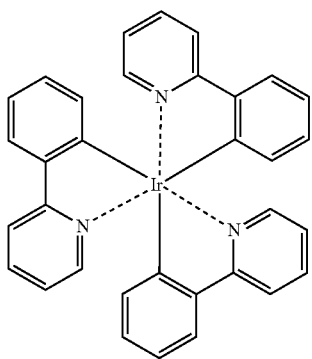

Ir-1

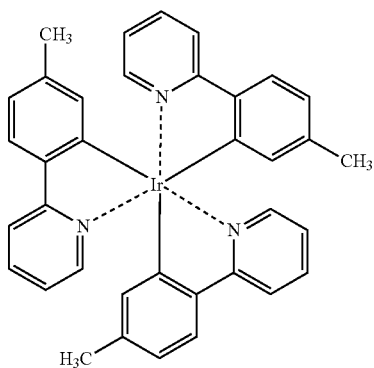

Ir-2

-continued
Ir-3
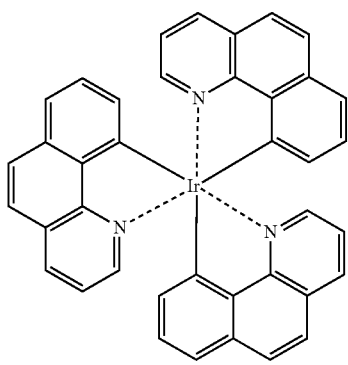
Ir-4
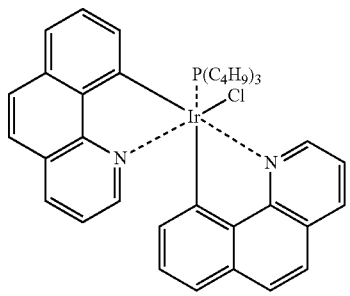
Ir-5
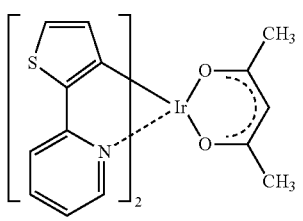
Ir-6
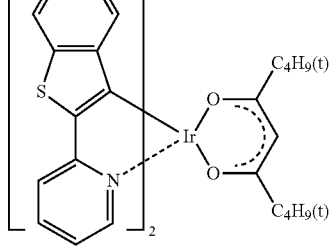
Ir-7
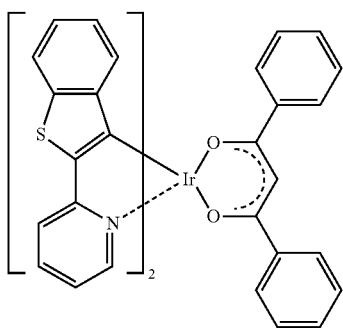
Ir-8
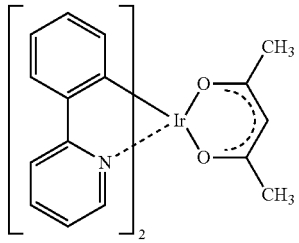
Ir-9
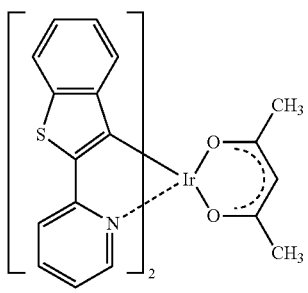
Ir-10
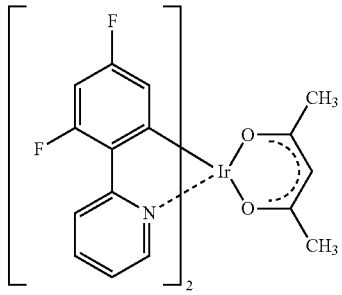
Ir-11
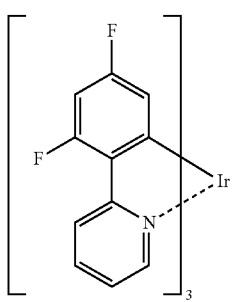
Ir-12
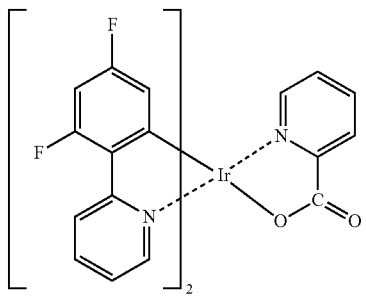

-continued
Ir-13
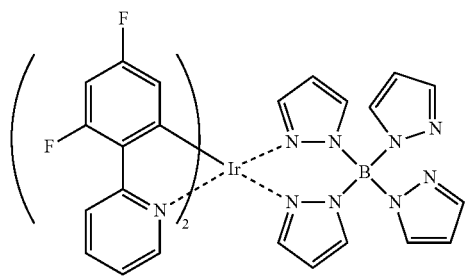
Ir-14
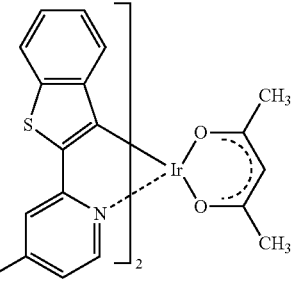
Ir-15
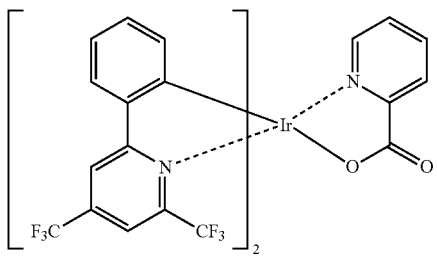
Ir-16
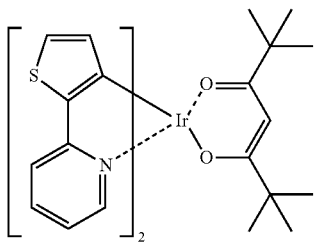
Ir-17
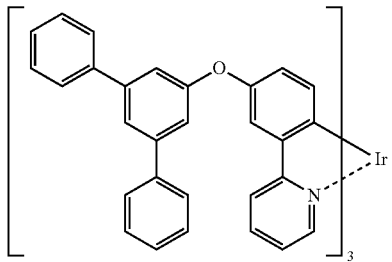
Ir-18
Ir-19
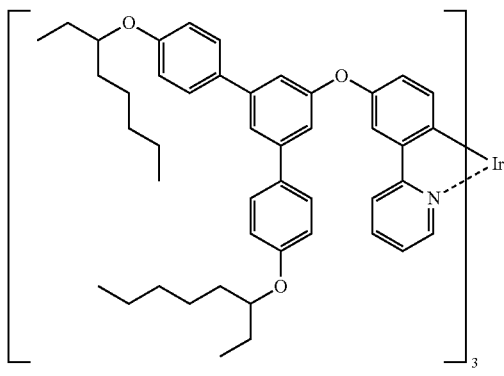
Ir-20
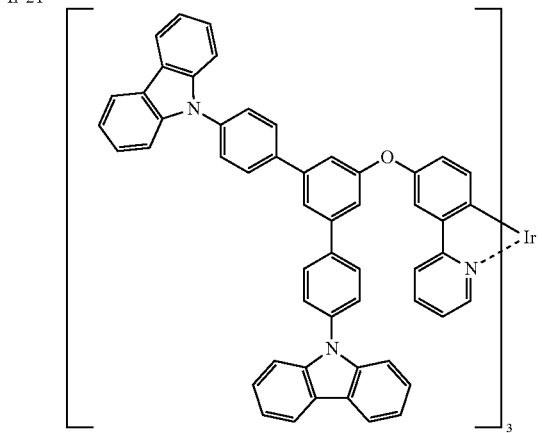
Ir-21
Ir-22

Ir-23 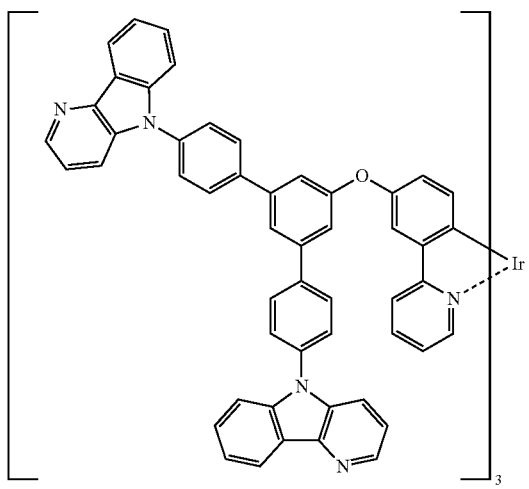
Ir-24 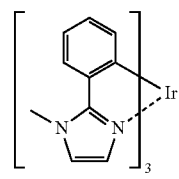
Ir-25 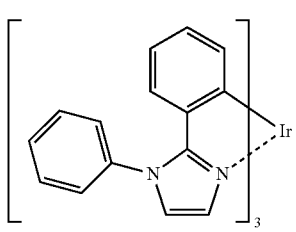
Ir-26 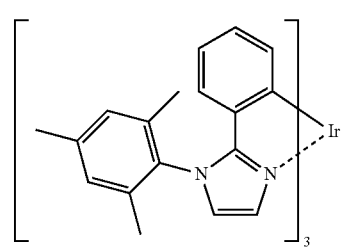
Ir-27 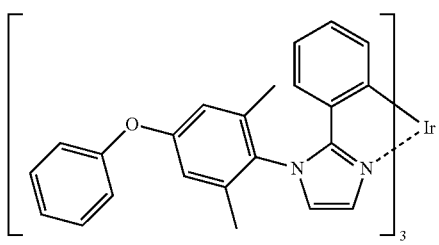
Ir-28 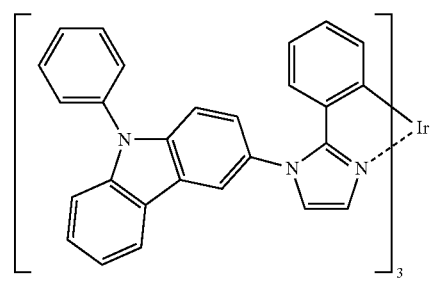
Ir-29 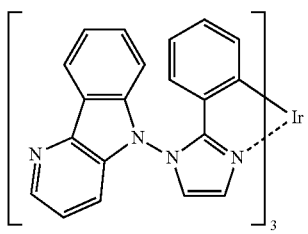
Ir-30 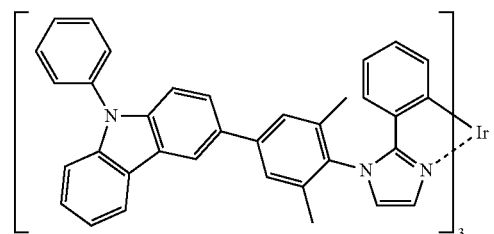
Ir-31 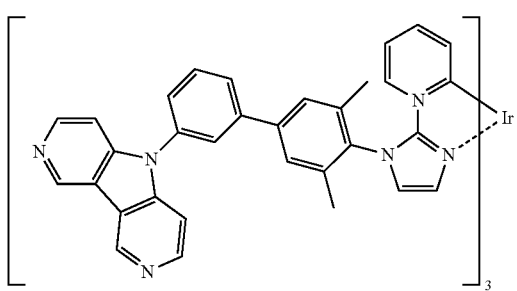

-continued
Ir-32
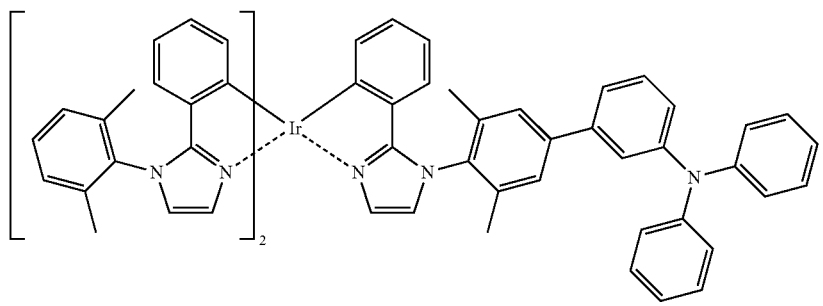
Ir-33
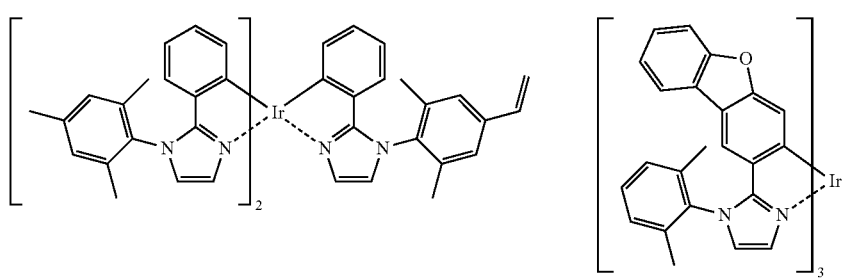
Ir-34
Ir-35
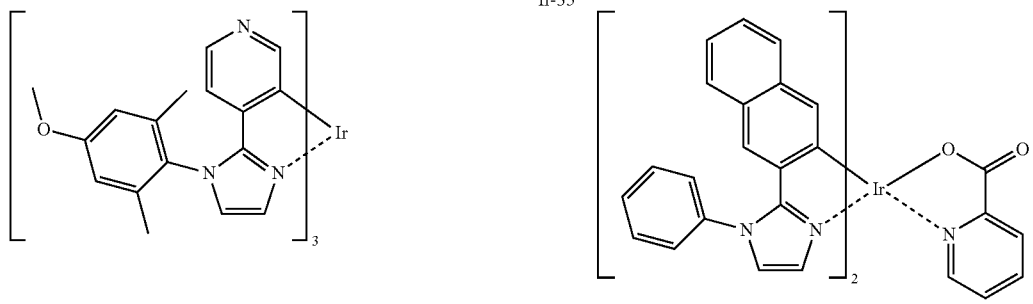
Ir-36
Ir-37
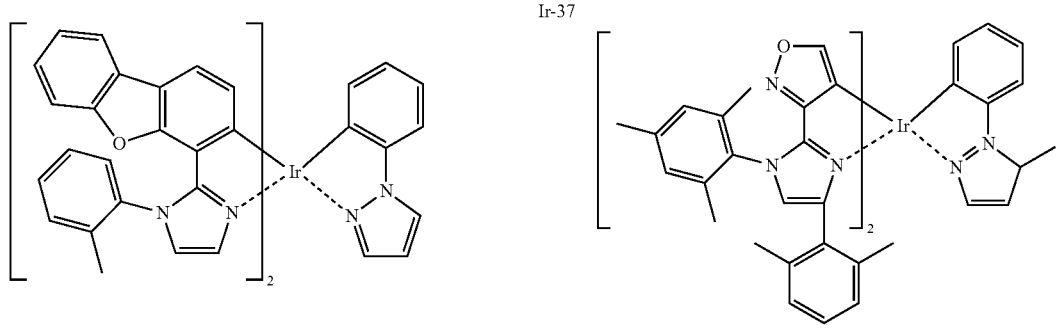
Ir-38

-continued
Ir-39
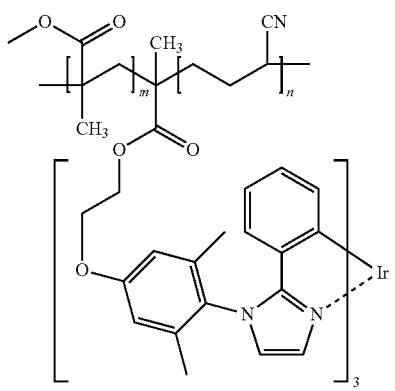
Ir-40
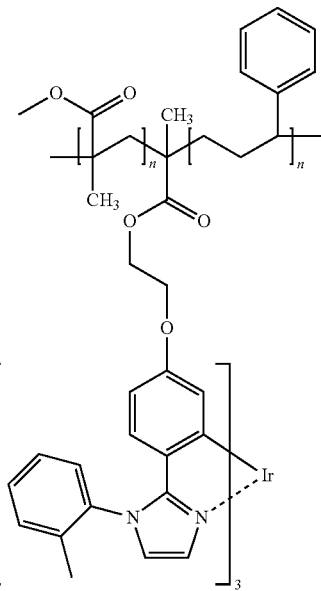
Ir-41
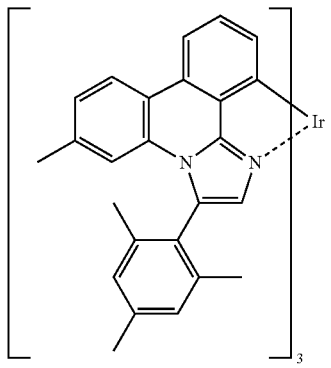
Ir-42
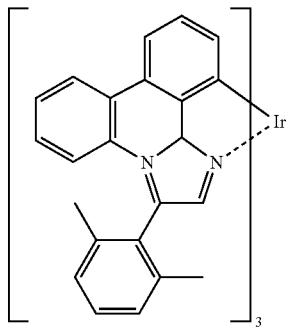
Ir-43
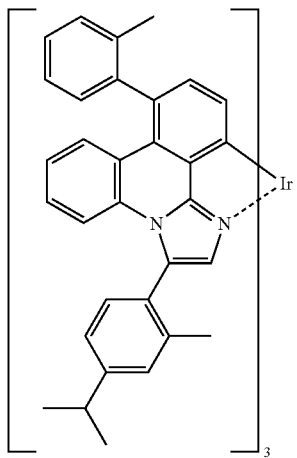
Ir-44
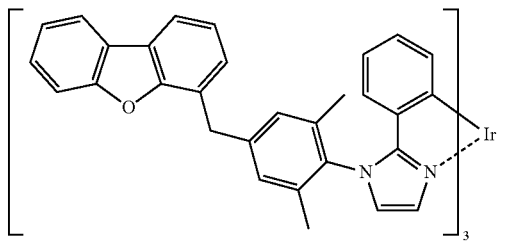

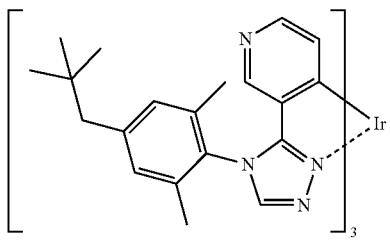

Ir-45

The phosphorescence-emitting compound of the present invention can be synthesized by applying a method described in such as Organic Letter, vol. 3, No. 16, pp. 2579-2581 (2001), Inorganic Chemistry, vol. 30, No. 8, pp. 1685-1687 (1991), J. Am. Chem. Soc., vol. 123, p. 4304 (2001), Inorganic Chemistry, vol. 40, No. 7, pp. 1704-1711 (2001), Inorganic Chemistry, vol. 41, No. 12, pp. 3055-3066 (2002), New Journal of Chemistry, vol. 26, p. 1171 (2002), European Journal of Organic Chemistry, vol. 4, pp. 695-709 (2004), and reference documents described in these documents.

(Fluorescent Dopants (Also Referred to as Fluorescent Compounds))

As fluorescent dopants, listed are coumarin based dyes, pyran based dyes, cyanine based dyes, croconium based dyes, squarylium based dyes, oxobenzanthracene based dyes, fluorescein based dyes, Rhodamine based dyes, pyrylium based dyes, perylene based dyes, stilbene based dyes, polythiophene based dyes, or rare earth complex based fluorescent materials.

An injection layer and an inhibition layer, used for an electron transport layer of a constituting layer of the organic EL element of the present invention will now be described.

<Injection Layer: Electron Injection Layer, Positive Hole Injection Layer>

An injection layer is appropriately provided and includes an electron injection layer and a positive hole injection layer, which may be arranged between an anode and a light emitting layer or a positive transfer layer, and between a cathode and a light emitting layer or an electron transport layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1-100 nm although it depends on a raw material.

<Inhibition Layer: Positive Hole Inhibition Layer, Electron Inhibition Layer>

An inhibition layer is appropriately provided in addition to the basic constitution layers composed of organic thin layers as described above. Examples are described in such as JP-A Nos. 11-204258 and 11-204359 and p. 273 of "Organic EL Elements and Industrialization Front Thereof (Nov. 30 (1998), published by N. T. S Corp.)" is applicable to a positive hole inhibition (hole block) layer according to the present invention.

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron.

Further, a constitution of an electron transport layer described later can be appropriately utilized as a positive hole inhibition layer according to the present invention.

The positive hole inhibition layer of the organic EL element of the present invention is preferably arranged adjacent to the light emitting layer.

It is preferable that the positive hole inhibition layer incorporates a carbazole derivative, a carboline derivative or a diazacarbazole derivative (indicating a ring structure formed in such a manner that one of the carbon atoms constituting the carboline ring is replaced with a nitrogen atom) listed as a host compound.

Further, in the present intention, in the case in which a plurality of light emitting layers which differ in a plurality of different emitted light colors, it is preferable that the light emitting layer which results in the shortest wavelength of the emitted light maximum wavelength is nearest to the anode in all light emitting layers. However, in such a case, it is preferable to additionally arrange the positive hole inhibition layer between the aforesaid shortest wavelength layer and the light emitting layer secondly near the anode. Further, at least 50% by weight of the compounds incorporated in the positive hole inhibition layer arranged in the aforesaid position preferably exhibits the ionization potential which is greater by at least 0.3 eV than that of the host compounds of the aforesaid shortest wavelength light emitting layer.

The ionization potential is defined as energy which is necessary to release electrons in the HOMO (being the highest occupied molecular orbital) to the vacuum level, and may be determined via, for example, the method described below.

(1) By employing Gaussian98 (Gauaaian98, Revision A. 11. 4, M. J. Frisch, et al. Gaussian 98 (Gaussian98, Revision A. 11. 4, M. J. Frisch, et al, Gaussian, Inc., Pittsburgh Pa., 2002), which is a molecular orbital calculation software, produced by Gaussian Co. in the United States of America, and by employing B3LYP/6-31G* as a key word, the value (in terms of corresponding eV unit) was computed, and it is possible to obtain the ionization potential by rouging off the second decimal point. The background, in which the resulting calculated values are effective, is that the calculated values obtained by the above method exhibit high relationship with the experimental values.

(2) It is possible to determine the ionization potential via a method in which ionization potential is directly determined employing a photoelectron spectrometry. For example, by employing a low energy electron spectrophotometer "Model AC-1", produced by Riken Keiki Co., or appropriately employ a method known as an ultraviolet light electron spectrometry.

It may be possible to incorporate in a positive hole prohibiting layer a compound which has one of the partial structures of: a partial structure represented by one of Formulas (1) to (4); a partial structure represented by one of Formulas (5) to (8); a partial structure represented by one of Formulas (9) to (12); and a partial structure represented by one of Formulas (13) to (16).

On the other hand, the electron inhibition layer, as described herein, has a function of the positive hole transport layer in a broad sense, and is composed of materials having markedly small capability of electron transport, while having capability of transporting positive holes and enables to enhance the recombination probability of electrons and positive holes by inhibiting electrons, while transporting electrons.

Further, it is possible to employ the constitution of the positive hole transport layer, described below, as an electron inhibition layer when needed. The thickness of the positive hole inhibition layer and the electron transport layer according to the present invention is preferably 3-100 nm, but is more preferably 5-30 nm.

<Positive Hole Transport Layer>

A positive hole transport layer contains a material having a function of transporting a positive hole, and in abroad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-tri-amino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the backbone of polymer, can be also utilized. Further, an inorganic compound such as a p type-Si and a p type-SiC can be utilized as a positive hole injection material and a positive hole transport material Further, it is possible to employ so-called p type positive hole transport materials, as described in Japanese Patent Publication Open to Public Inspection (hereinafter referred to as JP-A) No. 11-251067, and J. Huang et al. reference (Applied Physics Letters 80 (2002), p. 139). In the present invention, since high efficiency light emitting elements are prepared, it is preferable to employ these materials.

This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, it is generally 5 nm-5 □m, and preferably 5 nm-200 nm. This positive transport layer may have a single layer structure comprised of one or not less than two types of the above described materials.

Further, it is possible to employ a positive hole transport layer of a higher p property which is doped with impurities. As its example, listed are those described in each of JP-A Nos. 4-297076, 2000-196140, 2001-102175, as well as in J. Appl. Phys., 95,5773 (2004).

In the present invention, it is preferable to employ a positive hole transport layer of such a high p property, since it is possible to produce an element of lower electric power consumption.

<Anode>

As an anode according to an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), SnO2 and ZnO.

Further, a material such as IDIXO (In2O3-ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 □m), a pattern may be formed through a mask of a desired form at the time of evaporation or spattering of the above-described substance.

Alternatively, when coatable materials such as organic electrically conductive compounds are employed, it is possible to employ a wet system filming method such as a printing system or a coating system. When emission is taken out of this anode, the transmittance is preferably set to not less than 10% and the sheet resistance as an anode is preferably not more than a few hundreds □/□. Further, although the layer thickness depends on a material, it is generally selected in a range of 10-1,000 nm and preferably of 10-200 nm.

<Cathode>

On the other hand, as a cathode according to the present invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al2O3) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide (Al2O3) mixture and a lithium/aluminum mixture, and aluminum.

As for a cathode, these electrode substances may be made into a thin layer by a method such as evaporation or spattering. Further, the sheet resistance as a cathode is preferably not more than a few hundreds □/□ and the layer thickness is generally selected in a range of 10-1,000 nm and preferably of 10-200 nm. Herein, to transmit emission, either one of an anode or a cathode of an organic EL element is preferably transparent or translucent to improve the mission luminance.

Further, after forming, on the cathode, the above metals at a film thickness of 1-20 nm, it is possible to prepare a transparent or translucent cathode in such a manner that electrically conductive transparent materials are prepared thereon. By applying the above, it is possible to produce an element in which both anode and cathode are transparent.

<Substrate>

A substrate according to an organic EL element of the present invention is not specifically limited with respect to types of such as glass and plastics. They may be transparent or opaque. However, a transparent substrate is preferable when the emitting light is taken from the side of substrate. Substrates preferably utilized includes such as glass, quartz and transparent resin film. A specifically preferable substrate is resin film capable of providing an organic EL element with a flexible property.

Resin film includes such as: polyesters such as polyethylene terephthalate (PET) and polyethylene naphthalate (PEN); polyethylene, polypropyrene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyetherketone imide, polyamide, fluororesin, Nylon, polymethylmethacrylate, acrylic resin, polyacrylate; and cycloolefine resins such as ARTON (produced by JSR Co. Ltd.) and APEL (produce by Mitsui Chemicals, Inc.)

On the surface of a resin film, formed may be a film incorporating inorganic and organic compounds or a hybrid film of both. Barrier films are preferred at a water vapor permeability ($25\pm0.5°$ C., and relative humidity ($90\pm2$) % RH) of at most 0.01 g/(m2·24 h), determined based on JIS K 7129-1992. Further, high barrier films are preferred at an oxygen permeability of at most $1\times10^{-3}$ ml/(m2·24 h·MPa), and at a water vapor permeability of at most $10^{-5}$ g/(m2·24 h), determined based on JIS K 7126-1987.

As materials forming a barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel, films, opaque resin substrates, and ceramic substrates.

The external extraction efficiency of light emitted by the organic EL element of the present invention is preferably at least 1% at room temperature, but is more preferably at least 5%.

External extraction quantum yield (%)=the number of photons emitted by the organic EL element to the exterior/the number of electrons fed to organic EL element Further, it may be used simultaneously employing color hue improving filters such as a color filter, or color conversion filters which convert emitted light color from the organic EL element to multicolor by employing fluorescent materials. When the color conversion filters are employed, it is preferable that λmax of light emitted by the organic EL element is at least 480 nm.

<<Sealing>>

As sealing means employed in the present invention, listed may be, for example, a method in which sealing members, electrodes, and a supporting substrate are subjected to adhesion via adhesives.

The sealing members may be arranged to cover the display region of an organic EL element, and may be an engraved plate or a flat plate. Neither transparency nor electrical insulation is limited.

Specifically listed are glass plates, polymer plate-films, metal plates, and films. Specifically, it is possible to list, as glass plates, soda-lime glass, barium-strontium containing glass, lead glass, aluminosilicate glass, borosilicate glass, bariumborosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to convert the element to a thin film, it is possible to preferably employ a polymer film and a metal film.

Further, the oxygen permeability of the polymer film is preferably at most 1×10-3 ml/(m2·24 h·MPa), determined by the method based on JIS K 7126-1987, while its water vapor permeability (at 25±0.5° C. and relative humidity (90±2) %) is at most 10-5 g/(m2·24 h), determined by the method based on JIS K 7129-1992.

Conversion of the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates.

Further listed may be thermal and chemical curing types (mixtures of two liquids) such as epoxy based ones. Still further listed may be hot-melt type polyamides, polyesters, and polyolefins. Yet further listed may be cationically curable type ultraviolet radiation curable type epoxy resin adhesives.

In addition, since an organic EL element is occasionally deteriorated via a thermal process, those are preferred which enable adhesion and curing between room temperature and 80° C. Further, desiccating agents may be dispersed into the aforesaid adhesives.

Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials forming the aforesaid film may be those which exhibit functions to retard penetration of those such as moisture or oxygen which results in deterioration. For example, it is possible to employ silicon oxide, silicon dioxide, and silicon nitride.

Still further, in order to improve brittleness of the aforesaid film, it is preferable that a laminated layer structure is formed, which is composed of these inorganic layers and layers composed of organic materials.

Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

In a gas phase and a liquid phase, it is preferable to inject inert gases such as nitrogen or argon, and inactive liquids such as fluorinated hydrocarbon or silicone oil into the space between the sealing member and the surface region of the organic EL element. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

<<Protective Film and Protective Plate>>

The aforesaid sealing film on the side which nips the organic layer and faces the support substrate or on the outside of the aforesaid sealing film, a protective or a protective plate may be arranged to enhance the mechanical strength of the element. Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and a decrease in thickness, it is preferable to employ polymer films.

<<Light Extraction>>

It is generally known that an organic EL element emits light in the interior of the layer exhibiting the refractive index (being about 1.7-about 2.1) which is greater than that of air, whereby only about 15-about 20% of light generated in the light emitting layer is extracted. This is due to the fact that light incident to an interface (being an interface of a transparent substrate to air) at an angle of θ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example, a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. 63-314795), a method in which a reflection surface is formed on the side of the element (JP-A No. 1-220394), a method in which a flat layer of a middle refractive index is introduced between the substrate and the light emitting body and an antireflection film is formed (JP-A No. 62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. 11-283751).

In the present invention, it is possible to employ these methods while combined with the organic EL element of the present invention. Of these, it is possible to appropriately employ the method in which a flat layer of a refractive index which is equal to or less than the substrate is introduced between the substrate and the light emitting body and the method in which a diffraction grating is formed between the substrate and any of the layers such as the transparent electrode layer or the light emitting layer (including between the substrate and the outside).

By combining these means, the present invention enables the production of elements which exhibit higher luminance or excel in durability.

When a low refractive index medium of a thickness, which is greater than the wavelength of light, is formed between the transparent electrode and the transparent substrate, the extraction efficiency of light emitted from the transparent electrode to the exterior increases as the refractive index of the medium decreases.

As materials of the low refractive index layer, listed are, for example, aerogel, porous silica, magnesium fluoride, and fluorine based polymers. Since the refractive index of the transparent substrate is commonly about 1.5-about 1.7, the refractive index of the low refractive index layer is preferably at most approximately 1.5, but is more preferably at most 1.35.

Further, thickness of the low refractive index medium is preferably at least two times the wavelength in the medium. The reason is that when the thickness of the low refractive index medium reaches nearly the wavelength of light so that electromagnetic waves oozed via evernescent enter into the substrate, effects of the low refractive index layer are lowered.

The method in which the interface which results in total reflection or a diffraction grating is introduced in any of the media is characterized in that light extraction efficiency is significantly enhanced. The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced.

However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is desirous. In this case, the cycle of the diffraction grating is preferably about ½-about 3 times the wavelength of light in the medium.

The preferable arrangement of the diffraction grating is such that the arrangement is two-dimensionally repeated in the form of a square lattice, a triangular lattice, or a honeycomb lattice.

<<Light Collection Sheet>>

Via a process to arrange a structure such as a micro-lens array shape on the light extraction side of the organic EL element of the present invention or via combination with a so-called light collection sheet, light is collected in the specific direction such as the front direction with respect to the light emitting element surface, whereby it is possible to enhance luminance in the specific direction.

In an example of the micro-lens array, square pyramids to realize a side length of 30 μm and an apex angle of 90 degrees are two-dimensionally arranged on the light extraction side of the substrate. The side length is preferably 10-100 μm. When it is less than the lower limit, coloration results due to generation of diffraction effects, while when it exceeds the upper limit, the thickness increases undesirably.

It is possible to employ, as a light collection sheet, for example, one which is put into practical use in the LED backlight of liquid crystal display devices. It is possible to employ, as such a sheet, for example, the luminance enhancing film (BEF), produced by Sumitomo 3M Limited.

As shapes of a prism sheet employed may be, for example, Δ shaped stripes of an apex angle of 90 degrees and a pitch of 50 μm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

<<Preparation Method of Organic EL Element>>

As one example of the preparation method of the organic EL element of the present invention, the preparation method of the organic EL element composed of "anode/positive hole injection layer/positive hole transport layer/light emitting layer/positive hole inhibiting layer/electron transport layer/cathode buffer layer/cathode" will be described.

Initially, a thin film composed of desired electrode substances, for example, anode substances is formed on an appropriate base material to reach a thickness of at most 1 μm but preferably 10-200 nm, employing a method such as vapor deposition or sputtering, whereby an anode is prepared. Subsequently, on the above, formed are organic compound thin layers including a positive hole injection layer, a positive hole transport layer, a light emitting layer, a positive hole inhibition layer, an electron transport layer, and an electron injection layer, which are organic EL element materials.

Methods to form each of these layers include, as described above, a spin coating method, a cast method, an ink-jet method, a vapor deposition method and a printing method. In view of easy formation of a homogeneous film and rare formation of pin holes, preferred coating methods are the spin coating method and the vapor deposition method. Different coating methods may be applied for different layers.

When a vapor deposition method is adopted for making a layer, the condition of a vapor deposition varies depending on the compounds employed. It is generally preferable to select the conditions of: heating temperature of a boat, 50 to 450° C.; vacuum degree, 10-6 to 10-2 Pa; deposition rate, 0.01 to 50 nm/sec; temperature of a substrate, −50 to 300° C.; and layer thickness, 0.1 to 5 □m.

After forming these layers, a thin layer composed of cathode materials is formed on the above layers via a method such as vapor deposition or sputtering so that the film thickness reaches at most 1 μm, but is preferably in the range of 50-200 nm, whereby a cathode is arranged, and the desired organic EL element is prepared.

Further, by reversing the preparation order, it is possible to achieve preparation in order of a cathode, a cathode buffer layer, an electron transport layer, a positive hole prohibiting layer, a light emitting layer, a positive hole transport layer, a positive hole injection layer, and an anode.

When direct current voltage is applied to the multicolor display device prepared as above, the anode is employed as + polarity, while the cathode is employed as − polarity. When 2-40 V is applied, it is possible to observe light emission. Further, alternating current voltage may be applied. The wave form of applied alternating current voltage is not specified.

When an organic EL element of the present invention is prepared, it is preferred to make all of the layers from a cathode layer to a positive hole injection layers without interruption and with one time evacuation. However, it may be possible to take out the intermediate product and may apply it a different layer making process. For that purpose, it is required to carry out the operation under a dry inert gas atmosphere.

<<Application>>

It is possible to employ the organic EL element of the present invention as display devices, displays, and various types of light emitting sources. Examples of light emitting sources include, but are not limited to lighting apparatuses (home lighting and car lighting), clocks, backlights for liquid crystals, sign advertisements, signals, light sources of light memory media, light sources of electrophotographic copiers, light sources of light communication processors, and light sources of light sensors. It is effectively employed especially as backlights of liquid crystal display devices and lighting sources.

If needed, the organic EL element of the present invention may undergo patterning via a metal mask or an ink-jet printing method during film formation. When the patterning is carried out, only an electrode may undergo patterning, an electrode and a light emitting layer may undergo patterning, or all element layers may undergo patterning. During preparation of the element, it is possible to employ conventional methods.

Figure 4:
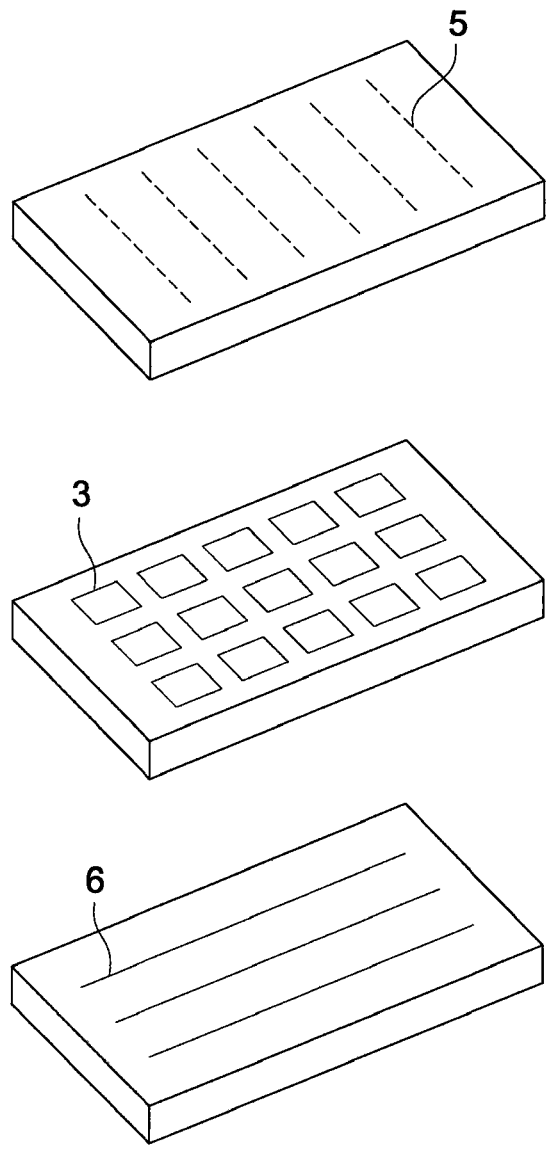
FIG. 4 is a schematic drawing of a full-color display device driven with a passive matrix method.

Color of light emitted by the organic EL element of the present invention and compounds according to the present invention is specified as follows. In FIG. 4.16 on page 108 of "Shinpen Shikisai Kagaku Handbook (New Edition Color Science Handbook)" (edited by The Color Science Association of Japan, Tokyo Daigaku Shuppan Kai, 1985), values determined via a spectroradiometric luminance meter CS-1000 (produced by Konica Minolta Sensing Inc.) are applied to the CIE chromaticity coordinate, whereby the color is specified. Further, when the organic EL element of the present invention is a white element, "white", as described herein, means that when 2-degree viewing angle front luminance is determined via the aforesaid method, the color temperature at 1000 cd/m2 is in the range of 7000 to 2500 K (the deviation from black body locus □uv=±0.02).

<<Display Device>>

The display device of the present invention will now be described.

The display device of the present invention incorporates the organic EL elements of the present invention.

The constitution of the organic EL element incorporated in the display device is selected from constitutional examples of the aforesaid organic EL element.

Further, the manufacturing method of the organic EL element is one which has been shown in one embodiment of manufacturing the aforesaid organic EL element of the present invention.

When direct current voltage is applied to the resulting display device, it is possible to observe light emission via application of a voltage of 2-40 V, while the polarity of the anode is "+" and the polarity of the cathode is "−". Further, when reverse polarity voltage is applied, no electric current flows, and no light emission results. Still further, when alternating current voltage is applied, light emission results only in a state in which the polarity of the anode is "+" and the polarity of the cathode is "−". Incidentally, any waveform of applied alternating current is feasible.

Display devices are employable as a display device, a display, and various light emitting light sources. Such display devices and displays include television, personal computers, mobile equipment, AV equipment, teletext displays, and vehicular information displays. Specifically, it may be employed as a display device reproducing still and moving images. The drive system when employed as a display device for moving-image reproduction may be either a simple matrix (a passive matrix) system or an active matrix system.

Light emitting light sources include home lighting, car interior lighting, backlight for watches and liquid crystals, advertising displays, traffic lights, light sources for light memory media, light sources for electrophotographic copiers, light sources for light communication processors, and light sources for light sensors, however the present invention is not limited to only these.

One example of a display device, incorporating the organic EL element of the present invention, will now be described with reference to figures.

FIG. 1 is a schematic view showing one example of a display device which is composed of an organic EL element. It is a schematic view of a display, such as a cellular telephone display, which displays image information via light emission of an organic EL element.

Display 1 is composed of display section A having a plurality of pixels and control section B which conducts image scanning based on image information.

Control section B is electrically connected to display section A. Scanning signals and image data signals are transmitted to each of the plural pixels based on the image information from the exterior, and the pixels of each scanning line sequentially emit light via the scanning signals depending on image data signals, followed by image scanning, whereby image information is displayed on display section A.

Figure 2:
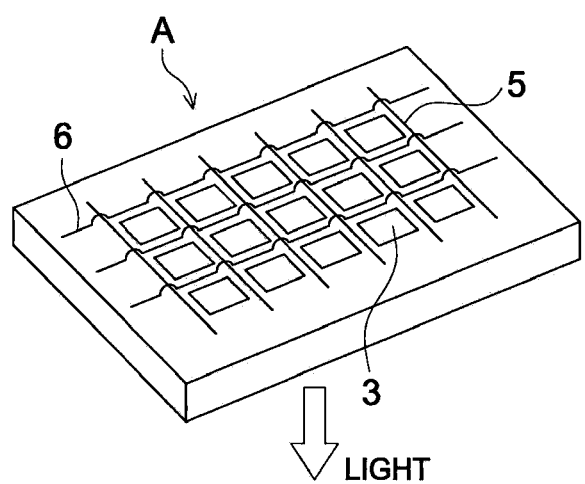
FIG. 2 is a schematic drawing of a display section A.

FIG. 2 is a schematic view of display section A. Display section A incorporates, a wiring section incorporating plural scanning lines 5 and data lines 6 as well as plural pixels 3 on the substrate. The major member of display section A will now be described.

In FIG. 2, shown is a case in which light emitted by pixel 3 is extracted in the white arrow direction (the downward direction).

Scanning lines 5 and plural data lines 6 are each composed of electrically conductive materials and scanning lines 5 and data lines 6 are orthogonally arranged in a lattice and connected to pixel 3 in the orthogonally arranged position (not shown in detail). When scanning signals are applied to pixels 3 from scanning lines 5, pixels 3 receive image data signals from data lines 6, followed by light emission depending on the receiving image data.

By appropriately arranging parallel pixels emitting light in the red region, in the green region, and in the blue region, it is possible to achieve a full-color display.

The light emitting process will now be described.

Figure 3:
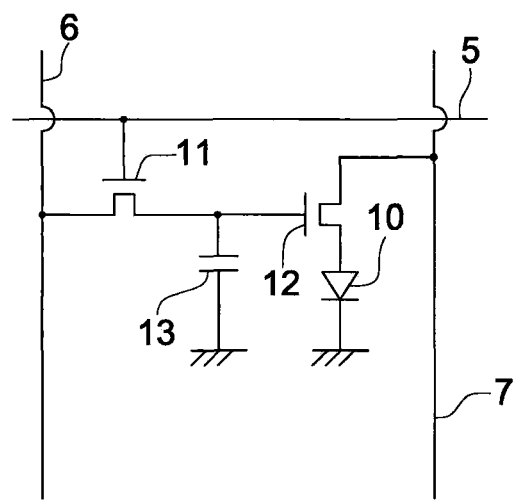
FIG. 3 is a schematic drawing of a pixel.

FIG. 3 is a schematic view of a pixel. The pixel incorporates organic EL element 10, switching transistor 11, drive transistor 12, and condenser 13. As organic EL element 10, red, green, and blue light emitting organic EL elements are employed in a plurality of pixels. It is possible to achieve a full-color display by arranging parallel these on the same substrate.

In FIG. 3, image data signals are applied to the drain of switching transistor 11 via data lines 6 from control section B. Subsequently, when scanning signals are applied to the gate of switching transistor 11 via scanning lines 5 from control section B, the drive of switching transistor 11 is activated, and image data signals applied to the drain are transmitted to the gate of condenser 13 and drive transistor 12.

Via transmission of image data signals, condenser 13 is charged depending on the electric potential of the image data signals, and simultaneously, drive of drive transistor 12 is activated. In drive transistor 12, the drain is connected to power source line 7, and the source is connected to the electrode of organic EL element 10, and an electric current is fed to organic EL element 10 from power source line 7, depending on the electric potential of the image data signals applied to the gate.

When scanning signals are transferred to the following scanning lines 5 via sequential scanning of control section B, drive of switching transistor 11 is deactivated. However, even though the drive of switching transistor 11 is activated, condenser 13 maintains the electric potential of charged image data signals, whereby the drive of drive transistor 12 is maintained in an on-state and light emission of organic EL element 10 continues until the following scanning signals are applied. When the following scanning signals are applied via sequential scanning, drive transistor 12 is driven depending on the electric potential of the following image data signals synchronized with scanning signals, whereby organic EL element 10 emits light.

Namely, light emission of organic EL element 10 is carried out in such a manner that switching transistor 11, which is an active element, and drive transistor 12 are arranged in organic EL element 10 of each of the plural pixels and organic EL element 10 of each of the plural pixels 3 emits light. The aforesaid light emitting method is called an active matrix system.

Light emission of organic EL element 10 may be light emission at a plurality of gradations via multi-valued image data having a plurality of gradation potentials or may be on and off of specified light emitting amount via binary image data signals. Further, the electric potential of condenser 13 may be maintained until application of the next scanning signals, or discharge may be carried out immediately prior to application of the next scanning signals.

The present invention is not limited to the aforesaid active matrix system. The light emission drive of a passive matrix system is also feasible, in which an organic EL element emits light based on data signals only when scanning signals are scanned.

FIG. 4 is a schematic view of a display device based on the passive matrix system. In FIG. 4, plural scanning lines 5 and plural image data lines 6 are arranged to form a lattice while sandwiching pixel 3. When scanning signals of scanning lines 5 are applied via sequential scanning, pixels 3 connected to applied scanning lines 5 emit light based on image data signals.

In the passive matrix system, no active element is incorporated to effect decreased production cost.

<<Lighting Devices>>

Lighting devices of the present invention will now be described. The lighting devices of the present invention incorporate the aforesaid organic EL element.

The organic EL element of the present invention may be employed as one having a resonator structure. Intended uses of the aforesaid organic EL element having the resonator structure include, but are not limited to, light sources for light memory media, light sources for electrophotographic copiers, light sources for light communication processors, and light sources for light sensors. Further, via laser oscillation, it may be employed for the aforesaid uses.

Further, the organic EL element of the present invention may be employed as a type of lamp for lighting or an exposure light source, a projection device such a type of projecting images, and a still image and moving image directly viewing type display device (a display).

A drive system employed as a moving image reproducing display device may be either a simple matrix (a passive matrix) system or an active matrix system. Alternatively, by employing at least two types of the organic EL elements of the present invention having different emitted light colors, it is possible to produce a full-color display device.

Further, the organic EL materials of the present invention may be applied to an organic EL element which substantially emits white light. White light emission is obtained via simultaneous emission of a plurality of colors via a plurality of light emitting materials. Combinations of a plurality of such emitted light colors may include three emitted light maximum wavelengths of the three primary colors of blue, green, and red, or may include two emitted light maximum wavelengths utilizing the complementary color relationship such as blue and yellow or bluish-green and orange.

Further, combinations of light emitting materials to obtain a plurality of emitted light colors include any of the combinations in which a plurality of phosphorescence or fluorescence emitting materials is combined or in which light emitting materials emitting fluorescence or phosphorescence and dye materials, which emit light as excited light from light emitting materials, are combined. However, in the white organic EL elements according to the present invention, it is sufficient that only a plurality of light emitting dopants is combined.

It is sufficient that during formation of a light emitting layer, a positive hole transport layer or an electron transport layer, a mask is arranged and a simple arrangement such as coated separation via the mask is carried out. The other layers require no common patterning such as a mask, and for example, an electrode film can be formed on one side via a vacuum deposition method, a casting method, a spin coating method an ink-jet method, or a printing method, whereby productivity is enhanced.

According to this method, the element itself emits white light, differing from the white organic EL device in which light emitting elements emitting a plurality of colors are paralleled to form an array.

Materials employed in the light emitting layer are not particularly limited. For example, with regard to a backlight in a liquid crystal display element, white may be realized by selecting and combining any of the metal complexes according to the present invention or prior art light emitting materials to match with the wavelength region corresponding to CF (color filter) characteristics.

<<One Embodiment of Lighting Device of Present Invention>>

One embodiment of the lighting device incorporating the organic EL element of the present invention will now be described.

The non-light emitting surface of the organic EL element of the present invention is covered with a glass case, and a 300 µm thick glass substrate is employed as a sealing substrate. As a sealing material, an epoxy based light curable type adhesive (LUXTRACK LC0629B produced by Toagosei Co., Ltd.) is applied to the periphery, and the resulting product is superposed onto the cathode to be brought into close contact with the transparent supporting substrate, followed by curing by exposing the glass substrate side to UV radiation and sealing, whereby it is possible to form the lighting devices, shown in FIGS. 5 and 6.

Figure 5:
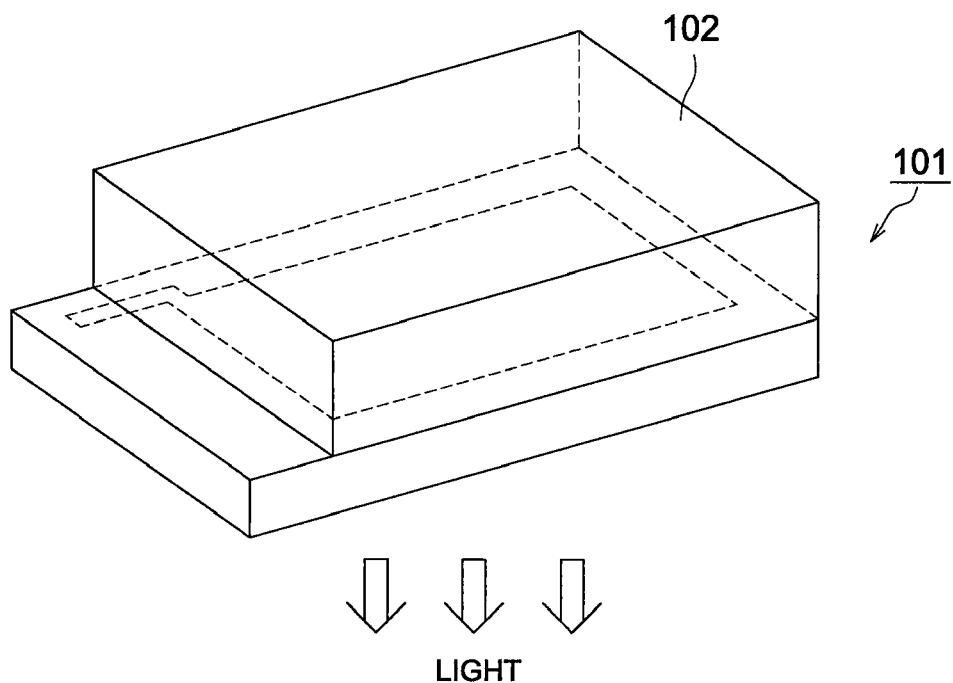
FIG. 5 is a schematic drawing of a lighting device.

FIG. 5 is a schematic view of a lighting device. Organic EL element 101 of the present invention is covered with glass cover 102 (incidentally, sealing via the glass cover was carried out in a glove box (in an ambience of high purity nitrogen gas of a purity of at least 99.999%) under nitrogen ambience) without allowing contact of organic EL element 101 with the ambient atmosphere).

Figure 6:
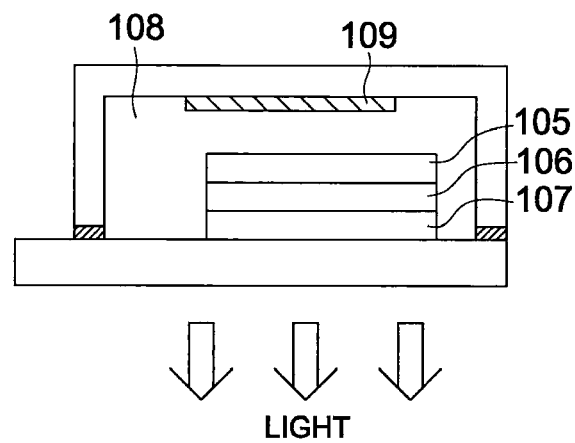
FIG. 6 is a schematic cross-sectional view of a lighting device.
Figure 7A:
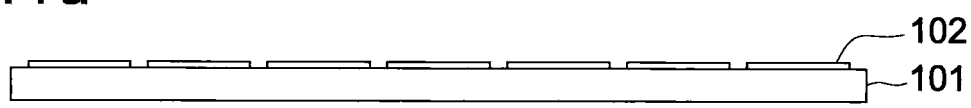
FIG. 7 is a schematic constitutional view of an organic EL full-color display device.
Figure 7B:
Figure 7C:
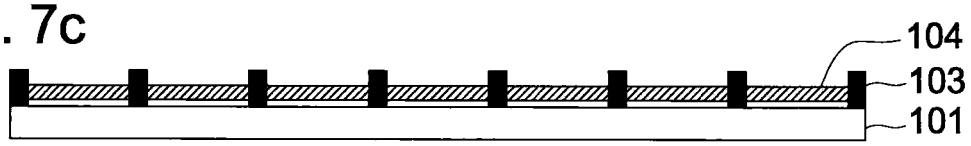
Figure 7D:
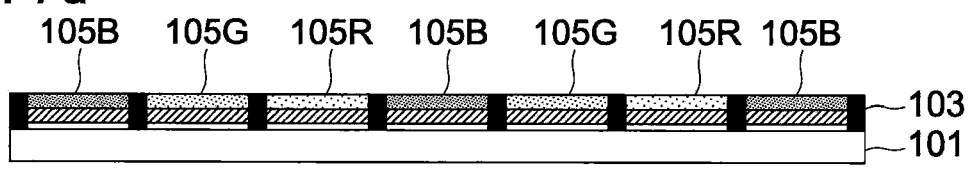
Figure 7E:
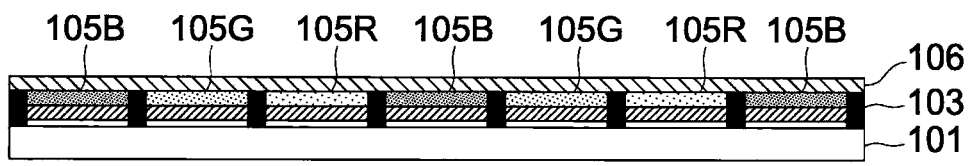

FIG. 6 is a cross-sectional view of the lighting device. In FIG. 6, 105 represents a cathode, 106 represents an organic EL layer, and 107 represents a glass substrate incorporating a transparent electrode.

The interior of glass cover 102 is filled with nitrogen gas 108, and water catching agent 109 is provided.

EXAMPLES

The present invention will now be described with reference to examples, however the present invention is not limited thereto. Further, structures of the compounds employed in the following examples are shown below.

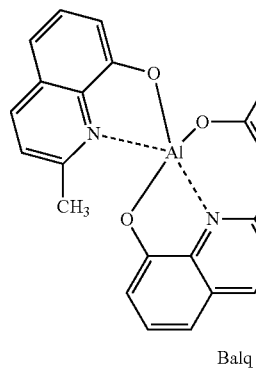
Balq

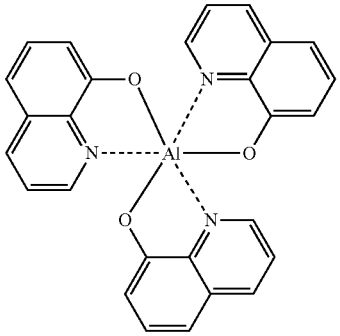
Alq$_3$

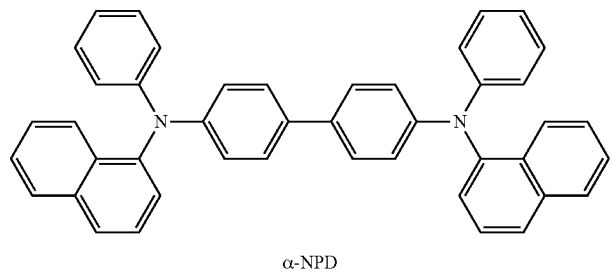
α-NPD

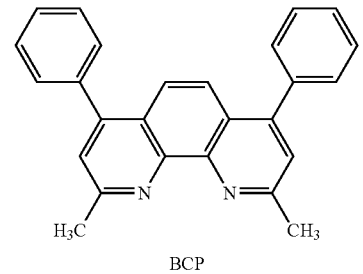
BCP

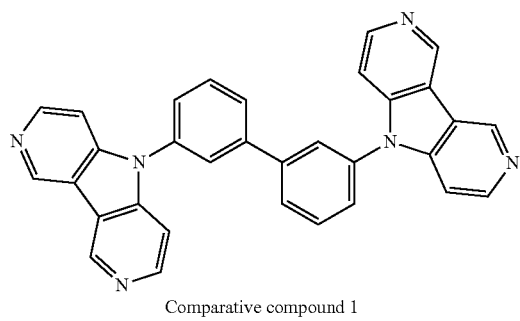
Comparative compound 1

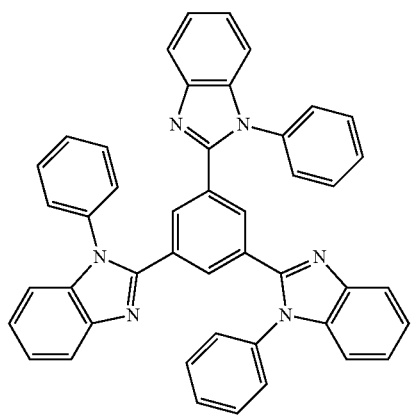
Comparative compound 2

131 132
-continued
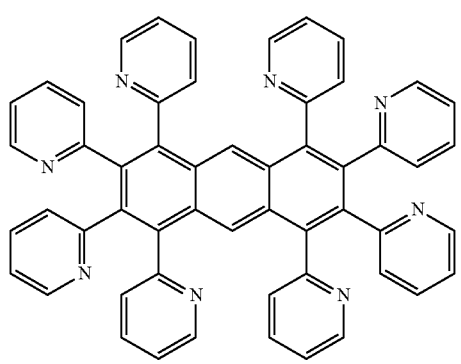
Comparative compound 3
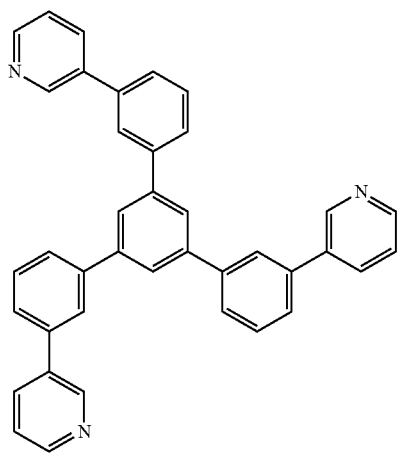
Comparative compound 4
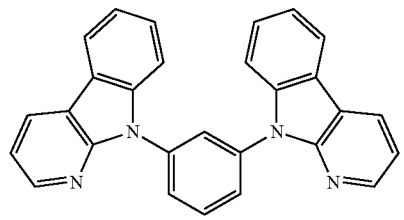
Comparative compound 5
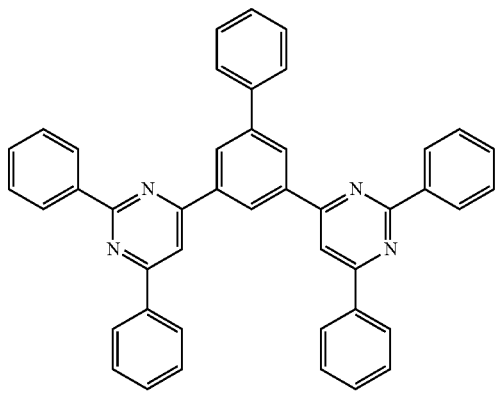
Comparative compound 6
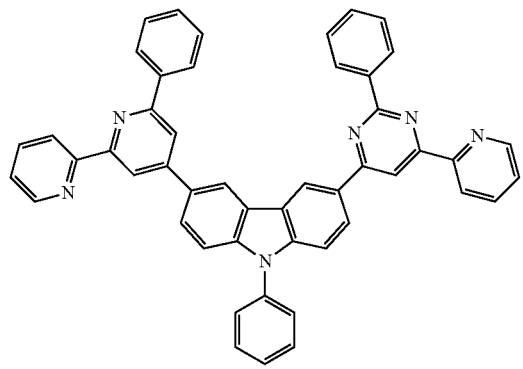
Comparative compound 7
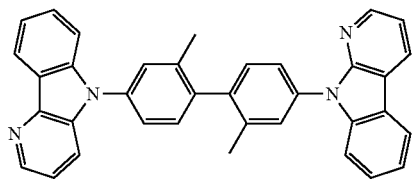
Comparative compound 8
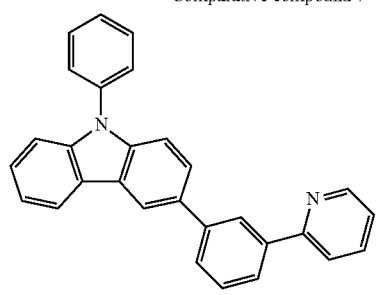
Comparative compound 9
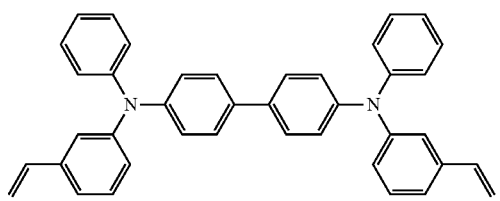
Positive hole transport material 1

-continued

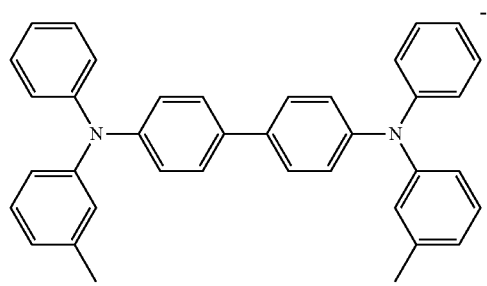

TPD

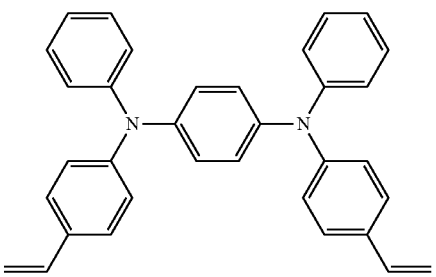

Positive hole transport material 3

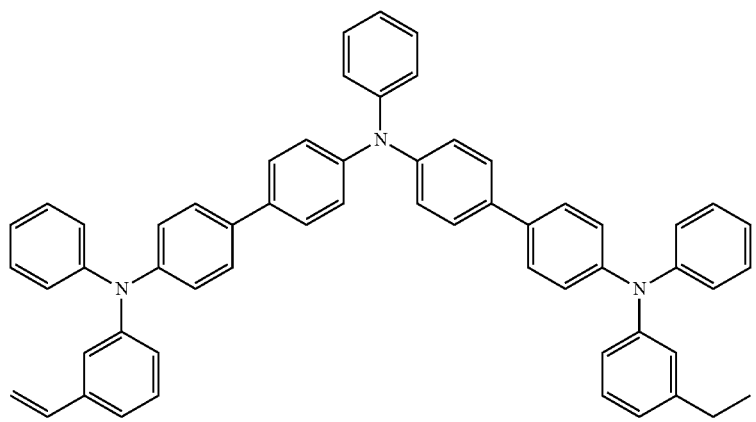

Positive hole transport material 4

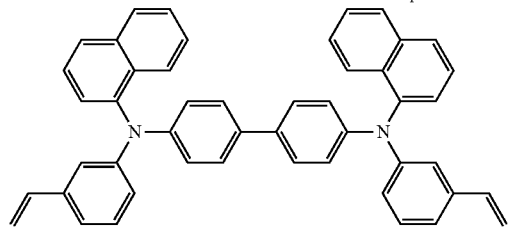

Positive hole transport material 5

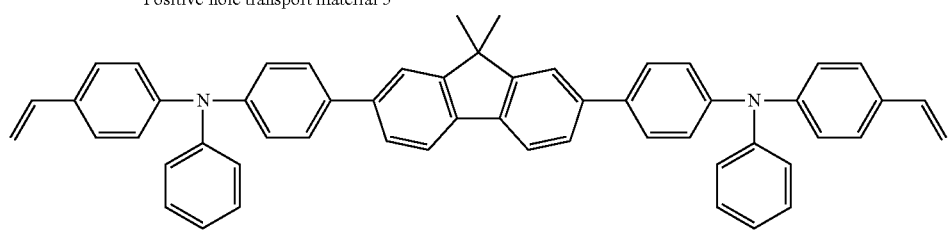

Positive hole transport material 6

Example 1

Preparation of Organic EL Element 1-1

After carrying out patterning onto a substrate (NA-45 produced by NH Techno Glass Corp.) having thereon a 150 nm ITO film as an anode, the above transparent supporting substrate arranged with the ITO transparent electrode was subjected to ultrasonic washing with iso-propyl alcohol, and was dried via desiccated nitrogen gas, followed by UV ozone cleaning for 5 minutes.

The aforesaid transparent supporting substrate was fixed onto the substrate holder of a commercial vacuum deposition apparatus. At the same time, each of α-NPD, H-4, Ir-12, BAlq, and Alq3 was placed in a tantalum resistance heating boat and fitted to a vacuum deposition apparatus (being a first vacuum tank).

Further, lithium fluoride was placed in a tantalum resistance heating boat and aluminum was placed in tungsten resistance boat, and both were mounted on the second vacuum tank of the vacuum deposition apparatus.

Initially, after reducing the pressure of the first vacuum tank to 4×10-4 Pa, the aforesaid heating boat incorporating α-NPD was electrically heated, and vacuum deposition was carried out onto the transparent supporting substrate at a vacuum deposition rate of 0.1-0.2 nm/second until the film thickness reached 20 nm, whereby a positive hole injection/transport layer was prepared.

Further, the aforesaid heating boats incorporating Ha and Ir-12 were independently electrically driven, and vacuum deposition was carried out so that the vacuum deposition rate of H4 as a light emitting host and Ir-12 as a light emitting dopant was regulated to result in 100:6 to reach a film thickness of 30 nm, whereby a light emitting layer was prepared.

Subsequently, the aforesaid heating boat incorporating BAlq was electrically heated, and a positive hole inhibiting layer at a thickness of 10 nm was prepared at a vacuum deposition rate of 0.1-0.2 nm/second. Further, the aforesaid heating boat incorporating Alq3 was electrically heated, and an electron transport layer at a thickness of 10 nm was prepared at a vacuum deposition rate of 0.1-0.2 nm/second.

Subsequently, the element, which had been subjected to film formation until the electron transport layer, was transferred to a second vacuum tank. Thereafter, remote control from the exterior of the apparatus was carried out so that a stainless steel mask perforated in a rectangular shape was placed on the electron transport layer.

After the pressure of the second vacuum tank was reduced to 2×10-4 Pa, a boat incorporating lithium fluoride was electrically driven and a 0.5 nm thick cathode buffer layer was prepared at an vacuum deposition rate of 0.01-0.02 nm/second. Subsequently, a boat incorporating aluminum was electrically driven and a 150 nm thick cathode was prepared at a vacuum deposition rate of 1-2 nm/second, whereby Organic EL Element 1-1 was realized.

<<Preparation of Organic EL Elements 1-2-1-7>>

Each of Organic EL Elements 1-2-1-7 was prepared in the same manner as Organic EL Element 1-1, except that the electron transport compound in the electron transport layer was changed from $Alq_3$ to each of the compounds listed below.

<<Evaluation of Organic EL Elements 1-1-1-7>>

The resulting Organic EL Elements 1-1-1-7 were evaluated as follows. After preparation, each non-light emitting surface of the organic EL element was covered with a glass case. A 300 μm thick glass substrate was employed as a sealing substrate, and an epoxy based light curable type adhesive (LUX-TRACK LC0629B produced by Toagosei Co., Ltd.) was applied to the periphery as a sealing material. The resulting product was superposed onto the aforesaid cathode to be brought into close contact with the aforesaid transparent supporting substrate. Subsequently, curing was carried out via exposure of UV radiation to the glass substrate side, followed by sealing, whereby the lighting devices shown in FIGS. 5 and 6 were produced. The resulting devices were then evaluated.

(External Extraction Quantum Efficiency)

An organic EL element was allowed to emit light at room temperature (about 23-about 25° C.) under the condition of a constant electric current of 2.5 mA/cm2, and by determining emitted light luminance (L) in cd/m2 immediately after lighting, external extraction quantum efficiency (η) was calculated.

The emitted light luminance was determined via CS-1000 (produced by Konica Minolta Sensing, Inc.).

The external extraction quantum efficiency was represented by a relative value when Organic EL Element 1 resulted in 100.

(Drive Voltage)

When organic EL elements were driven at room temperature (about 23-about 25° C.) under the condition of a constant electric current of 2.5 mA/cm2, the resulting voltage was respectively determined. As the measurement results show below, each relative value is listed when Organic EL Element 1-1 (Comparative Example) resulted in 100.

Voltage=(drive voltage of each element/drive voltage of Organic EL Element 1-1)×100.

A smaller value indicates that the drive voltage is lower than the comparative.

The obtained results are shown in Table 1 below.

TABLE 1

| Element No. | Electron Transport Compound | Drive Voltage (V) (relative value) | External Extraction Quantum Efficiency (%) | Remarks |
|---|---|---|---|---|
| 1-1 | Alq3 | 100 | 100 | Comparative Example |
| 1-2 | Comparative Compound 9 | 91 | 122 | Comparative Example |
| 1-3 | Compound 4 | 80 | 142 | Present Invention |
| 1-4 | Compound 5 | 72 | 141 | Present Invention |
| 1-5 | | 93 | 82 | 138 Present Invention |
| 1-6 | | 94 | 85 | 135 Present Invention |
| 1-7 | | 95 | 87 | 129 Present Invention |

As can be clearly seen from the above, organic EL elements prepared via the compounds according to the present invention enable achievement of a higher light emitting efficiency and a lower drive voltage, compared to comparative organic EL elements.

Example 2

Preparation of Full-Color Display Device (Preparation of Blue Light Emitting Element)

Organic EL Element 1-4 of Example 1 was employed as a blue light emitting element.

(Preparation of Green Light Emitting Element)

A green light emitting element was prepared in the same manner as Organic EL Element 1-4 of Example 1, except that Ir-12 was replaced with Ir-1. The resulting element was employed as a green light emitting element.

(Preparation of Red Light Emitting Element)

A red light emitting element was prepared in the same manner as Organic EL Element 1-4 of Example 1, except that Ir-12 was changed to Ir-9. The resulting element was employed as a red light emitting element.

Red, green, and blue light emitting organic EL elements, prepared as above, were arranged in parallel on the same substrate, whereby the active matrix system full-color display device as shown in FIG. 1 was prepared. FIG. 2 only shows the schematic view of display section of the aforesaid prepared display device.

Namely, on one substrate, incorporated are a wiring section having a plurality of scanning lines 5 and data lines 6, and a plurality of parallel arranged pixels 3 (pixels which emit light in the red region, pixels which emit light in the green region, and pixels which emit light in the blue region). Scanning lines 5 and a plurality of data lines 6 are composed of electrically conductive materials, and scanning lines 5 and data lines 6 are orthogonally arranged to form a lattice, while these lines are connected to each pixel 3 in the orthogonally arranged position (not shown in detail).

A plurality of aforesaid pixels 3 is driven via the active matrix system in which an organic EL element corresponding to each of the emitted light colors, and each of the switching transistors which are active elements, and the drive transistors are arranged. When the scanning signals from scanning lines 5 are applied, image data signals from data lines 6 are received, whereby light is emitted based on the received image data. As mentioned above, by appropriately arranging red, green, and blue pixels in parallel, a full-color display device was prepared.

It was found that by driving the aforesaid full-color display device, distinct full-color moving images exhibiting high luminance and high durability were produced.

Example 3

<<Preparation of White Light Emitting Element and White Lighting Device>>

Patterning was applied to the electrode at an area of 20 mm×20 mm of the transparent electrode substrate of Example 1, and thereon, a 25 nm thick α-NPD film was formed as a positive hole injection/transport layer in the same manner as Example 1. Further, the aforesaid heating boat incorporating H-4, the boat incorporating Exemplified Compound Ir-13, and the boat incorporating Ir-9 were independently electrically driven. By regulating the deposition rate of H-4 as a light emitting host as well as Ir-13 and Ir-9 as a light emitting dopant to 100:5:0.6 until the film thickness reached 30 nm, whereby a light emitting layer was prepared.

Subsequently, a 10 nm thick BAlq film was arranged to form a positive hole blocking layer. Further, a 40 nm thick Exemplified Compound 5 film was formed to prepare an electron transport layer.

Subsequently, in the same manner as Example 1, arranged, on the electron injection layer, was a square perforated stainless steel mask having almost the same shape as the transparent electrode, and a 0.5 nm lithium fluoride film as a cathode buffer layer and a 150 nm aluminum film as a cathode were formed via vacuum deposition.

The resulting element was arranged in a sealing can via the same method and structure as for Example 1, whereby the flat lamps, shown in FIGS. 5 and 6, were produced. When the resulting lamp was electrically driven, nearly white light was emitted, and was found to be feasible as a lighting device.

Example 4

Preparation of Organic EL Elements 4-1

After carrying out patterning onto a substrate (NA-45 produced by NH Techno Glass Corp.) which was prepared by forming a 100 nm ITO (indium tin oxide) film as an anode on the aforesaid 100 mm×100 mm×1.1 mm glass, the above transparent supporting substrate, arranged with the ITO transparent electrode, was subjected to ultrasonic wave washing with isopropyl alcohol, was dried via desiccated nitrogen gas, and then was further subjected to UV ozone washing for 5 minutes.

A thin film was formed on the resulting transparent supporting substrate via a spin coating method under conditions of 3,000 rpm and 30 seconds, employing a solution prepared by diluting poly(3,4-ethylenedioxythiophen)-polystyrene sulfonate (PEDOT/PSS, BAYTRON P Al 4083, produced by Bayer Co.,) to 70% via pure water. Thereafter, drying was carried out at 200° C. for one hour, whereby a 20 nm thick positive hole transport layer was prepared.

The resulting substrate was transferred into a nitrogen atmosphere, and a thin film was formed on the positive hole transport layer via the spin coating method, under conditions of 1,500 rpm and 30 seconds, applying a solution prepared by dissolving 50 mg of Positive Hole Transport Material 1 in 10 ml of toluene onto the above positive hole transport layer. Further, ultraviolet radiation was exposed for 180 seconds to carry out photopolymerization and cross-linkage, whereby an approximately 20 nm thick second positive hole transport layer was formed.

A thin film was formed on the above second positive hole transport layer via the spin coating method under conditions of 600 rpm and 30 seconds, employing a solution prepared by dissolving 100 mg of H31 and 10 mg of Ir-1 in 10 ml of toluene. Vacuum drying was carried out at 60° C. for one hour, whereby an approximately 70 nm thick light emitting layer was formed.

Subsequently, a thin film was formed on the above light emitting layer via the spin coating method under conditions of 1,000 rpm and 30 seconds, employing a solution prepared by dissolving 50 mg of Comparative Compound 1 in 10 ml of hexafluoroisopropanol (HFIP). Further, vacuum drying was carried out at 60° C. for one hour, whereby an approximately 30 nm thick electron transport layer was formed.

Subsequently, the resulting substrate was fixed onto the substrate holder of a vacuum deposition apparatus. After reducing the pressure of the vacuum tank to 4×10-4 Pa, 0.4 nm lithium fluoride as a cathode buffer layer and further 110 nm aluminum as a cathode were deposited, whereby Organic EL Element 4-1 was prepared.

<<Preparation of Organic EL Elements 4-2-4-8>>

Organic EL Elements 4-2-4-8 were prepared in the same manner as Organic EL element 4-1, except that Comparative Compound 1 was replaced with the compounds described below.

<<Evaluation of Organic EL Elements 4-1-4-8>>

Prepared Organic EL Elements 4-1-4-8 were evaluated as follows. After preparation, the non-light emitting surface of each of the organic EL elements was covered with a glass case. An epoxy based light-curable type adhesive (LUX-TRACK LC0629B, produced by Toagosei Co., Ltd.) was applied as a sealing agent to the periphery of the glass cover side where the glass cover was in contact with the glass substrate on which the organic El element was prepared. The resulting product was superposed onto the aforesaid cathode electrode side to be brought into close contact with the aforesaid transparent supporting substrate. Subsequently, curing was carried out via exposure of UV radiation to the glass substrate side, followed by sealing, whereby the lighting devices shown in FIGS. 5 and 6 were produced. The resulting devices were then evaluated.

Storage stability of Organic EL Elements 4-1-4-8 was evaluated via the measurement method describe below.

(Storage Stability)

Each organic EL element was stored at 85° C. for 24 hours. Luminance of each prior to and after the storage was determined at a constant electric current drive of 2.5 mA/cm2. Each luminance ratio was obtained according to the following formula, and the resulting value was employed as an index of storage stability.

Storage stability (%)=luminance (2.5 mA/cm$^2$) after storage/luminance (2.5 mA/cm$^2$) prior to storage The results are listed in the following table 2.

TABLE 2

| Element No. | Electron Transport Compound | Storage Stability (%) | Remarks |
|---|---|---|---|
| 4-1 | Comparative Compound 1 | 29 | Comparative Example |
| 4-2 | Comparative Compound 2 | 46 | Comparative Example |
| 4-3 | 36 | 71 | Present Invention |
| 4-4 | 50 | 75 | Present Invention |
| 4-5 | 25 | 86 | Present Invention |
| 4-6 | 96 | 77 | Present Invention |
| 4-7 | 97 | 66 | Present Invention |
| 4-8 | 98 | 61 | Present Invention |

As can be seen from the above, the organic EL elements of the present invention exhibited excellent storage stability, compared to the Comparative Examples.

Example 5

Preparation of Organic EL Element 5-1

After carrying out patterning onto a substrate (NA-45 produced, by NH Techno Glass Corp.) which was prepared by forming a 100 nm ITO (indium tin oxide) film as an anode on the aforesaid 100 mm×100 mm×1.1 mm glass, the above transparent supporting substrate arranged with the ITO transparent electrode was subjected to ultrasonic wave washing with isopropyl alcohol, was dried via desiccated nitrogen gas, and then was subjected to further UV ozone washing for 5 minutes.

The resulting transparent supporting substrate was fixed onto the substrate holder of a commercial vacuum deposition apparatus. At the same time, 200 mg of TPD was placed in a molybdenum resistance heating boat, 200 mg of H34 as a host compound was placed in another molybdenum resistance heating boat, Ir-25 was placed in still another molybdenum resistance heating boat, and Comparative Compound 3 was placed in still yet another molybdenum resistance heating boat. Subsequently, all boats were mounted onto the vacuum deposition apparatus.

Subsequently, after reducing the pressure of the vacuum tank to 4×10-4 Pa, the aforesaid heating boat incorporating TPD was electrically heated, and vacuum deposition was carried out onto the transparent supporting substrate at a vacuum deposition rate of 0.1 nm/second, whereby a positive hole transport layer was prepared. Further, the aforesaid boats, each incorporating H34 and Ir-25, were electrically heated, and co-vacuum deposition was carried at a vacuum deposition rate of 0.2 nm/second and 0.012 nm/second, respectively, onto the aforesaid positive hole transport layer, whereby a light emitting layer was prepared.

During the above vacuum deposition, the substrate was at room temperature. Further, the aforesaid boat incorporating Comparative Compound 3 was electrically heated, and vacuum deposition was carried out onto the aforesaid light emitting layer at a vacuum deposition rate of 0.1 nm/second, whereby an electron transport layer was prepared. During the above vacuum deposition, the substrate was at room temperature.

Further, 0.5 nm lithium fluoride and 110 nm aluminum were vacuum-deposited to form a cathode, whereby Organic EL Element 5-1 was prepared.

<<Preparation of Organic EL Elements 5-2-5-6>>

Each of Organic EL Elements 5-2-5-6 was prepared in the same manner as Organic EL Element 5-1, except that Comparative Compound 3 was replaced with each of the compounds described below in Table 3.

<<Evaluation of Organic EL Elements 5-1-5-6>>

Prepared Organic EL Elements 5-1-5-6 were evaluated as follows. Each of them was sealed in the same manner as Organic EL Element 1, and lighting devices shown in FIGS. 5 and 6 were formed and evaluated.

The organic EL elements prepared as above were evaluated. The results are shown below.

<Storage Stability>

An organic EL element was stored under conditions of 60° C. and 70% relative humidity for one month. In the same manner as Example 1, luminance of each at a constant electric current drive of 5 mA/cm2 prior to and after storage was determined. Subsequently, each luminance ratio was obtained based on the following formula, and the resulting value was employed as an index of storage stability.

Storage stability (%)=luminance after storage (2.5 mA/cm2)/luminance prior to storage (2.5 mA/cm2)×100

The results are shown below in Table 3.

TABLE 3

| Element No. | Electron Transport Compound | Storage Stability (%) | Remarks |
|---|---|---|---|
| 5-1 | Comparative Compound 3 | 38 | Comparative Example |
| 5-2 | Comparative Compound 4 | 30 | Comparative Example |
| 5-3 | 55 | 76 | Present Invention |
| 5-4 | 99 | 72 | Present Invention |
| 5-5 | 100 | 65 | Present Invention |
| 5-6 | 101 | 56 | Present Invention |

As can be seen from the above, the organic EL elements of the present invention exhibited excellent storage stability, compared to Comparative Examples.

Example 6

Preparation of Organic EL Element 6-1

After carrying out patterning onto a substrate (NA-45, produced by NH Techno Glass Corp.) which was prepared by forming a 100 nm ITO (indium tin oxide) film as an anode on the aforesaid 100 mm×100 mm×1.1 mm glass, the above transparent supporting substrate arranged with the ITO transparent electrode was subjected to ultrasonic wave washing with isopropyl alcohol, was dried via desiccated nitrogen gas, and then was subjected to further UV ozone washing for 5 minutes.

A thin film was formed on the resulting transparent supporting substrate via the spin coating method under conditions of 3,000 rpm and 30 seconds, employing a solution prepared by diluting poly(3,4-ethylenedioxythiophen)-polystyrene sulfonate (PEDOT/PSS, BAYTRON P A1 4083, produced by Bayer Co.,) to 70% via pure water. Thereafter, drying was carried out at 200° C. for one hour, whereby a 20 nm thick positive hole transport layer was prepared.

The resulting transparent supporting substrate was fixed onto the substrate holder of a commercial vacuum deposition apparatus. At the same time, 200 mg of α-NPD was placed in a molybdenum resistance heating boat, 200 mg of H33 as a host compound was placed in another molybdenum resistance heating boat, Ir-26 was placed in still another molybdenum resistance heating boat, and Electron Transport Compound 3 was placed in still yet another molybdenum resistance heating boat. Subsequently, all boats were mounted onto the vacuum deposition apparatus.

Subsequently, after reducing the pressure of the vacuum tank to 4×10-4 Pa, the aforesaid heating boat incorporating α-NPD was electrically heated, and vacuum deposition was carried out onto the positive hole transport layer at a vacuum deposition rate of 0.1 nm/second, whereby a positive hole transport layer 2 was prepared. Further, the aforesaid boats, each incorporating H33 and Ir-26, were electrically heated, and co-vacuum deposition was carried at a vacuum deposition rate of 0.2 nm/second and 0.012 nm/second, respectively, onto the aforesaid positive hole transport layer, whereby a light emitting layer was prepared.

Incidentally, during the aforesaid vacuum deposition, the substrate was at room temperature. Further, the aforesaid boat incorporating Comparative Compound 5 was electrically heated, and vacuum deposition was carried out onto the aforesaid light emitting layer at a vacuum deposition rate of 0.1 nm/second, whereby an electron transport layer was prepared. During the aforesaid vacuum deposition, the substrate was at room temperature.

Subsequently, 0.5 nm lithium fluoride and 110 nm aluminum were vacuum-deposited to form a cathode, whereby Organic EL Element 6-1 was prepared.

<<Preparation of Organic EL Elements 6-2-6-7>>

Organic EL Elements 6-2-6-7 were prepared in the same manner as Organic EL Elements 6-1, except that Comparative Compound 5 was replaced with each of the compounds described below in Table 4.

<<Evaluation of Organic EL Elements 6-1-6-7>>

Prepared Organic EL Elements 6-1-6-7 were evaluated as follows. Each of them was sealed in the same manner as Organic EL Element 1-1, and lighting devices shown in FIGS. 5 and 6 were formed and evaluated.

The prepared organic EL elements were evaluated as described below. The results are shown below.

(External Extraction Quantum Efficiency)

An organic EL element was allowed to emit light under conditions of room temperature (about 23-about 25° C.) and a constant electric current of 2.5 mA/cm2. By determining emitted light luminance (L) (cd/m2), external extraction efficiency (Ti) was calculated.

The above emitted light luminance was determined via CS-1000 (produced by Konica Minolta Sensing, Inc.). The external extraction quantum efficiency was represented by a relative value when Organic EL Element 6-1 resulted in 100.

(Light Emission Lifetime)

An organic EL element was allowed to continuously emit light under conditions of room temperature and a constant electric current of 2.5 mA/cm2, and the time (τ½), which was required to reach one half of the initial luminance, was determined.

The light emission lifetime was represented by a relative value when Organic EL Element 6-1 resulted in 100.

The results are shown in the following table 4.

TABLE 4

| Element No. | Electron Transport Compound | External Extraction Quantum Efficiency (%) | Lifetime (%) | Remarks |
|---|---|---|---|---|
| 6-1 | Comparative Compound 5 | 100 | 100 | Comparative Example |
| 6-2 | 16 | 132 | 640 | Present Invention |
| 6-3 | 26 | 127 | 560 | Present Invention |
| 6-4 | 32 | 125 | 550 | Present Invention |
| 6-5 | 102 | 120 | 490 | Present Invention |
| 6-6 | 103 | 116 | 420 | Present Invention |
| 6-7 | 104 | 110 | 350 | Present Invention |

As can be seen from the above, the elements of the present invention exhibited excellent external extraction quantum efficiency and lifetime characteristics, compared to Comparative Example.

Example 7

Preparation of Organic EL Element 7-1

Organic EL Element 7-1 was prepared in the same manner as Organic EL Element 4-1, except that instead of Positive Hole Transport Material 1, a solution which was prepared by dissolving 5 mg of Positive Hole Transport Material 3 and 45 mg of Positive Hole Transport Material 4 in 10 ml of toluene was employed, H32 was employed instead of H31, Ir-30 was employed instead of Ir-1, and BCP was employed instead of Comparative Compound 1.

<<Preparation of Organic EL Elements 7-2-7-6>>

Organic EL Elements 7-2-7-6 were prepared in the same manner as Organic EL Element 7-1, except that BCP was replaced with each of the compounds described below in Table 5.

<<Evaluation of Organic EL Element 7-1-7-6>>

Prepared Organic EL Elements 7-1-7-6 were evaluated as follows. Each of them was sealed in the same manner as Organic EL Element 1-1, and lighting devices shown in FIGS. 5 and 6 were formed and evaluated.

Prepared organic EL elements were evaluated. Table 5 shows the results.

(Emitted Light Luminance)

Emitted light luminance (cd/m2) was determined, when 4 V direct current voltage was applied to an organic EL element at room temperature (about 23-about 25° C.), (External Extraction Quantum Efficiency)

Under the condition of a constant electric current of 5 mA/cm2, the external extraction efficiency was obtained in the same manner as Organic EL Elements 6-1-.

The emitted light luminance and the external extraction quantum efficiency each was represented by a relative value when Organic EL Element 7-1 resulted in 100.

(Voltage Increase Ratio)

When driven at a constant electric current of 6 mA/cm2, initial voltage and that after 100 hours were determined. The relative value of the initial voltage to that after 100 hours was designated as a voltage increase ratio.

The emitted light luminance and the external extraction quantum efficiency each was represented by a relative value when the result of Organic EL Element 7-1 resulted in 100.

The evaluation results are shown in Table 5.

TABLE 5

| Element No. | Electron Transport Compound | External Extraction Quantum Efficiency (%) | Lifetime (%) | Voltage Increase Ratio (%) | Remarks |
|---|---|---|---|---|---|
| 7-1 | BCP | 100 | 100 | 122 | Comp. |
| 7-2 | Comparative Compound 6 | 114 | 130 | 135 | Comp. |
| 7-3 |  | 105 | 136 | 760 | 104 | Inv. |
| 7-4 |  | 106 | 133 | 640 | 104 | Inv. |
| 7-5 |  | 107 | 131 | 570 | 105 | Inv. |
| 7-6 |  | 108 | 124 | 400 | 108 | Inv. |

Comp.: Comparative Example,
Inv.: Present Invention

Based on the above, it was noted that the voltage increase ratio of the elements of the present invention was reduced and the storage stability was enhanced. Further, with regard to elements, which resulted in the surface density and the band gap within the range of the present invention, it was noted that the aforesaid performance was further enhanced, and the emitted light luminance was also enhanced.

Example 8

Preparation of Organic EL Element 8-1

Organic EL Element 8-1 was prepared in the same manner as Organic EL Element 4-1, except that H31 was replaced with H35, and Ir-1 was replaced with Ir-12, while Comparative Compound 1 was replaced with Comparative Compound 7.

<<Organic EL Elements 8-2-8-4>>

Organic EL Elements 8-2-8-4 were prepared in the same manner as Organic Element 8-1, except that Ir-12 and Comparative Compound 7 were changed to the compounds described in the following Table 6.

<<Evaluation of Organic EL Elements 8-1-8-4>>

Prepared Organic EL Elements 8-1-8-4 were evaluated as follows. Each of them was sealed in the same manner as Organic EL Element 1-1, and lighting devices shown in FIGS. 5 and 6 were formed and evaluated.

With regard to the prepared elements, the external extraction quantum efficiency under the condition of a constant electric current of 2.5 mA/cm2, and the light emission lifetime were determined in the same manner as Organic EL Elements 6-1-6-7.

Further, during continuous light emission under the condition of a constant electric current of 2.5 mA/cm2, the resulting emitted light color was visually evaluated. The results of each were represented by relative values when Organic EL Element 8-1 resulted in 100.

The evaluation results are shown in Table 56.

TABLE 6

| Element No. | Phosphorescence Emitting Compound | Electron Transport Compound | External Extraction Quantum Efficiency (%) | Lifetime (%) | Emitted Light Color | Remarks |
|---|---|---|---|---|---|---|
| 8-1 | Ir-12 | Comparative Compound 7 | 100 | 100 | Blue | Comp. |
| 8-2 | Ir-12 | 22 | 108 | 160 | Blue | Inv. |
| 8-3 | Ir-24 | 22 | 113 | 710 | Blue | Inv. |
| 8-4 | Ir-26 | 22 | 120 | 5700 | blue | Inv. |

Comp.: Comparative Example,
Inv.: Present Invention

As can be seen from the above, the elements of the present invention exhibited higher external extraction quantum efficiency and longer lifetime, compared to Comparative Example.

Example 9

Preparation of Organic EL Element 9-1

Organic EL Element 9-1 was prepared in the same manner as Organic EL Element 6-1, except that Exemplified Compound 10 was employed instead of H33, Ir-18 was employed instead of Ir-26, and Comparative Compound 7 was employed instead of Comparative Compound 5.

<<Preparation of Organic EL Elements 9-2 and 9-3>>

Organic EL Elements 9-2 and 9-3 were prepared in the same manner as Organic EL Element 9-1, except that the host compound and the electron transport compound were changed to the compounds described below.

<<Evaluation of Organic EL Elements 9-1-9-3>>

When prepared Organic EL elements 9-1-9-3 were evaluated, sealing was carried out in the same manner as for Organic El Element 1-1, whereby the lighting devices, shown in FIGS. 5 and 6, were formed and evaluated.

The external extraction quantum efficiency under the condition of a constant electric current of 2.5 mA/cm2 and the light emission lifetime of the prepared elements were determined in the same manner as for Organic EL Elements 6-1-6-7. Each of the results was represented by a relative value when Organic EL element 9-1 resulted in 100.

The evaluation results are shown in Table 7.

TABLE 7

| Element No. | Host Compound | Electron Transport Compound | External Extraction Quantum Efficiency (%) | Lifetime (%) | Remarks |
|---|---|---|---|---|---|
| 9-1 | 10 | Comparative Compound 7 | 100 | 100 | Comp. |
| 9-2 | 10 | 33 | 109 | 480 | Inv. |
| 9-3 | H48 | 33 | 128 | 640 | Inv. |

Comp.: Comparative Example,
Inv.: Present Invention

As can be seen from the above, the elements of the present invention excelled in external extraction quantum efficiency and lifetime, compared to Comparative Example.

Example 10

Preparation of Organic EL Full-Color Display Device

FIG. 7 is a schematic constitutional view of an organic EL full-color display device. After carrying out patterning at a pitch of 100 μm onto a substrate (NA45, produced by NH Techno Glass Corp.) on which a 100 nm film of ITO transparent electrode (102) was formed as an anode on glass substrate 101, a light-insensitive polyimide partition wall 103 (at a width of 20 μm and a thickness of 2.0 μm) was formed via photolithography between the ITO transparent electrodes on the aforesaid glass substrate.

The positive hole injection layer composition composed, as described below, was discharged and injected between the polyimide partition walls on the ITO electrode, employing an ink-jet head (MJ800C, produced by EPSON Co., exposed to ultraviolet radiation for 150 seconds, and dried at 60° C. for 10 minutes, whereby a 40 nm thick positive hole injection layer was prepared.

Each of the following blue light emitting layer composition, green light emitting layer composition, and red light emitting layer composition was discharged and injected onto the aforesaid positive hole injection layer, employing an ink-jet head, and dried at 60° C. for 10 minutes, whereby each of the light emitting layers (105B, 105G, and 105R) was formed. Subsequently, 20 nm 110 was vacuum-deposited to cover the light emitting layer, and further, 0.6 nm lithium fluoride and 130 nm Al (106), as a cathode, were vacuum-deposited, whereby an organic EL element was prepared.

By applying voltage to each electrode of the prepared organic EL elements, blue, green, and red lights were emitted, whereby availability was noted as a full-color display device.

(Positive Hole Injection Layer Composition)

| | |
|---|---|
| Positive Hole Transport Material 5 | 20 parts by weight |
| Cyclohexylbenzene | 50 parts by weight |
| Isopropylbiphenyl | 50 parts by weight |

(Blue Light Emitting Layer Composition)

| | |
|---|---|
| H4 | 0.7 part by weight |
| Ir-26 | 0.04 part by weight |
| Cyclohexylbenzene | 50 parts by weight |
| Isopropylbiphenyl | 50 parts by weight |

(Green Light Emitting Layer Composition)

| | |
|---|---|
| H4 | 0.7 part by weight |
| Ir-1 | 0.04 part by weight |
| Cyclohexylbenzene | 50 parts by weight |
| Isopropylbiphenyl | 50 parts by weight |

(Red Light Emitting Layer Composition)

| | |
|---|---|
| H4 | 0.7 part by weight |
| Ir-18 | 0.04 part by weight |
| Cyclohexylbenzene | 50 parts by weight |
| Isopropylbiphenyl | 50 parts by weight |

Example 11

Preparation of White Light Emitting Element 11-1

After carrying out patterning onto a substrate (NA-45, produced by NH Techno Glass Corp.) which was prepared by forming a 100 nm ITO (indium tin oxide) film as an anode on the aforesaid 100 mm×100 mm×1.1 mm glass, the above transparent supporting substrate arranged with the ITO transparent electrode was subjected to ultrasonic wave washing with isopropyl alcohol, was dried via desiccated nitrogen gas, and then was subjected to UV ozone washing for 5 minutes.

A film was formed on the resulting transparent supporting substrate via a spin coating method at 3,000 rpm and 30 seconds, employing a solution prepared by diluting poly(3,4-ethylenedioxythiophen)-polystyrene sulfonate (PEDOT/PSS, BAYTRON P Al 4083, produced by Bayer Co.,) to 70% via pure water. Thereafter, drying was carried out at 200° C. for one hour, whereby a 30 nm thick first positive hole transport layer was prepared.

The resulting substrate was transferred into a nitrogen atmosphere, and a film was formed on the first positive hole transport layer via the spin coating method, under conditions of 10,000 rpm and 30 seconds, applying a solution prepared by dissolving 50 mg of Positive Hole Transport Material 6 in 10 ml of toluene onto the above first positive hole transport layer. After carrying out photopolymerization and cross-linkage via exposure to ultraviolet radiation for 180 seconds, vacuum drying was carried out at 60° C. for one hour, a second positive hole transport layer was formed.

Subsequently, a film was formed via the spin coating method under conditions of 1,000 rpm and 30 seconds, employing a solution prepared by dissolving H32 (60 mg), Ir-9 (3.0 mg), and Ir-24 (3.0 mg) in 6 ml of toluene. The resulting film was subjected to vacuum drying at 60° C. for one hour, whereby a light emitting layer was formed.

Furthermore, a film was formed via the spin coating method under conditions of 1,500 rpm and 30 seconds, employing a solution prepared by dissolving 111 (30 mg) in 5 ml of hexafluoroisopropanol (HFIP). Thereafter, the resulting film was subjected to vacuum drying at 60° C. for one hour, whereby a first electron transport layer was formed.

Subsequently, the aforesaid substrate was fixed onto the substrate holder of a vacuum deposition. In a molybdenum resistance heating boat, placed was 200 mg of Alq3 and the boat was mounted on the vacuum deposition apparatus. After reducing the pressure of the vacuum tank to 4×10-4 Pa, the boat incorporating Alq3 was electrically heated, and vacuum deposition was carried out onto the first electron transport layer at a deposition rate of 0.1 nm/second, whereby a 40 nm thick second electron transport layer was further prepared.

Incidentally, during the deposition, the substrate was at room temperature.

Subsequently, 0.5 nm lithium fluoride and 110 nm aluminum were deposited, whereby Organic EL Element 11-1 was prepared.

When the resulting element was electrically driven, almost pure white light was emitted and it was found to be employable as a lighting device. In addition, it was noticed that even though replaced with any of the other exemplified compounds, similar white light was emitted.

What is claimed is:

1. An organic electroluminescent element comprising a substrate having thereon an anode, a cathode, and a plurality of organic layers sandwiched between the anode and the cathode, wherein the plurality of organic layers comprise:

a light emitting layer containing a phosphorescence emitting compound; and an electron transport layer containing a compound represented by Formula (1):

(Ar1)n1-Y1  Formula (1)

wherein n1 is an integer of 1; Y1 is a substituted or unsubstituted condensed heteroaryl group selected from the group consisting of a dibenzofuran group, a dibenzothiophene group, and a carbolinyl group, provided that a substituent of the substituted condensed heteroaryl group is selected from the group consisting of a carbazole group, a phenyl group, a pyridyl group, and a dibenzofuran group; Ar1 is a group represented by Formula (A-1):

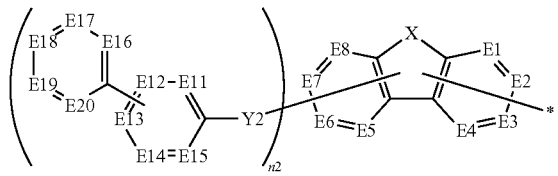

Formula (A-1)

wherein X is —N(R)—, —O—, or —S—; E1 to E8 each are —C(R1)= or —N=; R, and R1 each are a hydrogen atom or a substituent; Y2 is a single bond; E11 to E20 each are —C(R2)= or —N=, and at least one of E11 to E20 is —N=, R2 is a hydrogen atom, a substituent or a linking site, provided that at least one of E11 and E12 is —C(R2)=, and R2 is a linking site; when E11 to E15 each are —C(R2)=, R2 is a hydrogen atom or a linking site;

n2 is an integer of 1 to 4; and (*) is a bonding site to Y1 of Formula (1).

2. The organic electroluminescent element of claim 1, wherein at least one of E16 to E20 is —N=.

3. The organic electroluminescent element of claim 1, wherein all of E11 to E15 are —C(R2)=, R2 is a hydrogen atom or a linking site.

4. The organic electroluminescent element of claim 1, wherein n2 of Formula (A-1) is an integer of 1 to 2.

5. The organic electroluminescent element of claim 1, wherein Y1 of Formula (I) is the carbolinyl group.

6. The organic electroluminescent element of claim 1, wherein at least 6 of E1 to E8 of Formula (A) are —C(R1)=.

7. The organic electroluminescent element of claim 6, wherein one of E16 to E20 is —N=.

* * * * *